United States Patent
Lee et al.

(10) Patent No.: US 9,177,613 B2
(45) Date of Patent: Nov. 3, 2015

(54) SEMICONDUCTOR DEVICE

(71) Applicants: Wookhyoung Lee, Seongnam-si (KR); Jongsik Chun, Hwaseong-si (KR); Sunil Shim, Seoul (KR); Jaeyoung Ahn, Seongnam-si (KR); Juyul Lee, Hwaseong-si (KR); Kihyun Hwang, Seongnam-si (KR); Hansoo Kim, Suwon-si (KR); Woonkyung Lee, Seongnam-si (KR); Jaehoon Jang, Seongnam-si (KR); Wonseok Cho, Suwon-si (KR)

(72) Inventors: Wookhyoung Lee, Seongnam-si (KR); Jongsik Chun, Hwaseong-si (KR); Sunil Shim, Seoul (KR); Jaeyoung Ahn, Seongnam-si (KR); Juyul Lee, Hwaseong-si (KR); Kihyun Hwang, Seongnam-si (KR); Hansoo Kim, Suwon-si (KR); Woonkyung Lee, Seongnam-si (KR); Jaehoon Jang, Seongnam-si (KR); Wonseok Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 233 days.

(21) Appl. No.: 14/018,885

(22) Filed: Sep. 5, 2013

(65) Prior Publication Data

US 2014/0063890 A1    Mar. 6, 2014

(30) Foreign Application Priority Data

Sep. 5, 2012  (KR) .................. 10-2012-0098467

(51) Int. Cl.
  *G11C 5/06* (2006.01)
  *G11C 7/00* (2006.01)
  *H01L 23/48* (2006.01)
  *G11C 7/18* (2006.01)
  *H01L 27/115* (2006.01)
  *H01L 27/02* (2006.01)

(52) U.S. Cl.
  CPC *G11C 5/06* (2013.01); *G11C 5/063* (2013.01); *G11C 7/00* (2013.01); *G11C 7/18* (2013.01); *H01L 23/48* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01); *H01L 27/0207* (2013.01); *H01L 2924/0002* (2013.01)

(58) Field of Classification Search
  CPC ............... H01L 27/11578; H01L 27/11582; H01L 27/11551; H01L 27/11556; G11C 5/06; G11C 5/063
  See application file for complete search history.

(56) References Cited

U.S. PATENT DOCUMENTS

| | | | |
|---|---|---|---|
| 8,008,710 B2 | 8/2011 | Fukuzumi et al. | |
| 8,154,068 B2 | 4/2012 | Katsumata et al. | |
| 8,198,670 B2 | 6/2012 | Aoyama | |
| 8,253,187 B2 | 8/2012 | Tanaka et al. | |
| 8,385,131 B2 | 2/2013 | Seol | |
| 8,455,940 B2 | 6/2013 | Lee et al. | |
| 8,750,044 B2 * | 6/2014 | Choi | 365/185.11 |

(Continued)

FOREIGN PATENT DOCUMENTS

| | | |
|---|---|---|
| JP | 2011192879 A | 9/2011 |
| KR | 1020100079978 A | 7/2010 |

(Continued)

*Primary Examiner* — Harry W Byrne
*Assistant Examiner* — Lance Reidlinger
(74) *Attorney, Agent, or Firm* — Sughrue Mion, PLLC

(57) ABSTRACT

Provided is a semiconductor device including gate structures provided on a substrate, a separation insulating layer interposed between the gate structures, and a plurality of cell pillars connected to the substrate through each gate structure. Each gate structure may include horizontal electrodes vertically stacked on the substrate, and an interval between adjacent ones of the cell pillars is non-uniform.

20 Claims, 52 Drawing Sheets

(56) References Cited

U.S. PATENT DOCUMENTS

| | | | |
|---|---|---|---|
| 8,797,806 B2* | 8/2014 | Goda et al. | 365/185.26 |
| 8,835,990 B2* | 9/2014 | Jang | 257/211 |
| 8,982,621 B2* | 3/2015 | Choi | 365/185.05 |
| 2008/0315296 A1 | 12/2008 | Tanaka et al. | |
| 2010/0038703 A1 | 2/2010 | Fukuzumi et al. | |
| 2010/0171162 A1 | 7/2010 | Katsumata et al. | |
| 2010/0202206 A1 | 8/2010 | Seol et al. | |
| 2010/0237400 A1 | 9/2010 | Aoyama | |
| 2010/0315875 A1 | 12/2010 | Kim et al. | |
| 2011/0002178 A1 | 1/2011 | Hwang et al. | |
| 2011/0013458 A1 | 1/2011 | Seol | |
| 2011/0180941 A1 | 7/2011 | Hwang et al. | |
| 2011/0287612 A1 | 11/2011 | Lee et al. | |
| 2013/0009229 A1* | 1/2013 | Lee et al. | 257/314 |

FOREIGN PATENT DOCUMENTS

| | | |
|---|---|---|
| KR | 1020110003764 A | 1/2011 |
| KR | 1020110086405 A | 7/2011 |
| KR | 101162197 B1 | 7/2012 |

* cited by examiner

SEMICONDUCTOR DEVICE

CROSS-REFERENCE TO RELATED APPLICATIONS

This U.S. non-provisional patent application claims priority under 35 U.S.C. §119 to Korean Patent Application No. 10-2012-0098467, filed on Sep. 5, 2012, in the Korean Intellectual Property Office, the entire contents of which are hereby incorporated by reference.

BACKGROUND OF THE INVENTION

Exemplary embodiments of the inventive concepts relate to a semiconductor device, and in particular, to a vertical-type semiconductor device.

To satisfy excellent performance and low cost, it is required to have a higher level of integration in semiconductor devices. Particularly, a level of integration in memory devices is an important factor for determining the prices of products. In typical Two-Dimensional (2D) memory devices, a level of integration is mainly determined in proportion to the occupied area of memory cells, which is affected by the level of fine pattern forming technology. However, since high-cost equipment is required for reducing pattern size, a level of higher integration in 2D semiconductor memory devices may become limited.

To overcome these limitations, Three-Dimensional (3D) memory devices including three-dimensionally arranged memory cells are being proposed. For mass production of the 3-D memory devices, however, a process technology which reduces manufacturing costs per bit relative to 2-D memory devices and realizes reliable product characteristic is required.

SUMMARY

Exemplary embodiments of the inventive concepts provide semiconductor devices with improved reliability.

An exemplary embodiment is a semiconductor memory device including: a plurality of horizontal electrodes; a plurality of insulating patterns alternatingly stacked with the plurality of horizontal electrodes; and an array of pillars formed in the plurality of insulating patterns and the plurality of horizontal electrodes, the array of pillars including: a first group of pillars disposed along a first direction; and a second group of pillars disposed along a second direction parallel to the first direction, and staggered with respect to the first group of pillars, wherein a first pillar of the first group of pillars is disposed to one side of a second pillar of the first group of pillars and a third pillar of the first group of pillars is disposed to another side of the second pillar of the first group of pillars, and wherein the second pillar of the first group of pillars is closer to the third pillar of the first group of pillars than to the first pillar of the first group of pillars.

In the exemplary embodiment, the second pillar is one of Xn-th pillar of the first group of pillars, X being an integer greater than 1 and n being an integer index, and locations of the Xn-th pillars of the first group of pillars are closer to corresponding one of (Xn+1)-th pillars of the first group of pillars than to corresponding one of (Xn−1)-th pillars of the first group of pillars, wherein X is one of 2, 3 or 4.

The pillars of the second group of pillars are evenly spaced apart.

In one exemplary embodiment, pillars of the second group of pillars are spaced apart so that, X' being an integer greater than 1 and n' being an integer index, and locations of X'n'-th pillars of the second group of pillars are closer to corresponding one of (X'n'+1)-th pillars of the second group of pillars than to corresponding one of (X'n'−1)-th pillars of the second group of pillars, wherein an interval between the first pillar of the first group of pillars and the second pillar of the first group of pillars is interval A, wherein an interval between a first pillar of the second group of pillars and a second pillar of the second group of pillars adjacent to the first pillar of the second group of pillars, is interval C, and wherein a distance of interval A>a distance of interval C.

In another exemplary embodiment, a fill separation region is disposed to one side of the first group of pillars and the second group of pillars are disposed to another side of the first group of pillars, and a material for forming the plurality of horizontal electrodes, is firstly received through the first group of pillars and secondly received through the second group of pillars.

Among the first group of pillars, the first pillar of the second group of pillars is nearest to the first pillar of the first group of pillars, and wherein an interval between the first pillar of the first group of pillars and the first pillar of the second group of pillars is interval B, such that the interval B is one of: i) interval A>interval B>interval C; ii) interval A is substantially equal to interval B and interval B is >than interval C; and iii) interval A>interval B and interval B is substantially equal to interval C.

The intervals A, B, and C form a channel through which the material for forming the plurality of horizontal electrodes, is received from a fill separation region disposed at one side of the array of pillars.

The array of pillars further including a dummy group of pillars, a third group of pillars and a fourth group of pillars, the third and the fourth group of pillars being disposed in mirror symmetry with respect to the first and the second group of pillars, about the dummy group of pillars.

The fill separation region is a first fill separation region disposed at a first side of the array of pillars and the semiconductor device of claim 9 further includes a second fill separation region disposed at a second side of the array of pillars opposite to the first side, and wherein the material for forming the plurality of horizontal electrodes, is received through the first and the second sides of the array of pillars.

A fourth pillar of the first group of pillars is disposed to another side of and adjacent to the third pillar of the first group of pillars, and wherein a distance between the first and the second pillars of the first group of pillars and a distance between the third and the fourth pillars of pillars of the first group of pillars are larger than the distance between the second and the third pillars of the first group of pillars.

A first pillar of the second group of pillars is disposed to one side of a second pillar of the second group of pillars and a third pillar of the second group of pillars is disposed to another side of and adjacent to the second pillar of the second group of pillars, and wherein the second pillar of the second group of pillars is closer to the third pillar of the second group of pillars than to the first pillar of the second group of pillars.

A fourth pillar of the second group of pillars is disposed to another side of and adjacent to the third pillar of the second group of pillars, and wherein a distance between the first and the second pillars of the second group of pillars and the distance between the third and the fourth pillars of the second group of pillars are larger than the distance between the second and the third pillars of the second group of pillars.

In another exemplary embodiment, the array of pillars further including a dummy group of pillars disposed adjacent to the second group of pillars, wherein an interval between a second pillar of the second group of pillars and a first pillar of the dummy group of pillars, is interval D.

There are a third group of pillars and a fourth group of pillars, both of which are disposed in mirror symmetry with respect to the first and the second group of pillars, about the dummy group of pillars.

In the exemplary embodiment, there is a substrate, the alternating stack of the plurality of horizontal electrodes and the plurality of insulating patterns being disposed on the substrate; and upper interconnection lines disposed above the first, the second, and the dummy groups of pillars, the upper interconnection lines including first upper interconnection lines respectively connected to the first group of pillars and not connected to the second group of pillars, and second upper interconnection lines respectively connected to the second group of pillars and not connected to the first group of pillars; and common source lines disposed on the substrate.

In yet another exemplary embodiment, there is a memory system including: a controller; an input and output unit; an interface unit; and the semiconductor memory device of claim 1, wherein the controller, the input and output unit, the interface unit, and the semiconductor memory device communicate through a data bus.

The first and the second group of pillars form a channel of decreasing width, a material for forming the plurality of horizontal electrodes being received through the channel.

In yet another exemplary embodiment, there is a semiconductor device including: the aforementioned semiconductor memory device; an address decoder connected to the semiconductor memory device through word lines; a read and write circuit connected to the semiconductor memory device through bit lines; a data input and output circuit connected to the read and write circuit through data lines; and a control logic configured to control the address decoder and the read and write circuit to read data from the semiconductor memory device and to transfer the read data to the data input and output circuit.

The array of pillars further includes a group of dummy pillars, a third group of pillars and a fourth group of pillars, wherein first portions of the plurality of horizontal electrodes are formed by a material inserted through first channels of narrowing widths, the first channels being formed by the first and the second group of pillars disposed at one side of the group of dummy pillars, and wherein second portions of the plurality of horizontal electrodes are formed by a material inserted through second channels of narrowing widths, the second channels being formed by the third and the fourth group of pillars disposed at another side of the group of dummy pillars.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
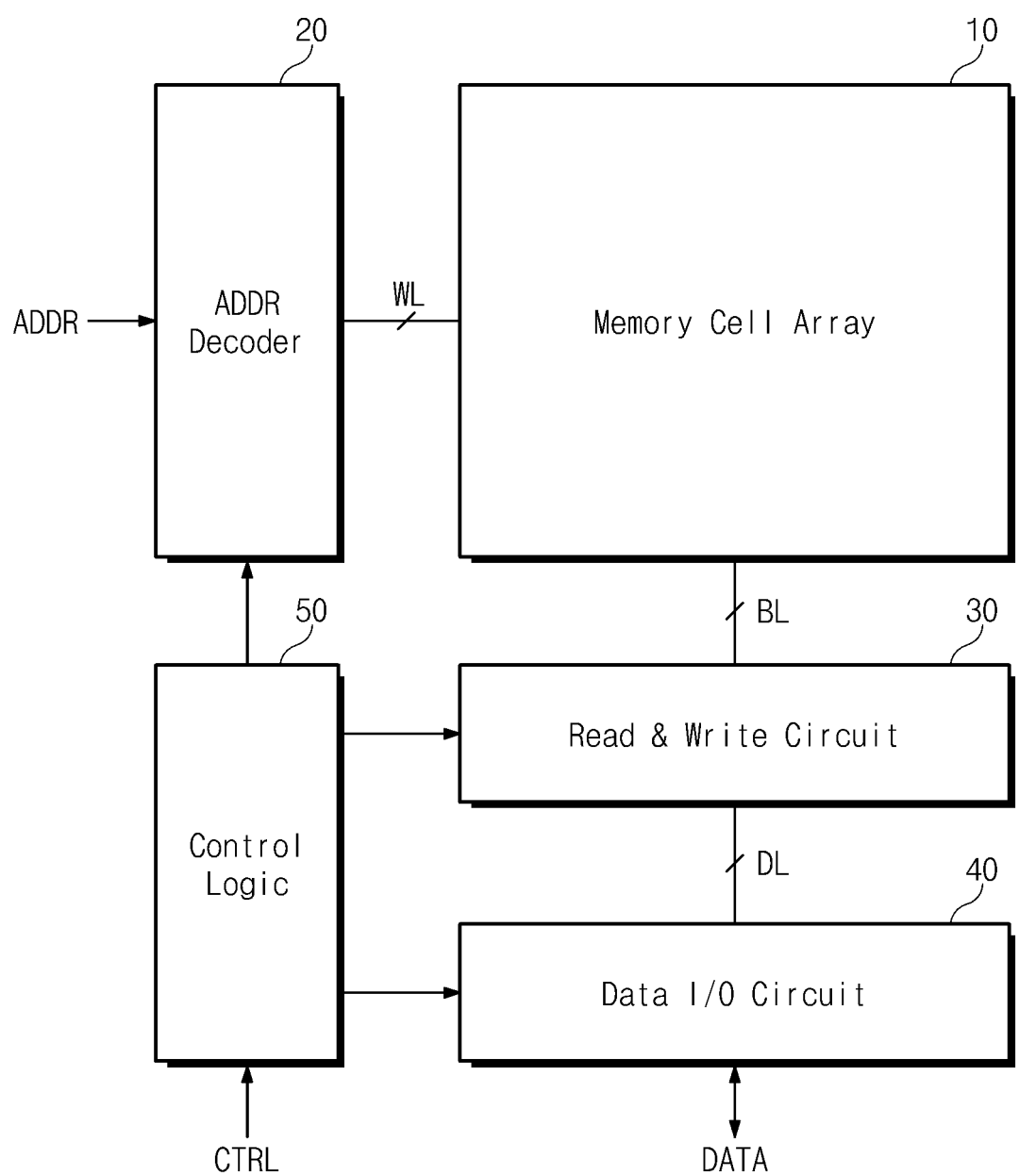
FIG. 1 is a block diagram illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the present specification, an interval, or distance, between cell pillars may refer to the shortest distance between outer side surfaces of a pair of the cell pillars arranged adjacent to each other.

FIG. 1 is a block diagram illustrating a semiconductor device according to example embodiments of the inventive concept. Referring to FIG. 1, a nonvolatile memory device according to embodiments of the inventive concept includes a memory cell array 10, an address decoder 20, a read and write circuit 30, a data input and output circuit 40, and a control logic 50.

The memory cell array 10 may be connected to the address decoder 20 through a plurality of word lines WL, and may be connected to the read and write circuit 30 through a plurality of bit lines BL. The memory cell array 10 includes a plurality of memory cells. For example, the memory cell array 10 may store one or more bits in each cell.

The address decoder 20 may be connected to the memory cell array 10 through the word lines WL. The address decoder 20 operates according to the control of the control logic 50. The address decoder 20 may receive an address ADDR from the outside. The address decoder 20 decodes a row address among the received address ADDR to select a corresponding word line from among the word lines WL. Also, the address decoder 20 decodes a column address among the address ADDR and transfers the decoded column address to the read and write circuit 30. For example, the address decoder 20 may include elements such as a row decoder, a column decoder and address buffer.

The read and write circuit 30 may be connected to the memory cell array 10 through the bit line BL, and be connected to the data input and output circuit 40 through the data lines DL. The read and write circuit 30 may operate according to the control of the control logic 50. The read and write circuit 30 receives the decoded column address from the address decoder 20. The read and write circuit 30 selects a bit line BL using the decoded column address. For example, the read and write circuit 30 receives data from the data input and output circuit 40 and writes the received data in the memory cell array 10. The read and write circuit 30 reads data from the memory cell array 10 and transfers the read data to the data input and output circuit 40. The read and write circuit 30 reads data from a first storage region of the memory cell array 10, and writes the read data in a second storage region of the memory cell array 10. For example, the read and write circuit 30 may perform a copy-back operation.

The read and write circuit 30 may include elements which include a page buffer (or a page register) and a column selection circuit. As another example, the read and write circuit 30 may include elements which include a sensing amplifier, a write driver and a column selection circuit.

The data input and output circuit 40 may be connected to the read and write circuit 30 through the data lines DL. The data input and output circuit 40 operates according to the control of the control logic 50. The data input and output circuit 40 exchanges data DATA with the outside. The data input and output circuit 40 transfers the data DATA to the read and write circuit 30 through the data lines DL. The data input and output circuit 40 outputs the data DATA, which is transferred from the read and write circuit 30 through the data lines DL, to the outside. For example, the data input and output circuit 40 may include an element such as a data buffer.

The control logic 50 may be connected to the address decoder 20, the read and write circuit 30 and the data input and output circuit 40. The control logic 50 controls the operation of a 3D semiconductor device. The control logic 50 may operate in response to a control signal CTRL transferred from the outside.

Figure 2:
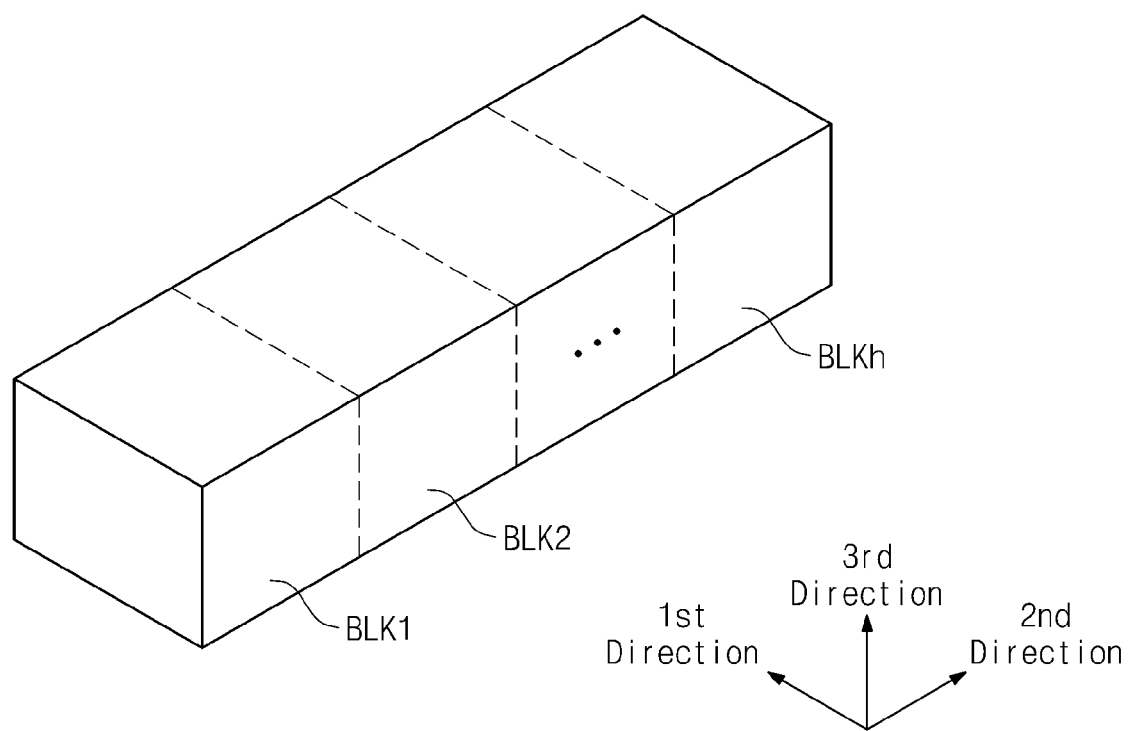
FIG. 2 is a schematic diagram exemplarily illustrating a memory cell array of FIG. 1.

FIG. 2 is a block diagram illustrating as an example of the memory cell array 10 of FIG. 1. Referring to FIG. 2, the memory cell array 10 may include a plurality of memory blocks BLK1 to BLKh. Each of the memory blocks BLK1 to BLKh may have a 3D structure (or a vertical structure). For example, the each of the memory blocks BLK1 to BLKh may include structures extend in first to third orthogonal directions. For example, the each of the memory blocks BLK1 to BLKh includes a plurality of cell strings that extend in the third direction.

Figure 3:
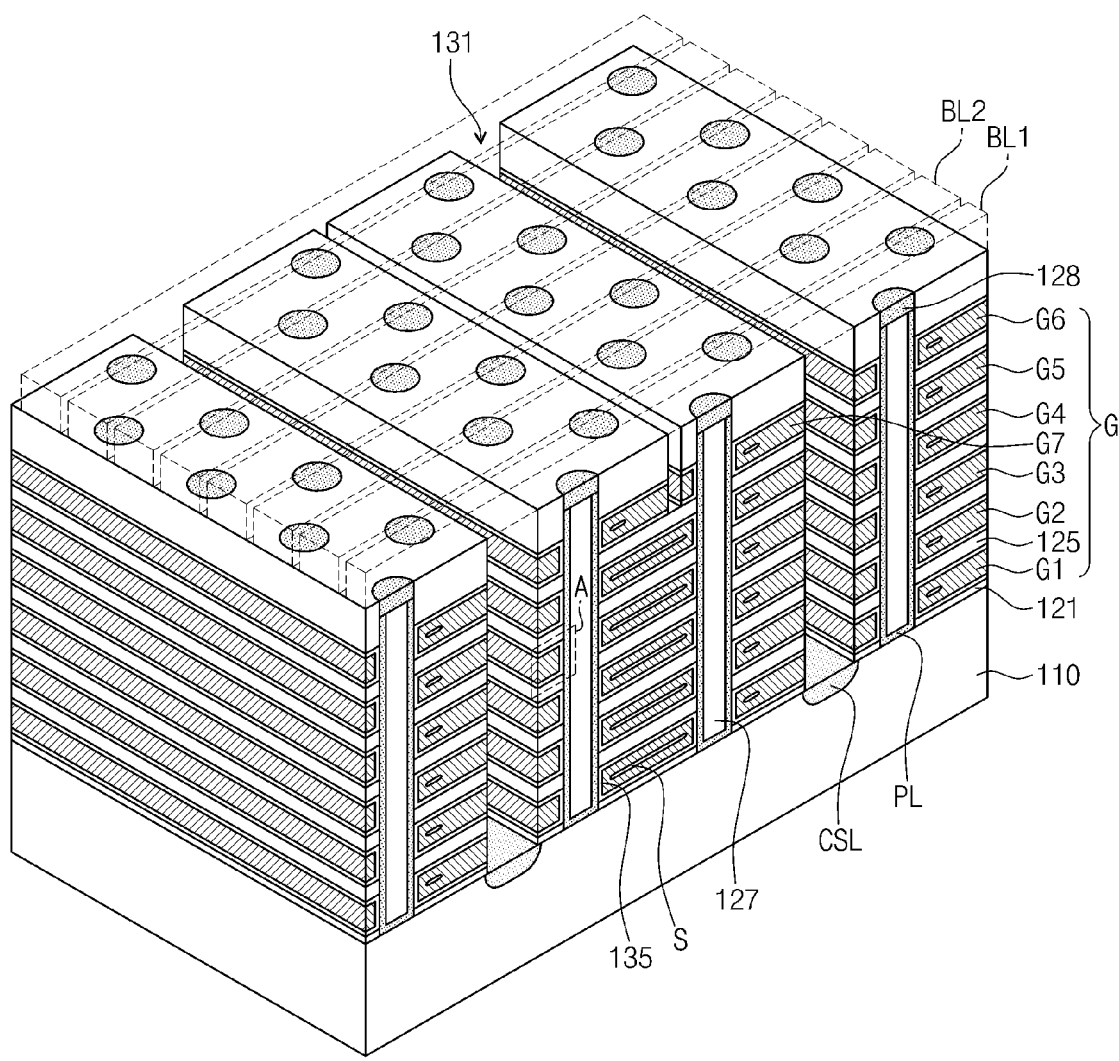
FIG. 3 is a perspective view illustrating a memory block of a semiconductor device according to example embodiments of the inventive concept.

FIG. 3 is a perspective view illustrating a memory block of a semiconductor device according to example embodiments of the inventive concept. Referring to FIG. 3, a substrate 110 may be provided. The substrate 110 may have a first conductivity type (e.g., P-type). A buffer dielectric 121 may be provided on the substrate 110. The buffer dielectric 121 may be a silicon oxide layer. Horizontal electrodes and insulating patterns 125 may be alternatingly stacked on the buffer dielectric 121. For example, horizontal electrodes may be spaced apart from each other with the insulating patterns 125 interposed between therebetween.

Figure 4A:
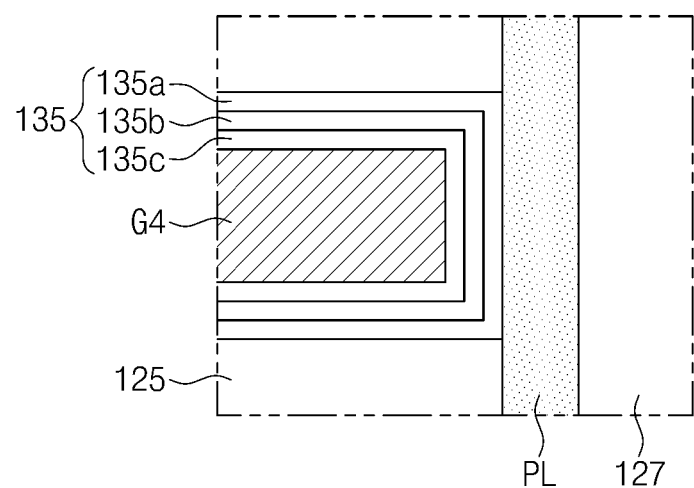
FIGS. 4A and 4B are enlarged views exemplarily illustrating a portion A of FIG. 3.
Figure 4B:
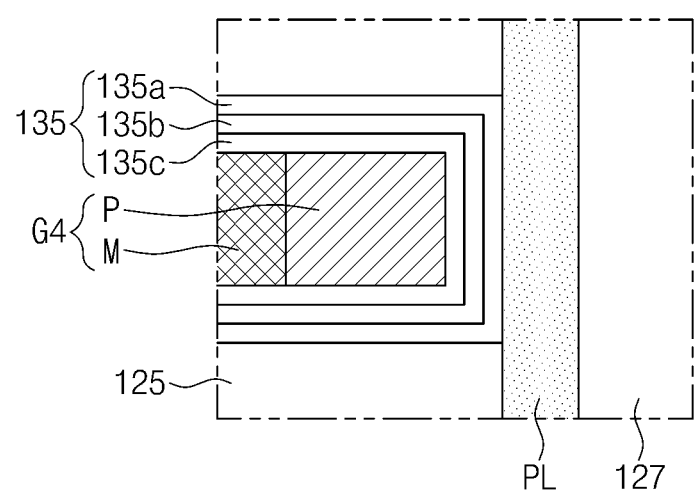

The horizontal electrodes may include first to seventh horizontal electrodes G1-G7. The insulating patterns 125 may be a silicon oxide layer. The buffer dielectric 121 may be thinner than the insulating patterns 125. The horizontal electrodes G1-G7 may include a doped silicon layer, a metal layer (e.g., of tungsten), a metal nitride layer, a metal silicide layer, or any combination thereof. For example, as shown in FIG. 4A, each of the horizontal electrodes G1-G7 may be configured to include a doped polysilicon layer, a metal layer (e.g., of tungsten) or a metal nitride layer. For example, as shown in FIG. 4B, each of the horizontal electrodes G1-G7 may be configured to include a doped polysilicon layer P and a silicide layer M. In example embodiments, cavities S may be provided in horizontal electrodes. Each of the cavities S may be an unfilled space delimited by the horizontal electrode, and a vertical section thereof may be shaped like a slit. The insulating patterns 125 and the horizontal electrodes G1-G7 may be vertically stacked to extend along a first direction. In example embodiments, the insulating patterns 125 and the horizontal electrodes G1-G7 may constitute gate structures G facing each other in a second direction, where the first and second directions may cross each other.

In example embodiments, as shown in the drawings, the uppermost layer of the horizontal electrodes may be divided into a plurality of portions, and the lowermost layer of the horizontal electrodes may be provided in the form of single body. For example, the uppermost layer of the horizontal electrodes may include the sixth and seventh horizontal electrodes G6 and G7, which are horizontally separated from each other in the second direction to extend along the first direction. However, example embodiments of the inventive concepts may not be limited thereto. For example, the uppermost layer of the horizontal electrodes may be divided into two or more portions, each of which may serve as an electrode.

Separation region 131 may be provided between the gate structures G to extend along the first direction. The separation region 131 may be filled with a first separation insulating layer (referring to 136 of FIG. 7C). Common source lines CSL may be provided in portions of the substrate 110 located below the separation region 131. The common source lines CSL may be spaced apart from each other in the substrate 110 to extend along the first direction. The common source lines CSL may have a second conductivity type (e.g., N-type) that is different from the first conductivity type. Unlike the structure depicted in the drawings, the common source lines CSL may be provided between the substrate 110 and the first horizontal electrode G1 and be a line-shaped pattern extending along the first direction.

A plurality of cell pillars PL may be connected to the substrate 110 through the horizontal electrodes G1-G7. Each of the cell pillars PL may be provided to have a longitudinal axis extending upward from the substrate 110 (for example, parallel to a third direction). The cell pillars PL may be arranged in a zigzag manner (FIG. 3). For example, the immediately adjacent cell pillars PL may be offset from each other. In other words, there may be a two adjacent rows of cell pillars which are staggered with each other. The immediately adjacent offset cell pillars PL may be coupled to the corresponding one of upper selection gates (e.g., the sixth or seventh horizontal electrode G6 or G7) extending along the first direction. The cell pillars PL may be disposed to connect the substrate 110 with upper interconnection lines extending along the second direction. The upper interconnection lines may include a first upper interconnection line BL1 and a second upper interconnection line BL2, which may be disposed adjacent to each other to extend along the second direction.

Memory elements 135 may be provided between the horizontal electrodes G1-G7 and the cell pillars PL. Alternatively, a gate insulating layer in place of the memory elements 135 may be provided the uppermost and lowermost ones (e.g., G1, G6, and G7) of the horizontal electrodes and the cell pillars PL.

According to some aspects of the inventive concept, the cell pillars PL may include a semiconductor material. Each of the cell pillars PL may have a solid cylindrical shape or a hollow cylindrical shape (e.g., a macaroni or tubular shape). In the case where the cell pillars PL are shaped like the macaroni, a gap-filling insulating layer 127 may be provided to fill internal spaces of the cell pillars PL. The gap-filling insulating layer 127 may be formed of a silicon oxide. The cell pillars PL and the substrate 110 may be continuously connected to each other, thereby constituting a single-body structure without a discontinuous interface. For example, the cell pillars PL may be single-crystalline semiconductor patterns connected to the substrate 110 without the discontinuous interface. In other embodiments, there may be a discontinuous interface between the cell pillars PL and the substrate 110. For example, the cell pillars PL may be a polycrystalline or amorphous semiconductor patterns. A conductive pattern 128 may be provided on each of the cell pillars PL.

A plurality of cell strings may be provided between the upper interconnection lines BL1 and BL2 and the common source lines CSL. The upper interconnection lines BL1 and BL2 may serve as bit lines (e.g., for FLASH memory devices). Each of the cell strings may include an upper selection transistor coupled to one of the upper interconnection lines BL1 and BL2, a lower selection transistor coupled to one of the common source lines CSL, and a plurality of memory cells provided between the upper and lower selection transistors. The first horizontal electrode G1 may serve as a gate electrode of the lower selection transistor, the second to fifth horizontal electrodes G2-G5 may serve as gate electrodes of the memory cells, and each of the sixth and seventh horizontal electrodes G6 and G7 may serve as a gate electrode of the upper selection transistor. Each of the cell pillars PL may be used to constitute a plurality of the memory cells MC. The gate electrode of the lower selection transistor may serve as a ground selection gate of FLASH memory device, and the gate electrode of the upper selection transistor may serve as a string selection gate of FLASH memory device.

Figure 5A:
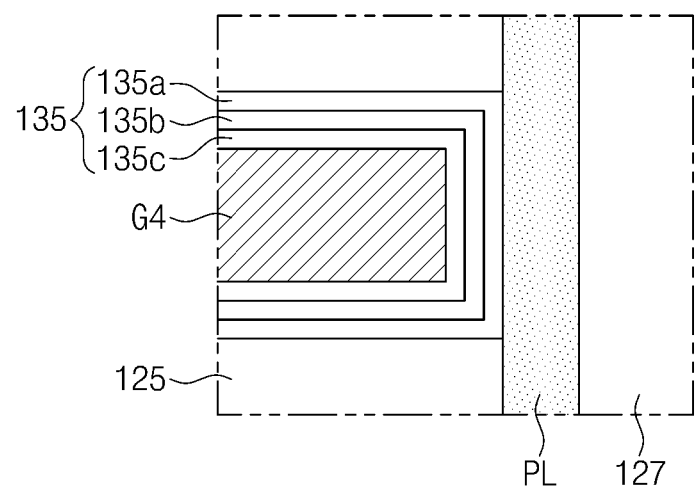
FIGS. 5A through 5D are enlarged views exemplarily illustrating a portion A of FIG. 3.

FIGS. 5A through 5D are enlarged views exemplarily illustrating a portion A of FIG. 3. Referring to FIG. 5A, the memory element 135 may include a blocking insulating layer 135c adjacent to the horizontal electrodes G1-G7, a tunnel insulating layer 135a adjacent to the cell pillars PL, and a charge storing layer 135b interposed therebetween. The memory element 135 may extend to be interposed between the horizontal electrodes G1-G7 and the insulating patterns 125. The blocking insulating layer 135c may include a high-k dielectric layer, such as an aluminum oxide layer or a hafnium oxide layer. The blocking insulating layer 135c may be a multi-layered structure including a plurality of layers. For example, the blocking insulating layer 135c may include an aluminum oxide layer and/or a hafnium oxide layer, and a stacking sequence of the aluminum oxide layer and the hafnium oxide layer may be variously modified. The charge storing layer 135b may be a charge-trap layer or an insulating layer provided with conductive nano particles. For example, the charge-trap layer may include a silicon nitride layer. The tunnel insulating layer 135a may include a silicon oxide layer.

Figure 5B:
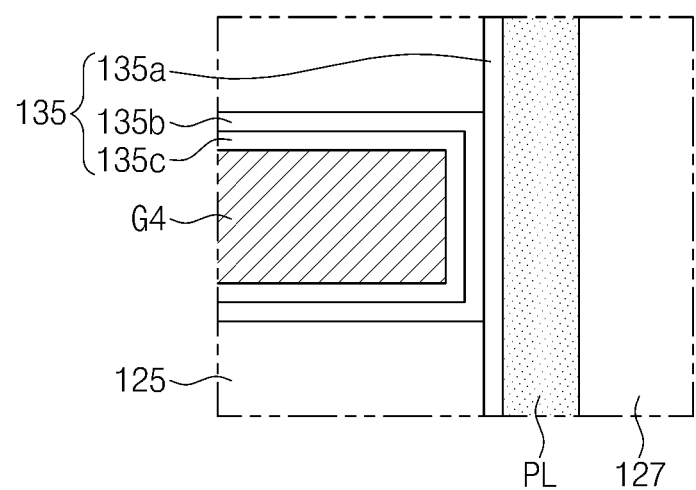
Figure 5C:
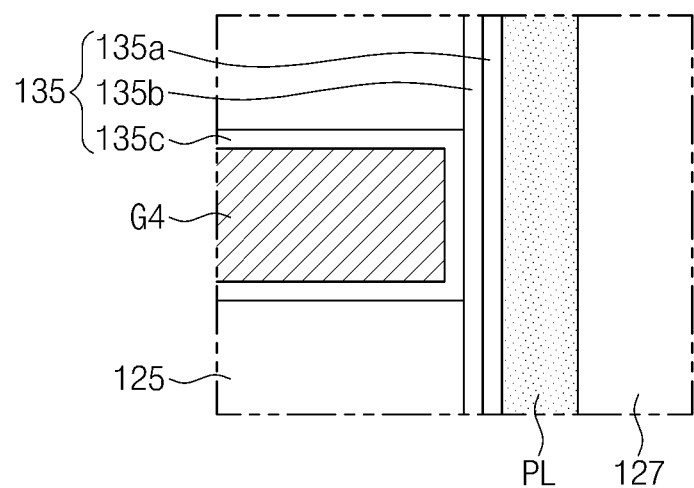
Figure 5D:
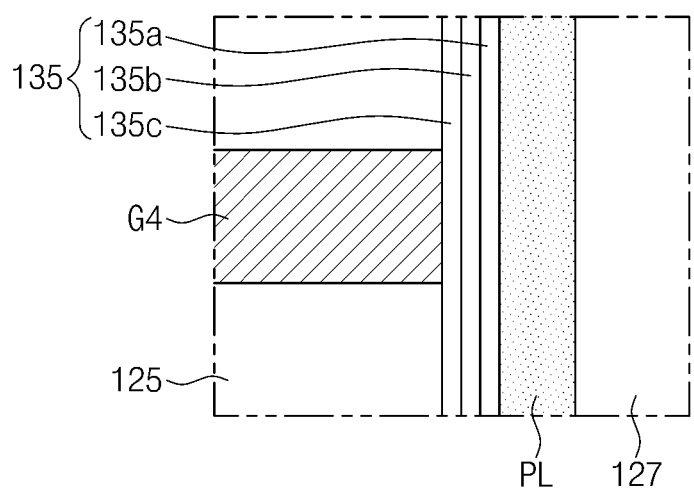

Referring to FIGS. 5B through 5D, unlike that shown in FIG. 3, at least a portion of the memory element 135 may extend to be interposed between the insulating patterns 125 and the cell pillars PL. Referring to FIG. 5B, the tunnel insulating layer 135a may extend between the insulating patterns 125 and the cell pillars PL, and the charge storing layer 135b and the blocking insulating layer 135c may extend between the insulating patterns 125 and the horizontal electrodes G1-G7. Referring to FIG. 5C, the tunnel insulating layer 135a and the charge storing layer 135b may extend between the insulating patterns 125 and the cell pillars PL, and the blocking insulating layer 135c may extend between the insulating patterns 125 and the horizontal electrodes G1-G7. Referring to FIG. 5D, the tunnel insulating layer 135a, the charge storing layer 135b, and the blocking insulating layer 135c may extend between the insulating patterns 125 and the cell pillars PL.

Figure 6A:
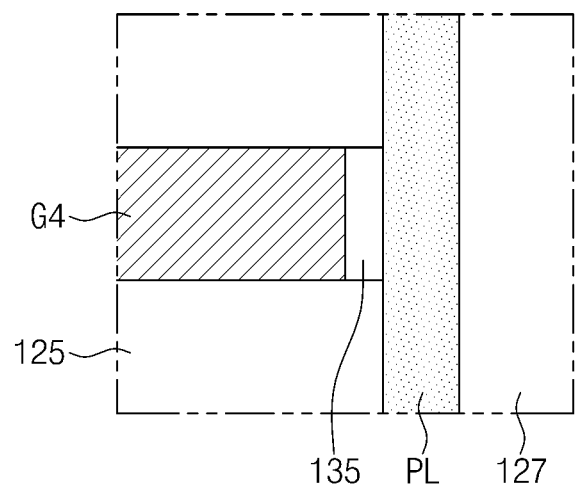
FIGS. 6A through 6D are enlarged views exemplarily illustrating a portion A of FIG. 3.
Figure 6B:
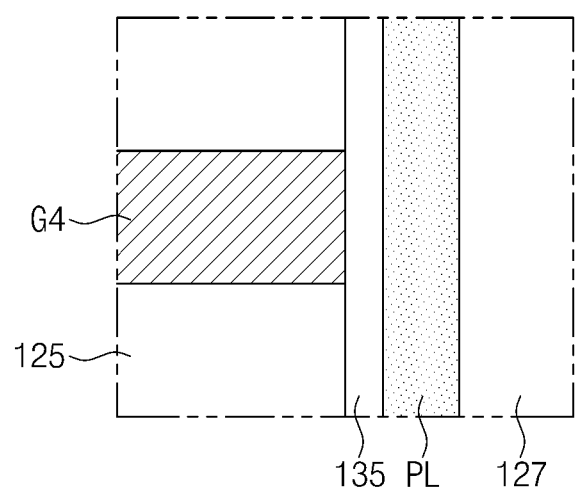
Figure 6C:
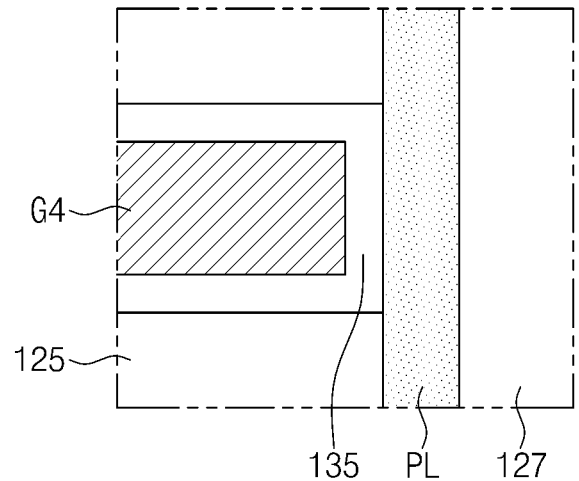

According to other aspects of the inventive concept, the cell pillars PL may be formed of a conductive material. For example, the cell pillars PL may include at least one of conductive materials, such as a doped semiconductor layer, a metal layer, a conductive metal nitride layer, a silicide layer, or a conducting nano structure (e.g., carbon nanotube or graphene). The memory element 135 may be a variable resistance pattern. The variable resistance pattern may include at least one of materials having a variable resistance property. FIGS. 6A through 6D are enlarged views exemplarily illustrating a portion A of FIG. 3. Referring to FIG. 6A, unlike that shown in FIG. 3, the memory element 135 may be formed within one of localized regions between the horizontal electrodes G1-G7 and the cell pillars PL. Referring to FIGS. 6B and 6C, the memory element 135 may extend between the insulating patterns 125 and the cell pillars PL or between the insulating patterns 125 and the horizontal electrodes G1-G7.

The memory element 135 may include a material (for example, a phase-changeable material), whose electric resistance can be changed using thermal energy applied thereto. Thermal energy may be generated by an electric current passing through an electrode adjacent to the memory element 135. The phase-changeable material may be a material including at least one of antimony (Sb), tellurium (Te), or selenium (Se). For example, the phase-changeable material may include a chalcogenide formed of tellurium (Te) having about 20 to about 80 atomic percent concentration, antimony (Sb) having about 5 to about 50 atomic percent concentration, and germanium (Ge) having the remaining concentration. In addition, the phase-changeable material may further include impurities of at least one of N, O, C, Bi, In, B, Sn, Si, Ti, Al, Ni, Fe, Dy, or La. In example embodiments, the memory element 135 may be formed of one of GeBiTe, InSb, GeSb, and GaSb.

The memory element 135 may be configured to have a layered structure whose electric resistance may be changed using a spin transferring phenomenon of an electric current flowing through the memory element 135. For example, the memory element 135 may be configured to have a layered structure exhibiting a magneto-resistance property and include at least one ferromagnetic material and/or at least one antiferromagnetic material.

The memory element 135 may include at least one of perovskite compounds or transition metal oxides. For example, the memory element 135 may include at least one of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, or barium-strontium-zirconium oxide.

Figure 6D:
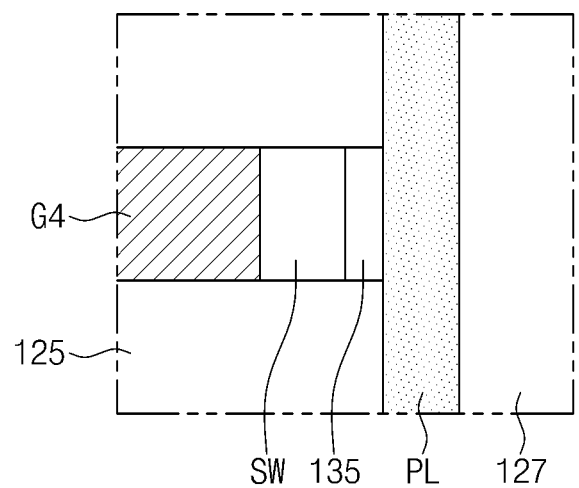

In example embodiments, as shown in FIG. 6D, a switching element SW may be interposed between the memory element 135 and the horizontal electrodes G1-G7. The switching element SW may be formed of a material exhibiting a self-rectifying property or a nonlinear current-voltage property. For example, the switching element SW may be configured to form PN-junction diode.

Figure 7A:
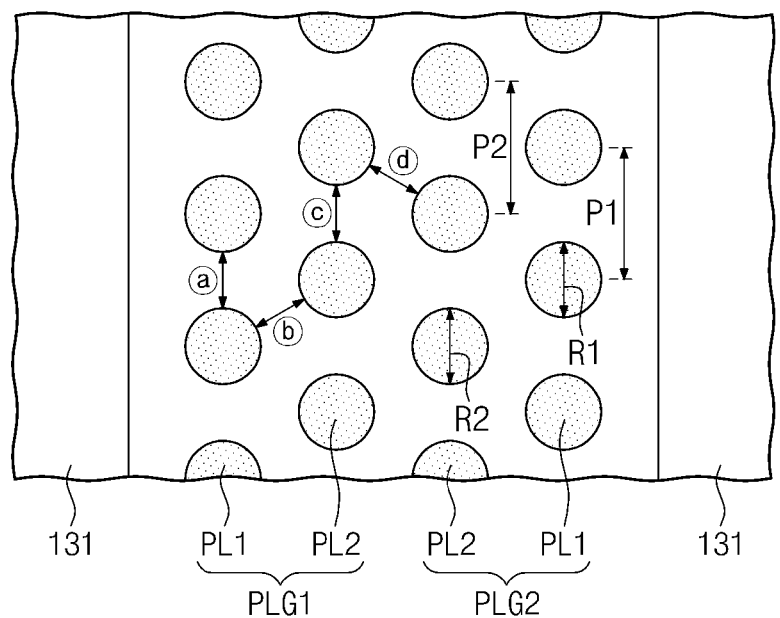
FIG. 7A is a diagram exemplarily illustrating an arrangement of cell pillars provided in the memory block of FIG. 3.
Figure 7B:
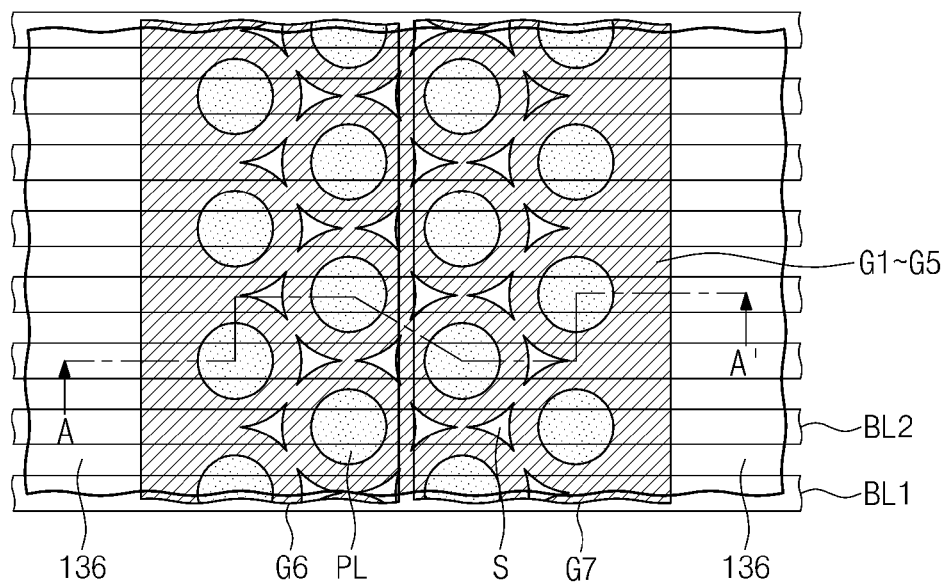
FIG. 7B is a diagram exemplarily illustrating horizontal electrodes provided in the memory block of FIG. 3.
Figure 7C:
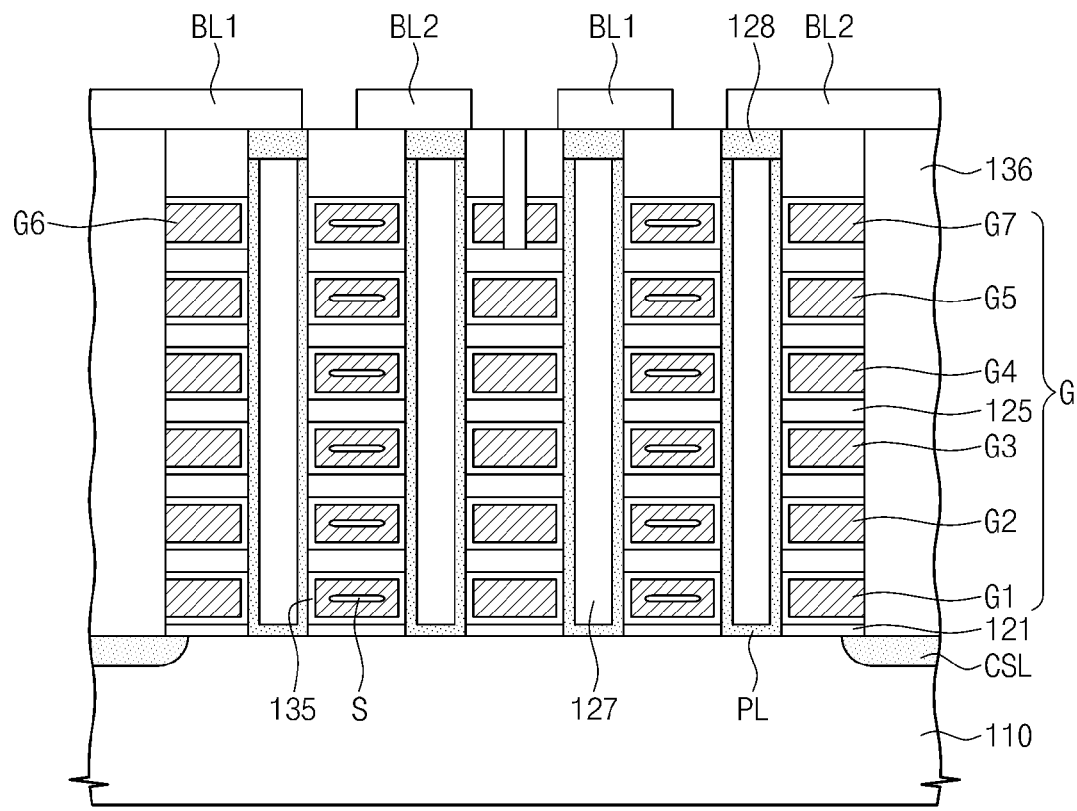
FIG. 7C is a sectional view taken along a line A-A' of FIG. 7B.
Figure 8A:
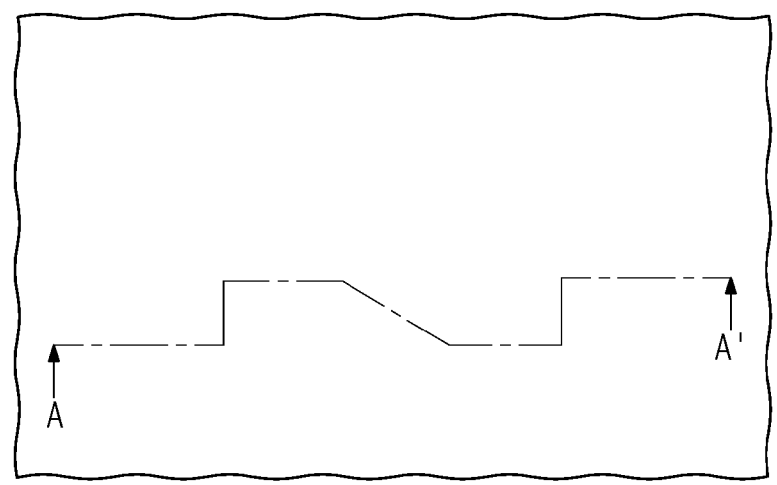
FIGS. 8A, 8B, 9A, 9B, 10A, 10B, 11A, 11B, 12A, 12B, 13A, and 13B are plan and sectional views illustrating a process of fabricating the semiconductor device shown in FIGS. 7B and 7C.
Figure 8B:
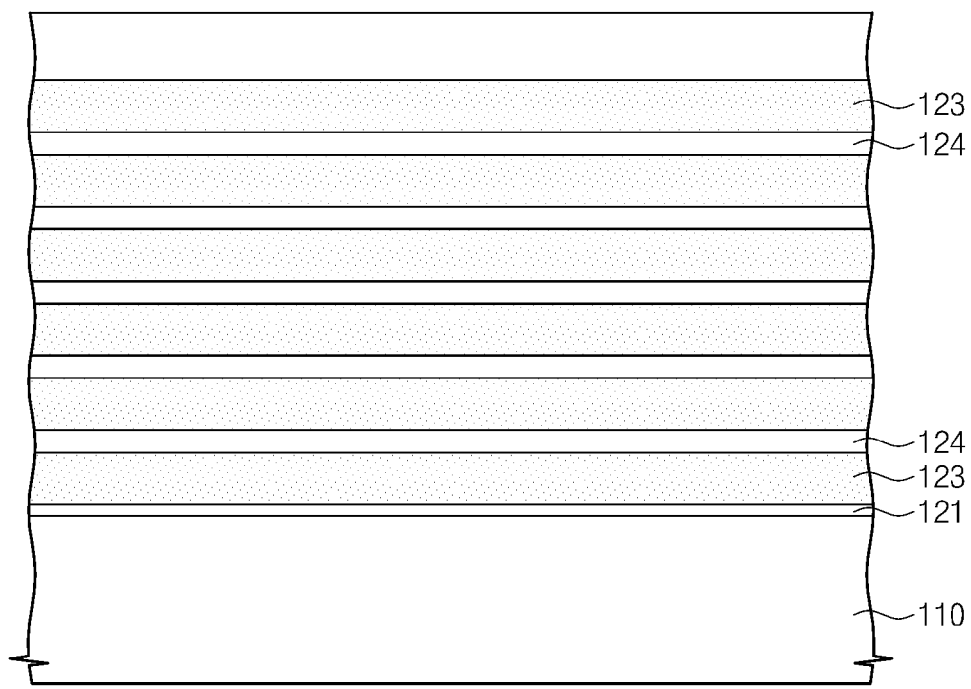

Semiconductor devices according to example embodiments of the inventive concept will be described in more detail below. FIG. 7A is a diagram exemplarily illustrating an arrangement of cell pillars provided in the memory block of FIG. 3, and FIG. 7B is a diagram exemplarily illustrating horizontal electrodes provided in the memory block of FIG. 3. FIG. 7C is a sectional view taken along a line A-A' of FIG. 7B. In order to reduce complexity in the drawings and to provide better understanding of example embodiments of the inventive concepts, the memory element 135 will not be shown in FIGS. 7A and 7B.

Referring to FIG. 7A, the cell pillars PL may include groups, each of which includes first cell pillars PL1 arranged on a first column and second cell pillars PL2 arranged on a second column. Here, the first column may be positioned between the separation region 131 and the second column. For example, the first cell pillars PL1 may be arranged in a column between the separation region 131 and the second cell pillars PL2. In example embodiments, the groups may include first and second groups PLG1 and PLG2. The first and second groups PLG1 and PLG2 may be provided adjacent to each other in the second direction. In addition, the first and second groups PLG1 and PLG2 may be provided parallel to each other. The second cell pillars PL2 may be arranged in such a way that each of them is located at a position shifted from the first cell pillars PL1 along the first direction. In other words, the second cell pillars PL2 are staggered with respect to the first cell pillars PL1. The shift distance of the second cell pillars PL2 in the first direction may be about a half pitch between the cell pillars.

Figure 18A:
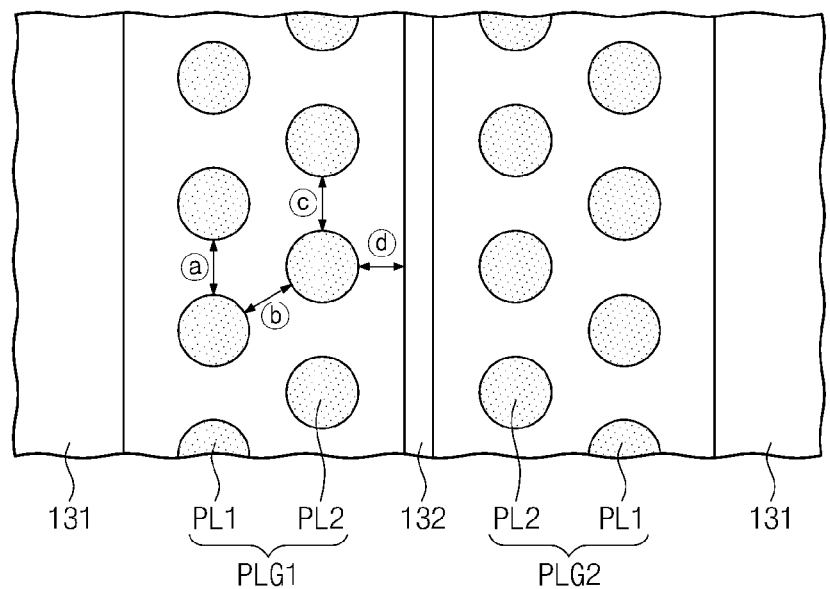
FIG. 18A is a diagram exemplarily illustrating an arrangement of cell pillars provided in the memory block of FIG. 17.

As shown, the groups adjacent to each other may include the cell pillars having substantially the same arrangement. Alternatively, adjacent two of the groups (e.g., PLG1 and PLG2) may be configured to have a mirror-symmetric arrangement of the cell pillars with respect to each other, as shown in FIG. 18A. Meanwhile, example embodiments of the inventive concepts may not be limited to the depicted example, in which each of the groups is configured to have the cell pillars PL1 and PL2 arranged along two rows. For example, each of the groups may have cell pillars arranged along three or more rows. As shown in the drawings, each group may include the cell pillars PL1 and PL2 arranged along two columns, but example embodiments of the inventive concepts may not be limited thereto. For example, each group may be configured to include three or more columns of the cell pillars. Further, as shown in the drawings, each gate structure may include two groups disposed parallel to each other, but example embodiments of the inventive concepts may not be limited thereto. For example, each gate structure may include three or more groups disposed parallel to each other.

The cell pillars in each group may be coupled to one of the upper selection gates G6 and G7. The immediately adjacent offset cell pillars may be coupled with one of the upper selection gates G6 and G7 extending along the first direction.

Figure 15:
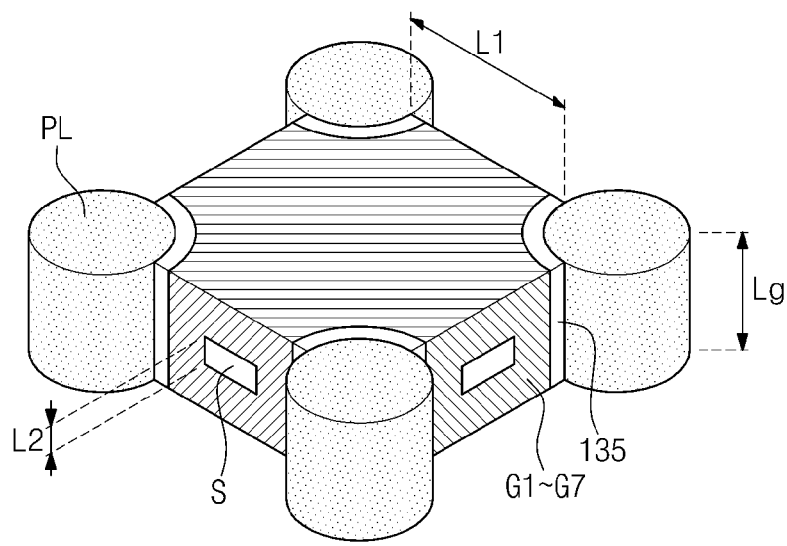
FIG. 15 is a perspective view exemplarily illustrating the horizontal electrode.

In example embodiments, intervals between the cell pillars PL may be non-uniform. For example, the intervals between or configuration of the cell pillars PL may be described in terms of two or more different dimensions. At least one adjacent pair of the cell pillars near the separation region 131 may be provided to have an interval greater than that of an adjacent pair of the cell pillars apart from the separation region 131. Here, the interval means that between side surfaces of the cell pillars (as shown in FIG. 15). The interval between the cell pillars may be determined by pitch and diameter of the cell pillars. For example, a diameter R1 of the first cell pillars PL1 may be smaller than a diameter R2 of the second cell pillars PL2. A pitch P1 of the first cell pillars PL1 may be greater than a pitch P2 of the second cell pillars PL2.

An interval ⓐ between adjacent two of the first cell pillars PL1 in the same group may be greater than an interval ⓒ between adjacent two of the second cell pillars PL2 in the same group. The interval ⓐ may be greater than an interval ⓑ between one of the first cell pillars and one of the second cell pillars nearest neighbor thereto. The interval ⓒ may be smaller than the interval ⓑ. An interval ⓓ between adjacent two of the second cell pillars PL2, included in groups different from each other, may be smaller than the interval ⓒ.

Referring to FIGS. 7A through 7C, the separation region 131 may be filled with a first separation insulating layer 136. As shown, the cavities S may be formed in portions of the horizontal electrodes G1-G7 located between the cell pillars PL. A size of the cavity near the first separation insulating layer 136 may smaller than that apart from the first separation insulating layer 136. In example embodiments, the cavity S may not be formed near the first separation insulating layer 136. The cavities S may be locally provided between the cell pillars PL and be separated from each other. In example embodiments, the maximum width of the cavity S may be smaller than a pitch of the cell pillars PL adjacent thereto.

The upper interconnection lines may include the first upper interconnection line BL1 and the second upper interconnection line BL2. Each of the first and second cell pillars PL1 and PL2 of each group may be connected to the corresponding one of the upper interconnection lines. The first cell pillars PL1 of the first group PLG1 and the second cell pillars PL2 of the second group PLG2 may be connected to the first upper interconnection lines BL1. The second cell pillars PL2 of the first group PLG1 and the first cell pillars PL1 of the second group PLG2 may be connected to the second upper interconnection lines BL2. The first and second upper interconnection lines BL1 and BL2 may be alternatingly arranged adjacent to each other.

A process of fabricating the semiconductor device of FIG. 3 will be described below. FIGS. 8A through 13A and 8B through 13B are plan and sectional views, respectively, illustrating a process of fabricating the semiconductor device shown in FIGS. 7B and 7C.

Referring to FIGS. 7A and 7B, the substrate 110 may be provided. In example embodiments, the substrate 110 may have the first conductivity type (e.g., P-type). The buffer dielectric 121 may be formed on the substrate 110. For example, the buffer dielectric 121 may be a silicon oxide layer. For example, the buffer dielectric 121 may be formed by a thermal oxidation process. Sacrificial layers 123 and insulating layers 124 may be alternatingly stacked on the buffer dielectric 121. In example embodiments, the uppermost layer of the insulating layers may be formed to have a thickness greater than those of the others of the insulating layers. For example, the insulating layers 124 may be a silicon oxide layer. The sacrificial layers 123 may include a material exhibiting a wet etching property different from those of the buffer dielectric 121 and insulating layers 124. For example, the sacrificial layers 123 may include a silicon nitride layer, a silicon oxynitride layer, a polysilicon layer, or polysilicon germanium layer. In example embodiments, the sacrificial layers 123 and the insulating layers 124 may be formed using, for example, a chemical vapor deposition (CVD) process.

Figure 9A:
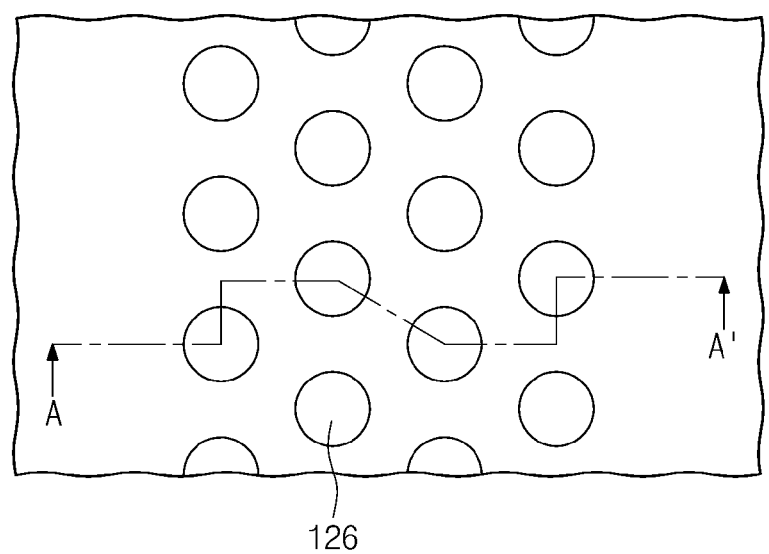
Figure 9B:
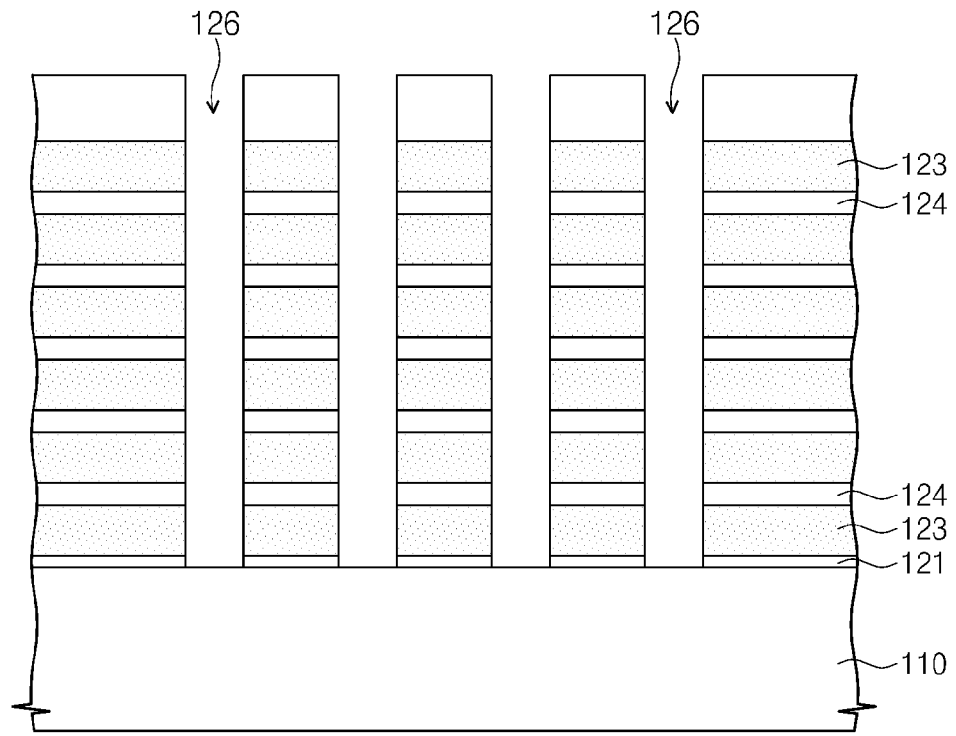

Referring to FIGS. 9A and 9B, cell holes 126 may be formed to expose the substrate 110 through the buffer dielectric 121, the sacrificial layers 123, and the insulating layers 124. The cell holes 126 may be formed to have the same arrangement as the cell pillars PL described with reference to FIG. 7A.

Figure 10A:
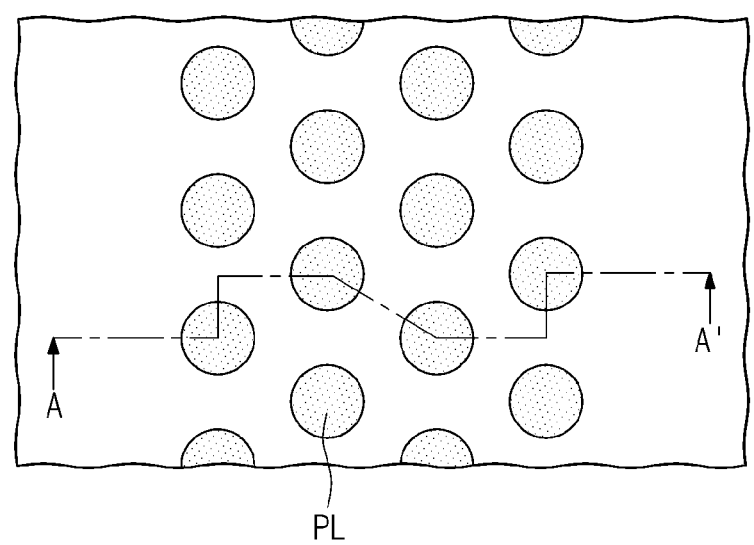
Figure 10B:
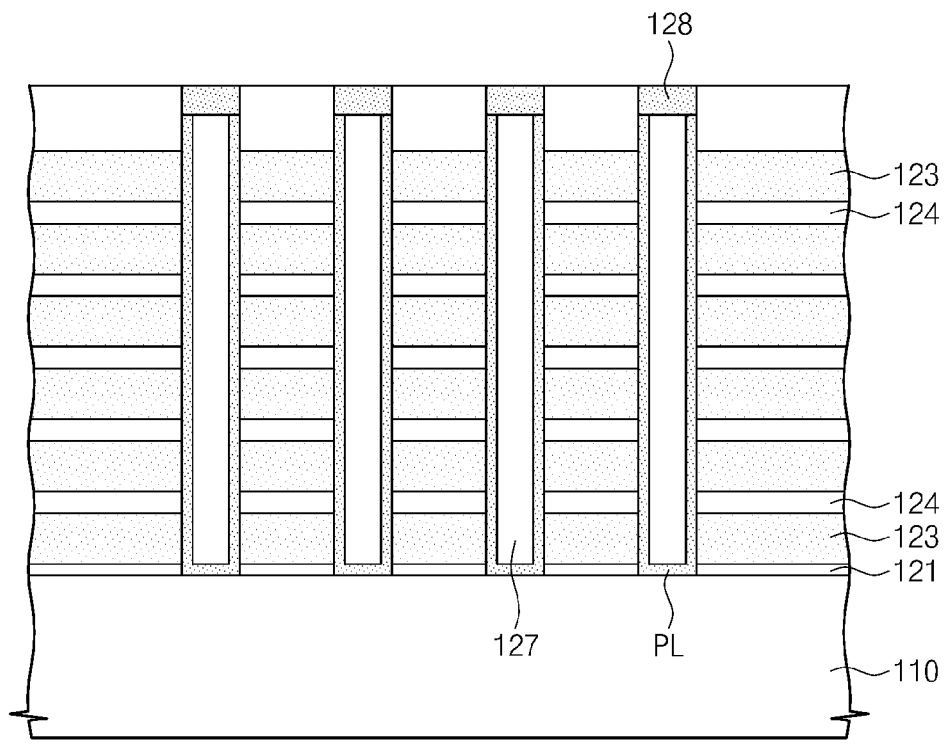

Referring to FIGS. 10A and 10B, the cell pillars PL may be formed in the cell holes 126. In some aspects, the cell pillars PL may be formed of a semiconductor layer having the first conductivity type. The semiconductor layer may be formed not to completely fill the cell holes 126, and an insulating material may be formed on the semiconductor layer to completely fill the cell holes 126. The semiconductor layer and the insulating material may be planarized to expose the uppermost layer of the insulating layers. Accordingly, the cell pillars PL may be formed to have a cylindrical shape, and each of them may be filled with the gap-filling insulating layer 127. A semiconductor layer may be formed to fill the cell holes 126. In this case, the formation of the gap-filling insulating layer may be omitted. Upper portions of the cell pillars PL may be recessed lower than a top surface of the uppermost layer of the insulating layers 124. The conductive patterns 128 may be formed in the recessed upper portions of the cell pillars PL. The conductive patterns 128 may be formed of a doped polysilicon layer or a metal layer. Impurities of the second conductivity type may be injected into the conductive patterns 128 or the upper portions of the cell pillars PL to form drain regions. In example embodiments, the second conductivity type may be N-type.

In other aspects, the cell pillars PL may include at least one of conductive materials, such as a doped semiconductor layer, a metal layer, a conductive metal nitride layer, a silicide layer, or a nano structure (e.g., carbon nanotube or graphene).

Figure 11A:
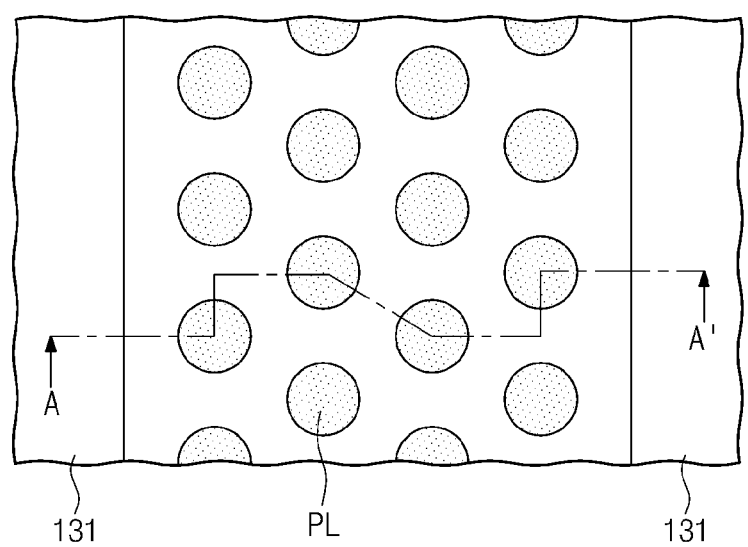
Figure 11B:
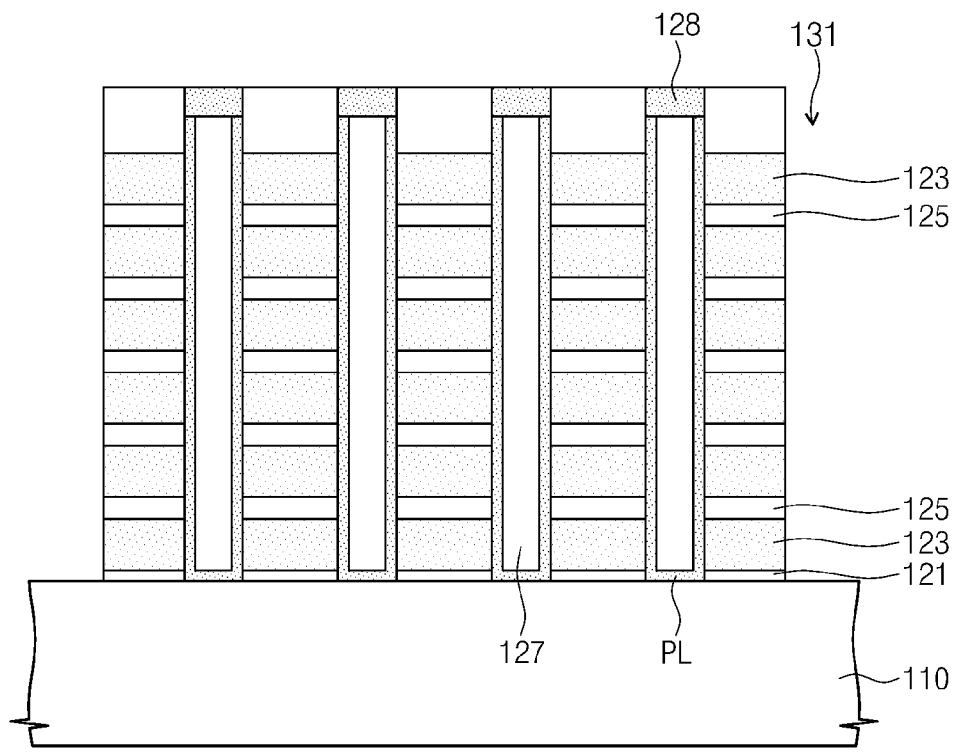

Referring to FIGS. 11A and 11B, the buffer dielectric 121, the sacrificial layers 123 and the insulating layers 124 may be sequentially patterned to form the separation regions 131, which may be spaced apart from each other to expose the substrate 110. The separation regions 131 may be formed parallel to the first direction. The insulating patterns 125 may be formed as the result of the patterning of the insulating layers 124.

Figure 12A:
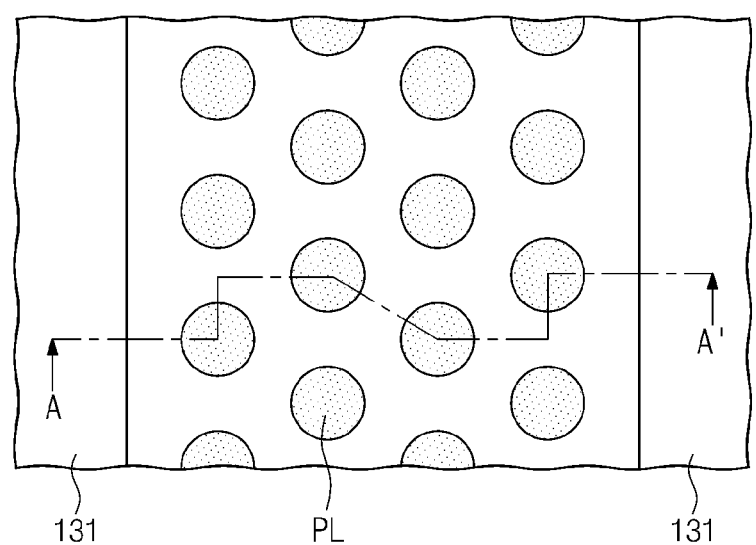
Figure 12B:
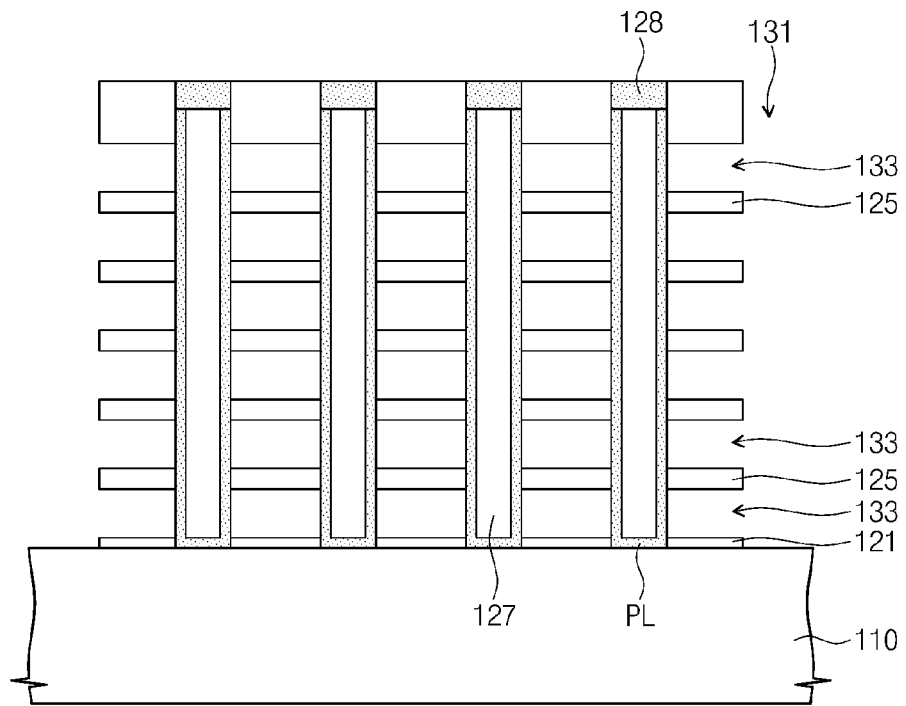

Referring to FIGS. 12A and 12B, the sacrificial layers 123 exposed by the separation regions 131 may be selectively removed to form recess regions 133. The recess regions 133 may correspond to regions previously occupied by the sacrificial layers 123, and each of them may be delimited by the cell pillars PL and the insulating patterns 125. In the case where the sacrificial layers 123 include a silicon nitride layer or a silicon oxynitride layer, the removal of the sacrificial layers 123 may be performed using an etch solution containing phosphoric acid. A sidewall of each cell pillar PL may be partially exposed by the recess regions 133.

Figure 13A:
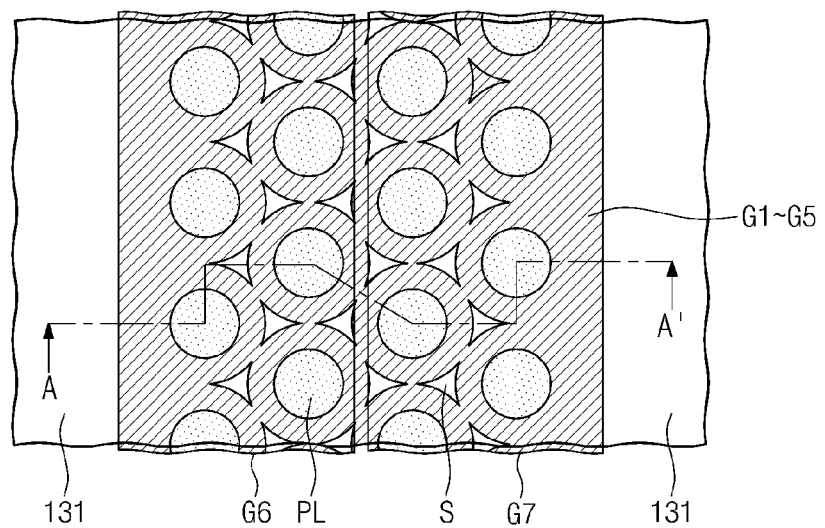
Figure 13B:
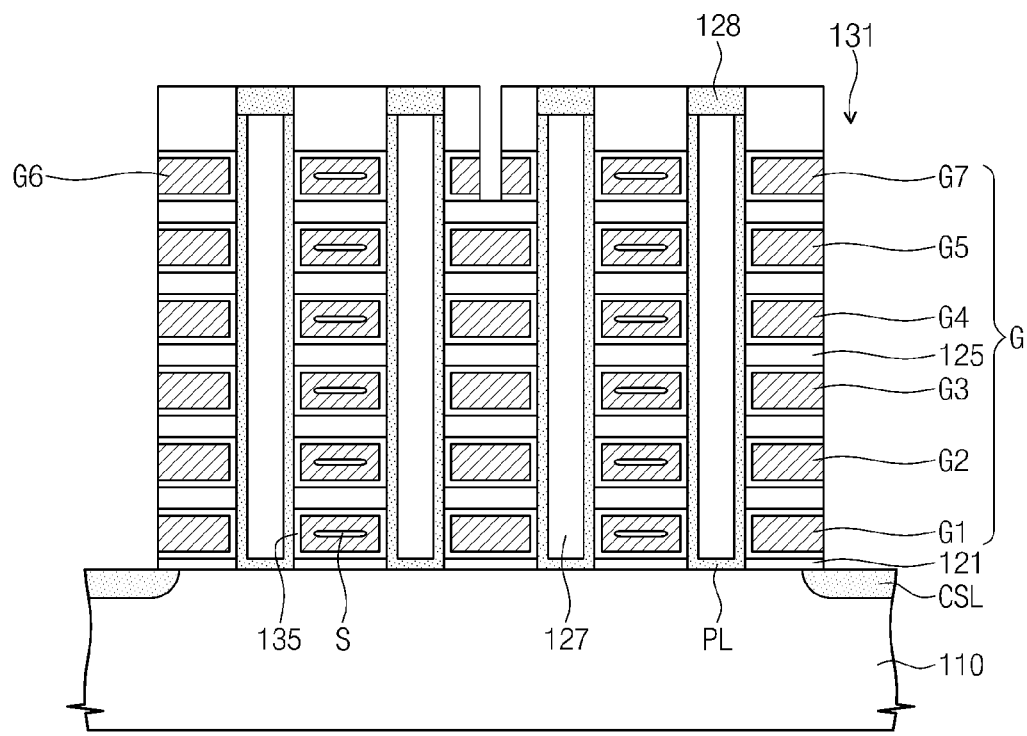

Referring to FIGS. 13A and 13B, the memory element 135 may be formed to cover the recess region 133.

In some aspects, the memory element 135 may include a tunnel insulating layer being in contact with the cell pillars PL, a charge storing layer on the tunnel insulating layer, and a blocking insulating layer on the charge storing layer (for example, see FIG. 5A). In this case, the cell pillars PL may be formed of a semiconductor layer. The tunnel insulating layer may include a silicon oxide layer. The tunnel insulating layer may be formed by thermally oxidizing sidewalls of the cell pillars PL exposed by the recess region 133. Alternatively, the tunnel insulating layer may be formed using an atomic layer deposition process. The charge storing layer may be a charge trap layer or an insulating layer with conductive nano particles. The charge trap layer may include, for example, a silicon nitride layer. The blocking insulating layer may include a high-k dielectric layer (such as, aluminum oxide or hafnium oxide). The blocking insulating layer may have a multi-layered structure including a plurality of thin films. For example, the blocking insulating layer may include an aluminum oxide layer and a silicon oxide layer, and a stacking sequence of the aluminum oxide layer and the hafnium oxide layer may be variously modified. The charge storing layer and the blocking insulating layer may be formed using one of deposition techniques with excellent step-coverage property (e.g., an atomic layer deposition and/or a chemical vapor deposition). In the case where the memory element 135 is one of the structures of FIGS. 5B through 5D, at least one of the tunnel insulating layer, the charge storing layer and/or the blocking insulating layer may be formed in the cell holes 126, before the formation of the cell pillars PL.

In other aspects, the memory element 135 may be formed of a material exhibiting a variable resistance property (for example, see FIGS. 6A through 6C). The variable resistance pattern may include at least one of variable resistance materials, whose resistance can be selectively changed by an electric current passing therethrough. In this case, the cell pillars PL may include at least one of conductive materials, such as a doped semiconductor layer, a metal layer, a conductive metal nitride layer, a silicide layer, or a nano structure (e.g., carbon nanotube or graphene). In the case where the memory element 135 has the structure of FIG. 6B, the memory element 135 may be formed in the cell holes 126, before the formation of the cell pillars PL.

A conductive layer may be formed in the recess region 133 to cover the memory element 135. The conductive layer may be formed of at least one of a doped silicon layer, a metal layer (e.g., of tungsten), a metal nitride layer, and a metal silicide layer. The conductive layer may be formed using an atomic layer deposition technique. In the case where the conductive layer is a metal silicide layer, the formation of the conductive layer may include forming a polysilicon layer, partially removing or horizontally recessing the polysilicon layer adjacent to the separation region 131, forming a metal layer in the recessed region of the polysilicon layer, performing a thermal treatment on the metal layer, and then, removing an unreacted portion of the metal layer. The metal layer for forming the metal silicide layer may include tungsten, titanium, cobalt, or nickel.

In example embodiments, the conductive layer may be formed to incompletely fill the recess region 133, such that the cavities S may be formed in the conductive layer. For all that, due to the arrangement of the cell pillars PL described with reference to FIG. 7A, a material for forming the conductive layer can be easily supplied into the recess region 133 through gaps between the cell pillars PL, and this enables to reduce a size of the cavity S or prevent the cavities S from being formed. These technical effects will be described in more detail with reference to FIG. 14.

The conductive layer may be partially removed and localized in each recess region 133. Accordingly, the horizontal electrodes G1-G7 may be formed in the recess regions 133, respectively. The uppermost horizontal electrode may be patterned to have the structural features corresponding to that described with reference to FIG. 7A. For example, the uppermost horizontal electrode may be separated into the sixth and seventh horizontal electrodes G6 and G7 extending along the first direction.

The conductive layer may be removed from the separation regions 131 to expose portions of the substrate 110. The exposed portions of the substrate 110 may be highly doped with impurities having the second conductivity type to form the common source lines CSL.

Referring back to FIGS. 7B and 7C, the first separation insulating layer 136 may be formed to fill the separation regions 131. A row of the cell pillars PL arranged along the second direction may be connected in common to one of the upper interconnection lines BL1 and BL2.

Figure 14:
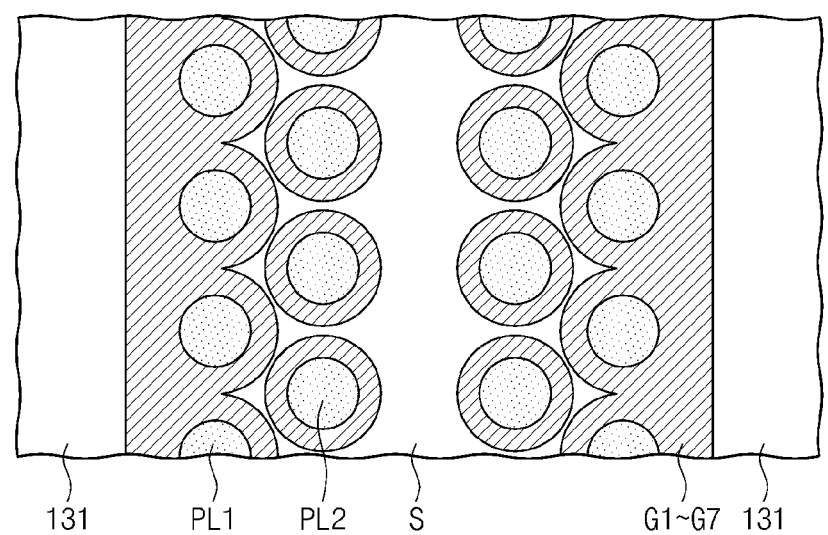
FIG. 14 is a diagram showing a portion of a semiconductor device presented as a comparative example for better understanding of the inventive concept.

FIG. 14 is a diagram showing a portion of a semiconductor device presented as a comparative example for better understanding of the inventive concept. As shown in FIG. 14, in a conventional arrangement of the cell pillars, an inner portion of the recess region 133 far from the separation regions 131 may not be fully filled with a conductive layer deposited to form the horizontal electrodes G1-G7, even after outer portions (e.g., between the cell pillars PL) of the recess region 133 adjacent to the separation regions 131 are fully filled with the conductive layer. For example, a source material for forming the conductive layer may be more efficiently supplied near the inner portion of the recess region 133, compared with the outer portion of the recess region 133, and this means that the conductive layer may be deposited more rapidly on the outer portion of the recess region 133 than on the inner portion. Therefore, it may be difficult to supply the source material into the inner portion of the recess region 133, and consequently, the conductive layer may be formed to have a very large cavity at the inner portion of the recess region 133. For example, as shown in FIG. 14, the cavities S may be connected with each other to form an elongated structure extending along, for example, the first direction.

This may result in several technical difficulties. Firstly, there may be an increase in resistance of the horizontal electrodes. For example, in the case of FIG. 14, inner portions of the horizontal electrodes far from the separation regions 131 may exhibit a very high electric resistance property. Accordingly, a voltage or an electric current applied to the memory element adjacent to the second cell pillars PL2 may be smaller than that adjacent to the first cell pillars PL1.

Secondly, chemicals may be present in the cavities S, thereby causing a damage to the insulating patterns 125, the memory element 135, and/or the cell pillars PL during a subsequent process. This damage may lead to deterioration in electric isolation property between the horizontal electrodes and/or between the cell pillars and the horizontal electrodes. In addition, this damage may lead to deterioration in data-storing property of the memory element 135.

Referring back to FIGS. 7A and 13A, according to example embodiments of the inventive concept, the cell pillars PL may be arranged in such a way that the cavities S may be locally provided between every cell pillar PL and be separated from each other. Sizes of the cavities S may be smaller than the pitches of the cell pillars PL adjacent thereto. Sizes of the cavities S near the separation region 131 may be smaller than that apart from the separation region 131. In example embodiments, the cavity S may not be formed near the separation region 131. Accordingly, the cavities S can be suppressed from being connected to each other to form an elongated structure. This enables to improve electric characteristics (such as, conductivity and electric isolation) of the horizontal electrodes and the data-storing property of the memory element 135, compared with the comparative example described with reference to FIG. 14.

Figure 16:
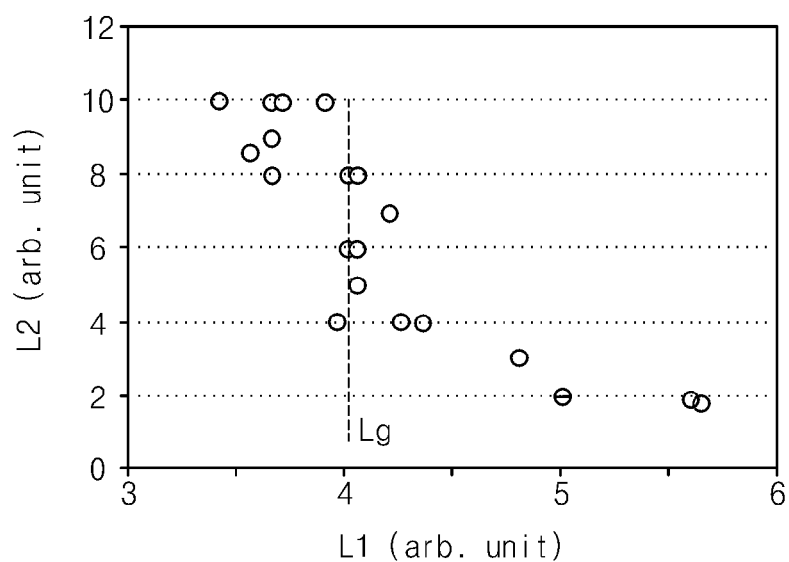
FIG. 16 is a graph showing a relationship of cavity heights to intervals between cell pillars of FIG. 15.

FIG. 15 is a perspective view exemplarily illustrating the horizontal electrode. FIG. 16 is a graph showing a relationship of cavity heights L2 to intervals L1 between cell pillars of FIG. 15.

Referring to FIGS. 15 and 16, the horizontal electrodes G1-G7 may fill partially a space between the cell pillars PL. For example, at least one cavity S may be formed in each of the horizontal electrodes G1-G7, which may be formed by a replacement process. According to some aspects of the inventive concept, a height L2 or a size of the cavity S may increase with decreasing interval L1 between the cell pillars. In the case where the interval L1 between the cell pillars is smaller than a thickness Lg of each horizontal electrode, a decrease in the interval L1 may lead to a marked increase in the height L2 of the cavity. In consideration of this aspect, the cell pillars PL may be arranged in such a way that the interval L1 therebetween is greater than the thickness Lg of each horizontal electrode (e.g., located at a vertical level concerned).

Figure 17:
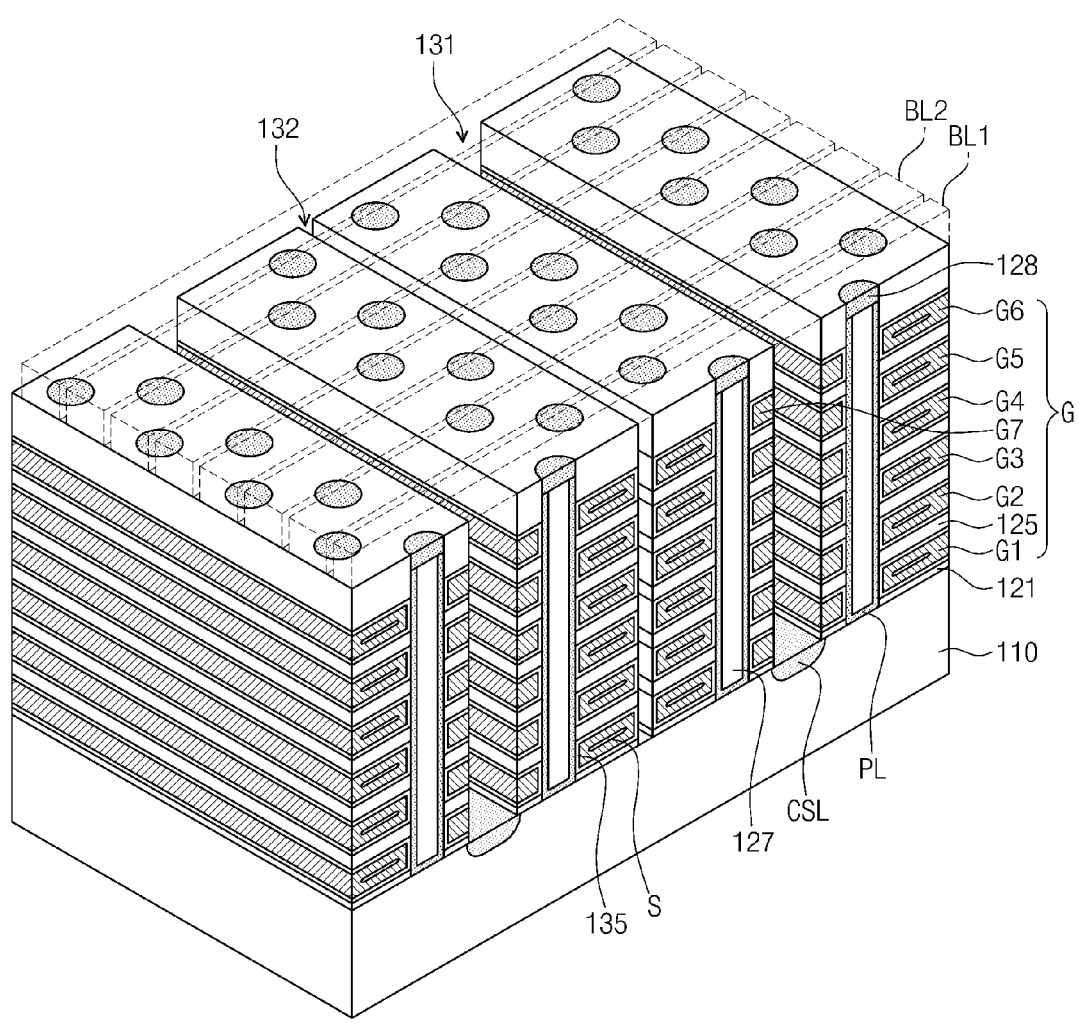
FIG. 17 is a perspective view illustrating a memory block of a semiconductor device according to other example embodiments of the inventive concept.
Figure 18B:
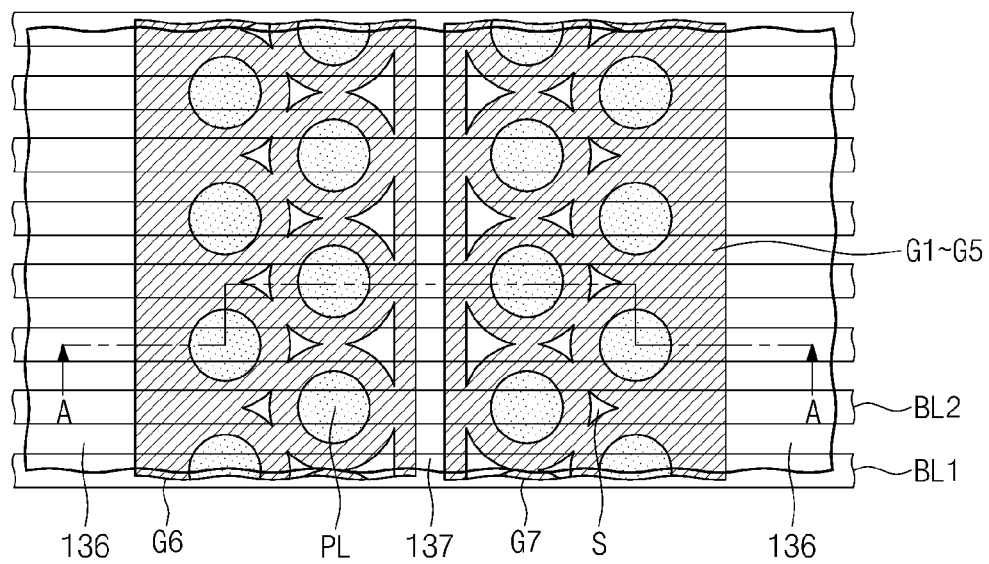
FIG. 18B is a diagram exemplarily illustrating horizontal electrodes provided in the memory block of FIG. 17.
Figure 18C:
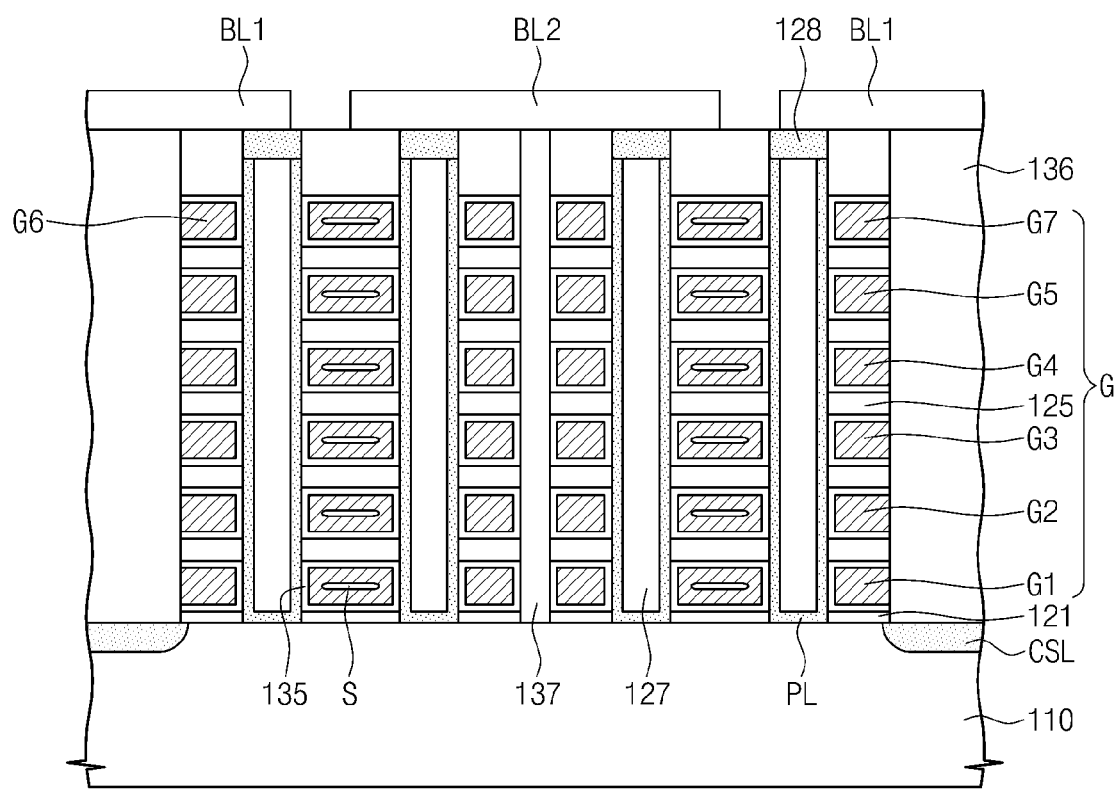
FIG. 18C is a sectional view taken along a line A-A' of FIG. 18B.
Figure 19A:
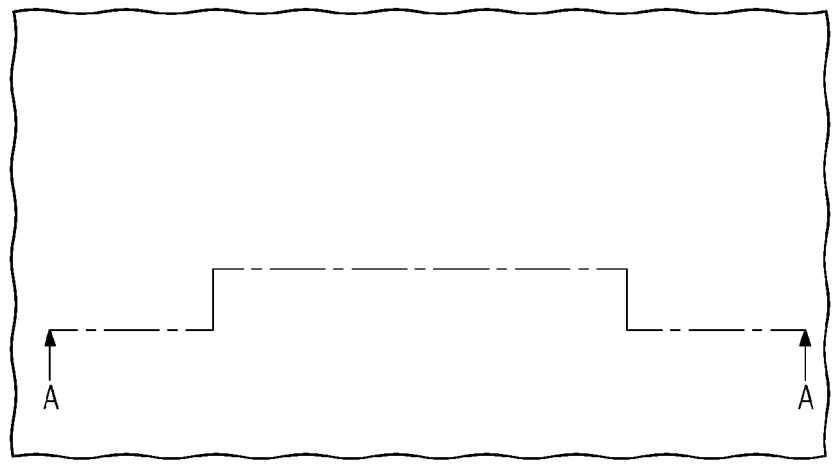
FIGS. 19A, 19B, 20A, 20B, 21A, 21B, 22A, 22B, 23A, 23B, 24A, and 24B are plan and sectional views illustrating a process of fabricating the semiconductor device shown in FIGS. 18B and 18C.
Figure 19B:
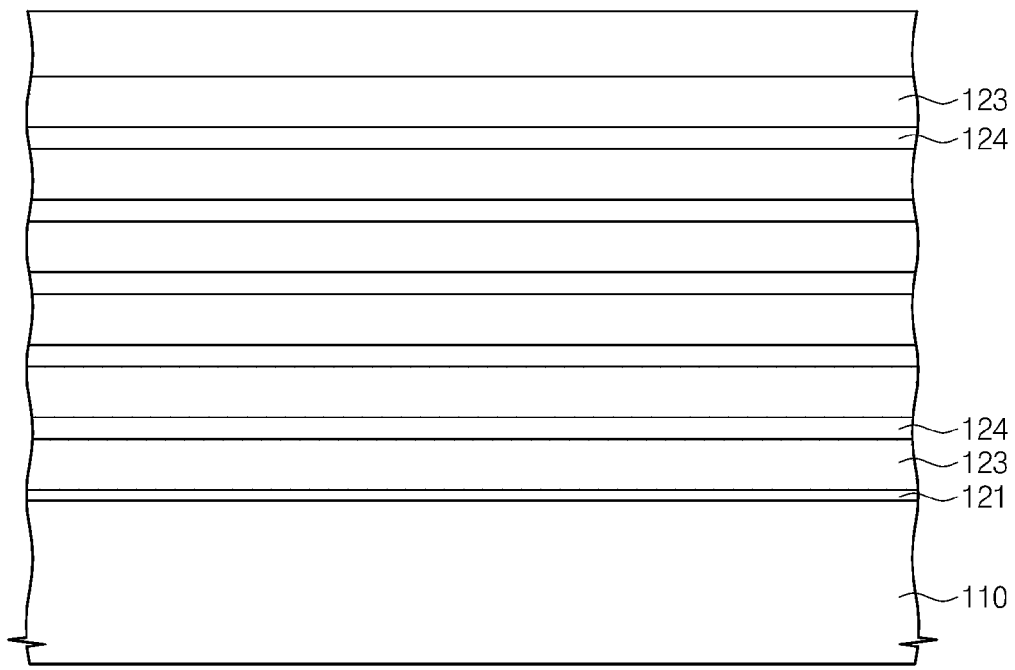
Figure 20A:
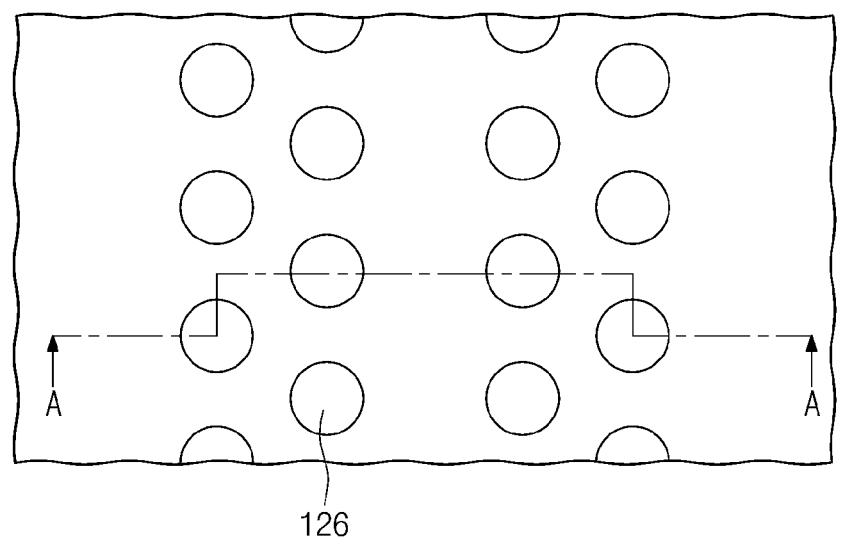
Figure 20B:
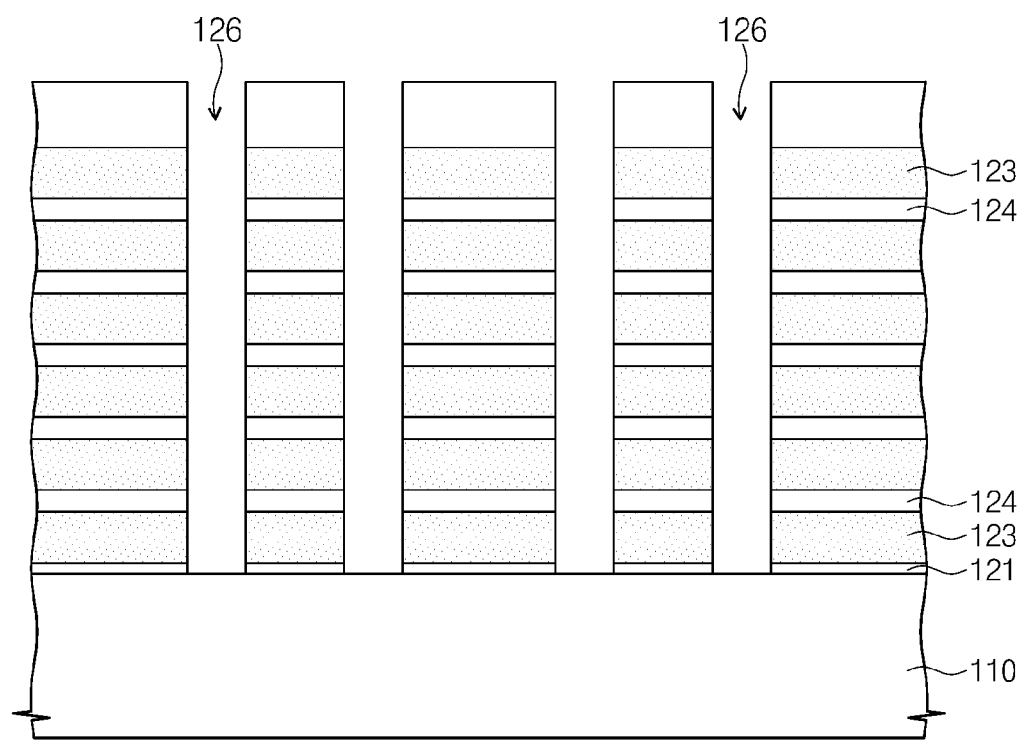
Figure 21A:
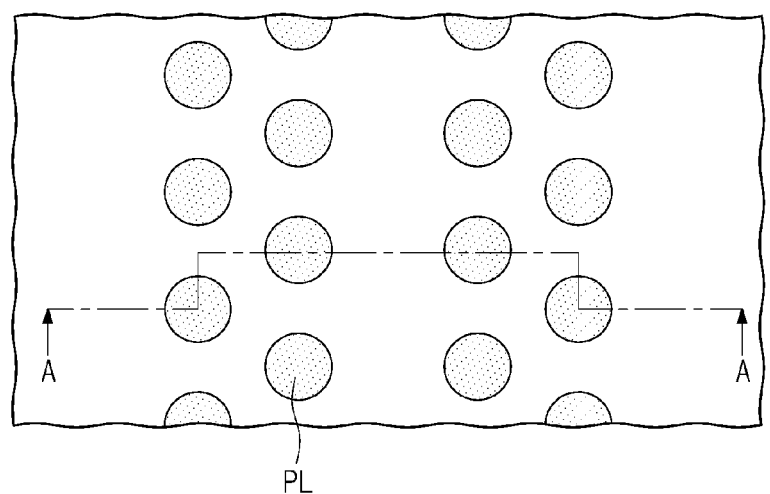
Figure 21B:
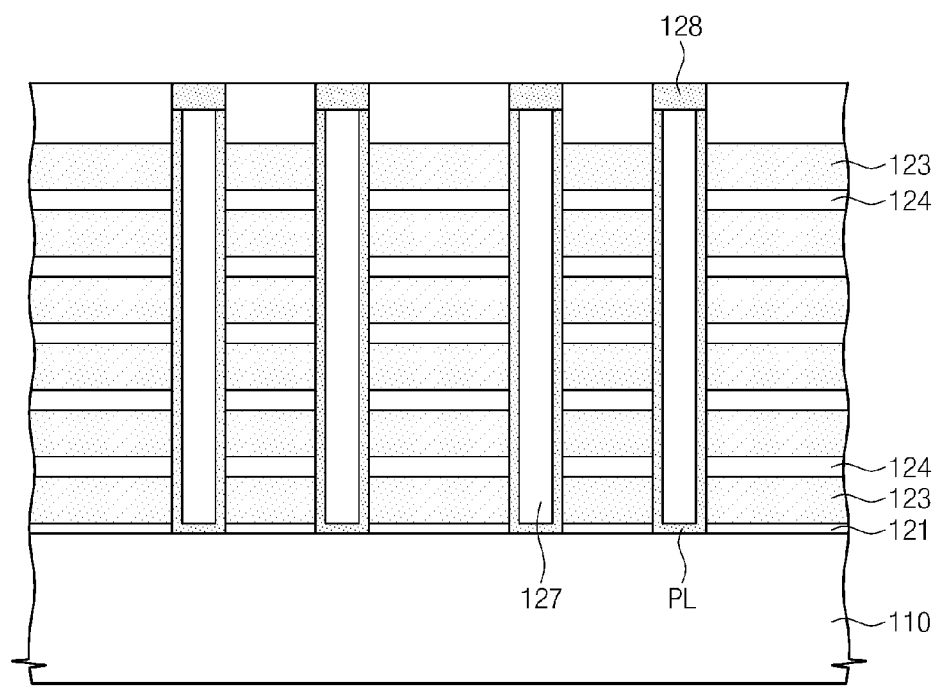

FIG. 17 is a perspective view illustrating a memory block of a semiconductor device according to other example embodiments of the inventive concept. FIG. 18A is a diagram exemplarily illustrating an arrangement of cell pillars provided in the memory block of FIG. 17, and FIG. 18B is a diagram exemplarily illustrating horizontal electrodes provided in the memory block of FIG. 17. FIG. 18C is a sectional view taken along a line A-A' of FIG. 18B. In order to reduce complexity in the drawings and to provide better understanding of example embodiments of the inventive concepts, the memory element 135 will not be shown in FIG. 18B.

The semiconductor device according to other example embodiments of the inventive concept will be described below. For the sake of brevity, the elements and features of this embodiment that are similar to those previously shown and described with reference to FIGS. 3 and 7A through 7C will not be described in much further detail.

Referring to FIGS. 17 and 18A through 18C, adjacent two of the groups (e.g., PLG1 and PLG2) may be configured to have a mirror-symmetric arrangement of the cell pillars with respect to each other. Alternatively, the adjacent two of the groups (e.g., PLG1 and PLG2) may include the cell pillars having substantially the same arrangement (for example, see FIG. 7A).

The upper interconnection lines may include the first upper interconnection line BL1 and the second upper interconnection line BL2. Each of the first and second cell pillars PL1 and PL2 of each group may be connected to the corresponding one of the upper interconnection lines. The first cell pillars PL1 of the first and second group PLG1 and PLG2 may be connected to the first upper interconnection lines BL1. The second cell pillars PL2 of the first and second group PLG1 and PLG2 may be connected to the corresponding one of the second upper interconnection lines BL2. The first and second upper interconnection lines BL1 and BL2 may be alternatingly arranged adjacent to each other.

Each of the gate structures G may be divided in the second direction by a trench 132. The trench 132 may extend along the first direction and expose the substrate 110 through the gate structures G. The trench 132 may be formed between the cell pillars PL at a center of each gate structure G. The trench 132 may be provided between the uppermost horizontal electrodes G6 and G7. The trench 132 may be filled with a second separation insulating layer 137. The second separation insulating layer 137 may have a width smaller than that of the first separation insulating layer 136.

The intervals ⓐ, ⓑ, and ⓒ between the cell pillars PL may be greater than an interval ⓓ between the second separation insulating layer 137 and one of the cell pillars nearest neighbor thereto. A size of the cavity S is smaller near the first separation insulating layer 136 than near the second separation insulating layer 137. The cavities S may be divided in the second direction by the second separation insulating layer 137.

A process of fabricating the semiconductor device of FIG. 17 will be described below. FIGS. 19A through 24A and 19B through 24B are plan and sectional views, respectively, illustrating a process of fabricating the semiconductor device shown in FIGS. 18B and 18C.

Referring to FIGS. 19A through 21A and 19B through 21B, the cell pillars PL may be formed through the buffer dielectric 121, the sacrificial layers 123, and the insulating layers 124 stacked on the substrate 110, using the method described with reference to FIGS. 8A through 10A and 8B through 10B. The cell pillars PL may be disposed to have the same arrangement as that of the cell pillars PL described with reference to FIG. 18A.

Figure 22A:
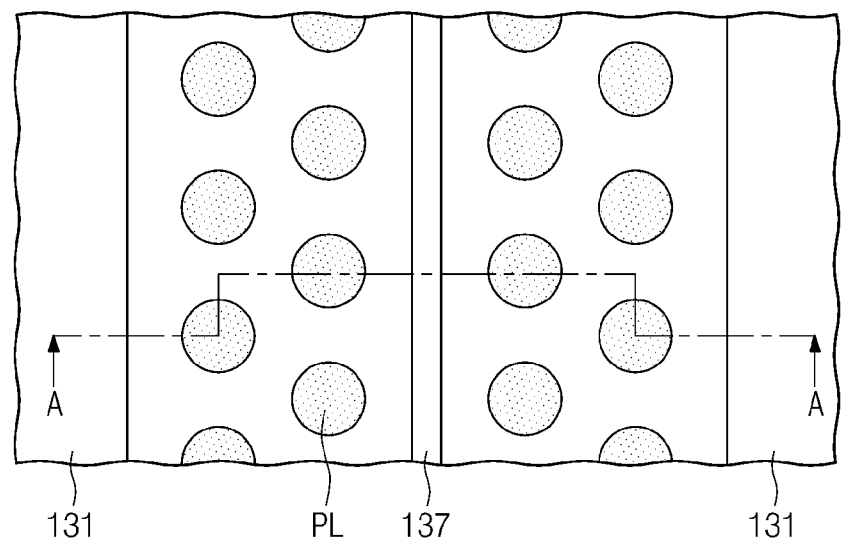
Figure 22B:
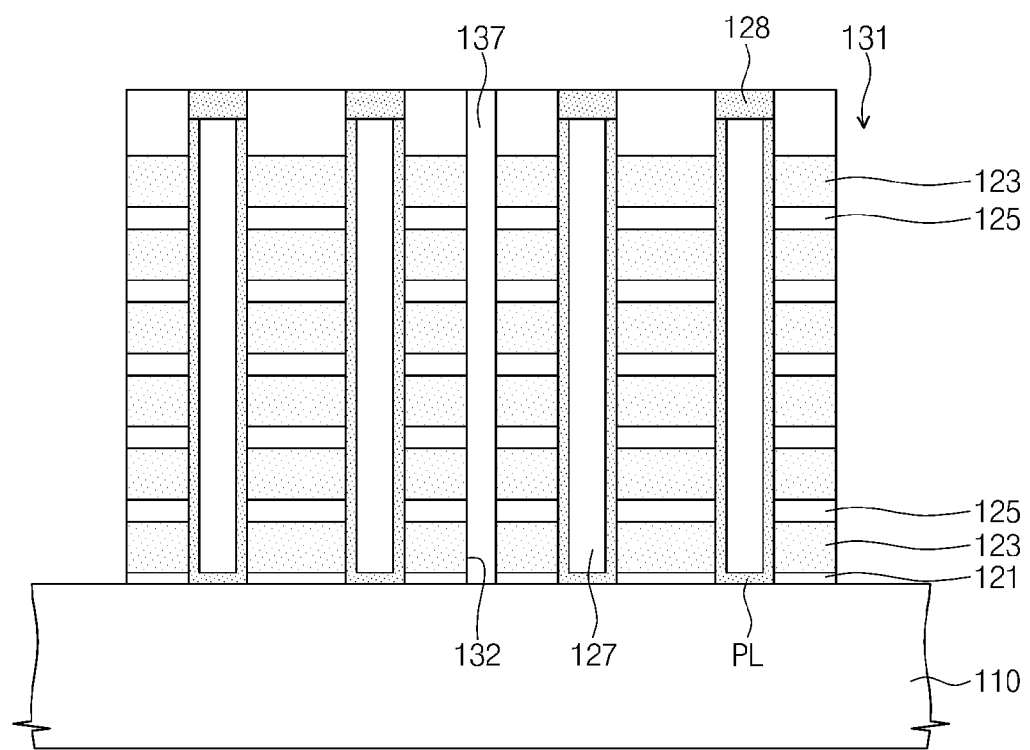

Referring to FIGS. 22A and 22B, the buffer dielectric 121, the sacrificial layers 123, and the insulating layers 124 may be patterned to form the trench 132 exposing the substrate 110 and extending along the first direction. The second separation insulating layer 137 may be formed to fill the trench 132. The second separation insulating layer 137 may be a silicon oxide layer. The separation region 131 may be formed. The trench 132 may be provided between the separation regions 131. The insulating patterns 125 may be formed as the result of the patterning of the insulating layers 124.

Figure 23A:
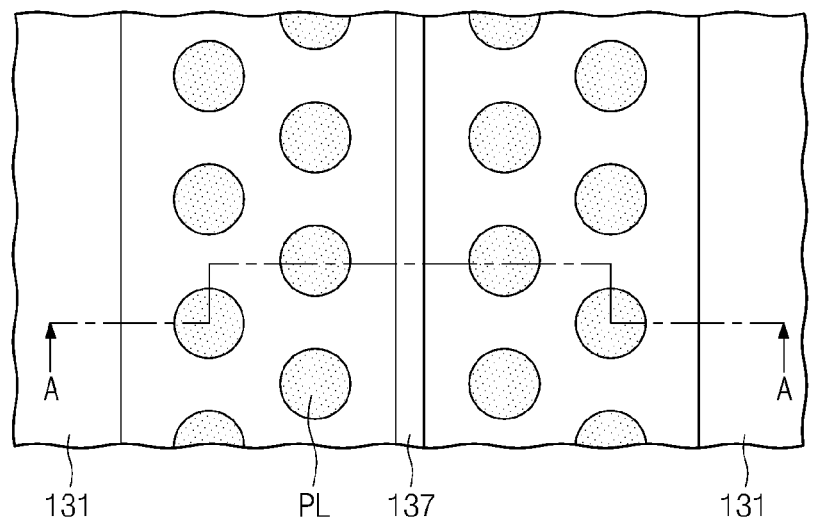
Figure 23B:
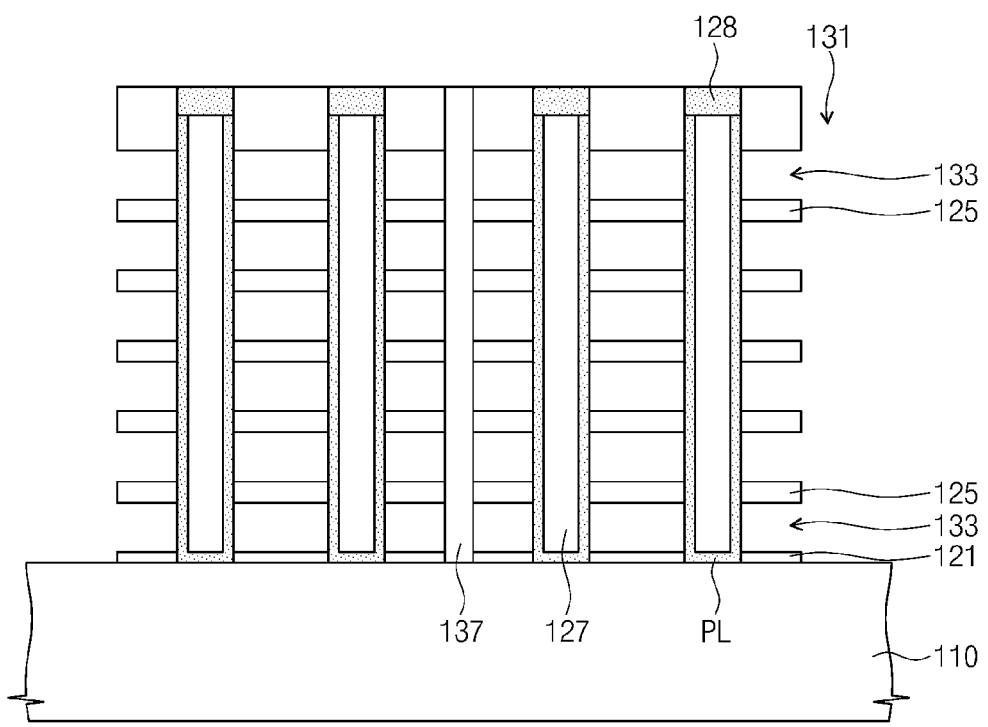

Referring to FIGS. 23A and 23B, the sacrificial layers 123 exposed by the separation regions 131 may be selectively removed to form the recess region 133, as described with reference to FIGS. 12A and 12B.

Figure 24A:
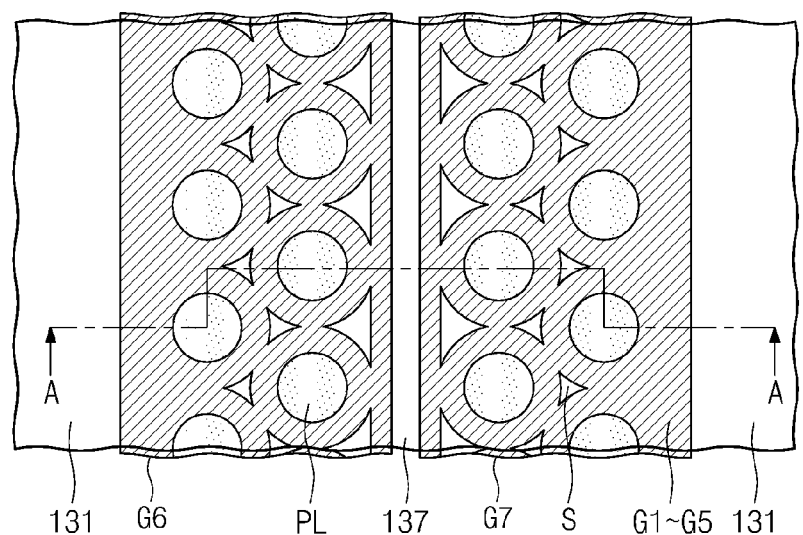
Figure 24B:
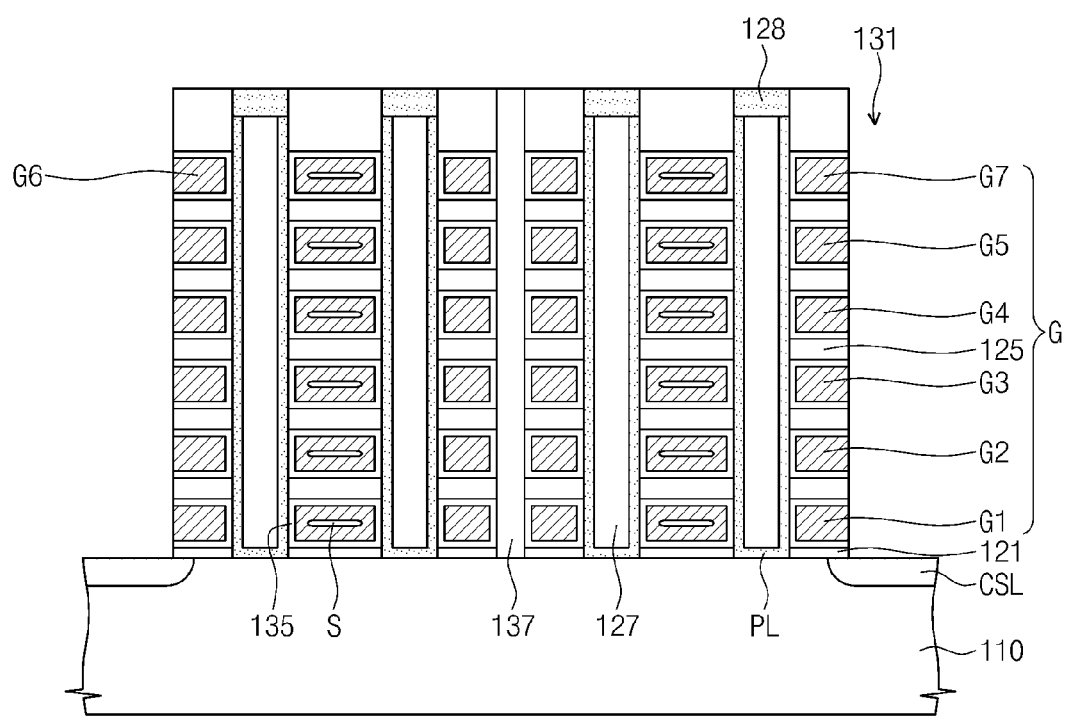

Referring to FIGS. 24A and 24B, the horizontal electrodes may be formed using the method described with reference to FIGS. 13A and 13B. The presence of the second separation insulating layer 137 may enables to reduce sizes of the cavities S, which may be formed in the horizontal electrodes during the replacement process, or to prevent the cavities S from being formed. For example, in the case where the second separation insulating layer 137 is formed at a position farthest from the separation regions 131, the cavities S may shrink or vanish between the cell pillars PL farthest away from the separation regions 131.

Even if, unlike those described with reference to FIG. 18A, the cell pillars PL are regularly arranged to have an uniform interval, the cavities S may shrink or vanish due to the presence of the second separation insulating layer 137. The cavities S may be divided in the second direction by the second separation insulating layer 137.

The exposed portions of the substrate 110 may be highly doped with impurities having the second conductivity type to form the common source lines CSL. Referring again to FIGS. 18B and 18C, the first separation insulating layer 136 may be formed to fill the separation regions 131. A row of the cell pillars PL arranged along the second direction may be connected in common to one of the upper interconnection lines BL1 and BL2.

Figure 25:
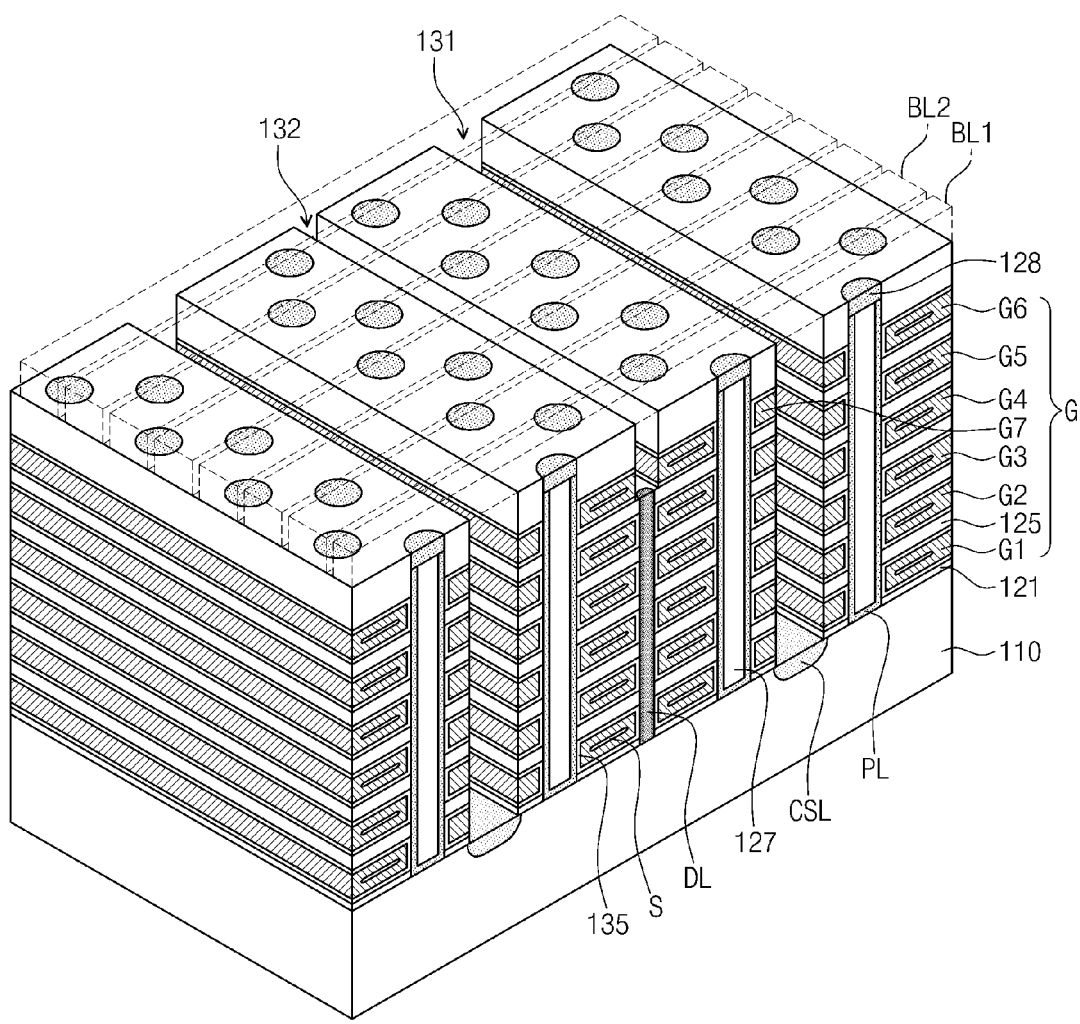
FIG. 25 is a perspective view illustrating a memory block of a semiconductor device according to still other example embodiments of the inventive concept.
Figure 26A:
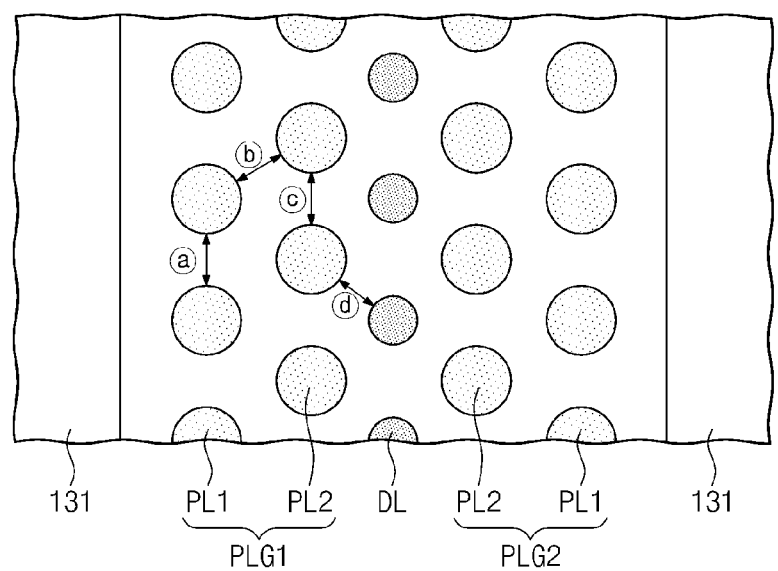
FIG. 26A is a diagram exemplarily illustrating an arrangement of cell pillars provided in the memory block of FIG. 25.
Figure 26B:
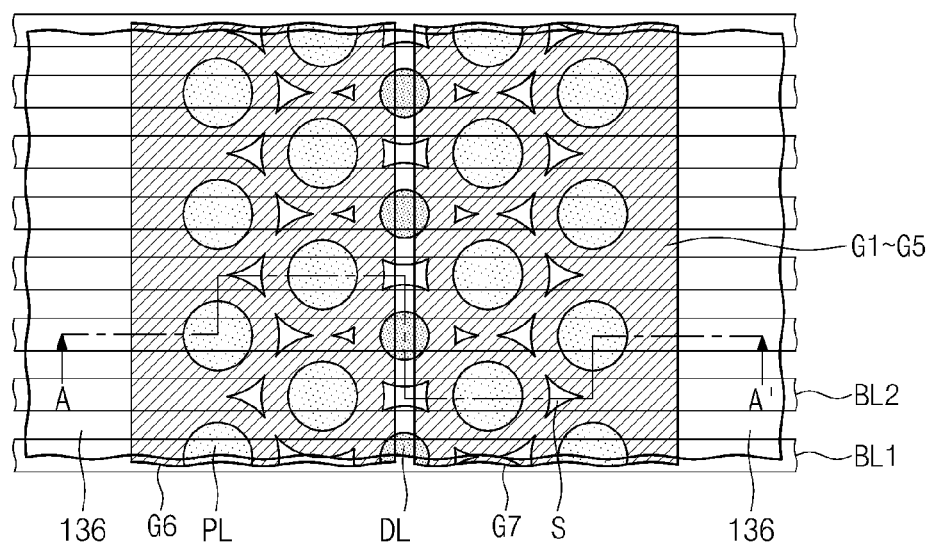
FIG. 26B is a diagram exemplarily illustrating horizontal electrodes provided in the memory block of FIG. 25.
Figure 26C:
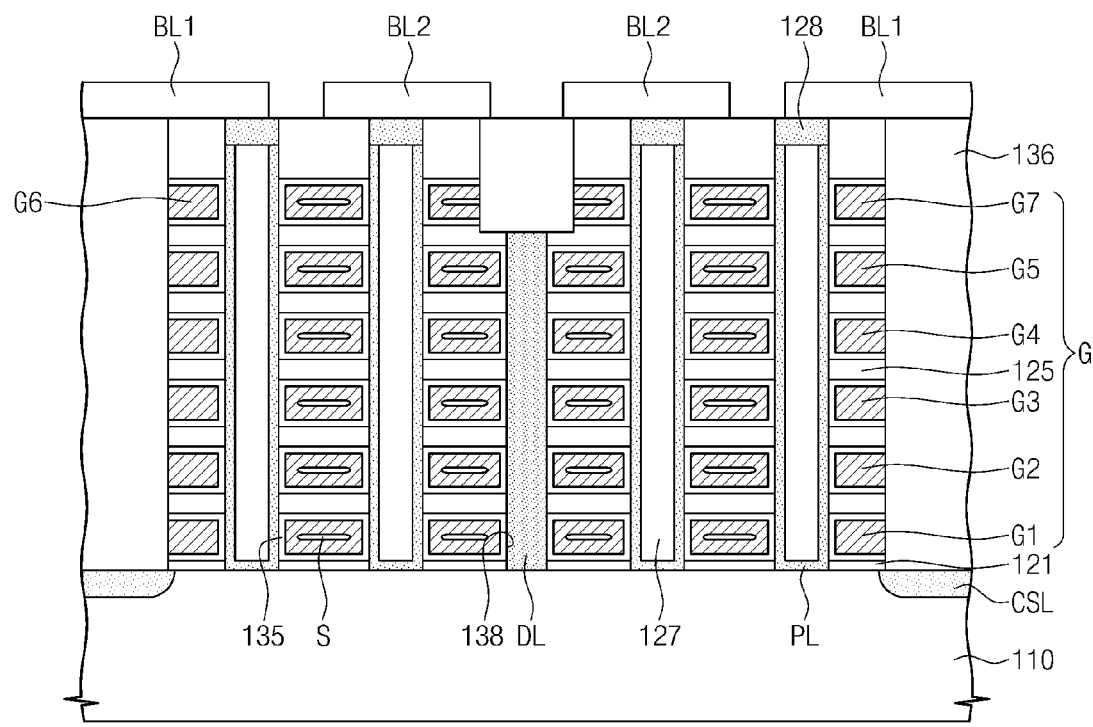
FIG. 26C is a sectional view taken along a line A-A' of FIG. 26B.
Figure 27A:
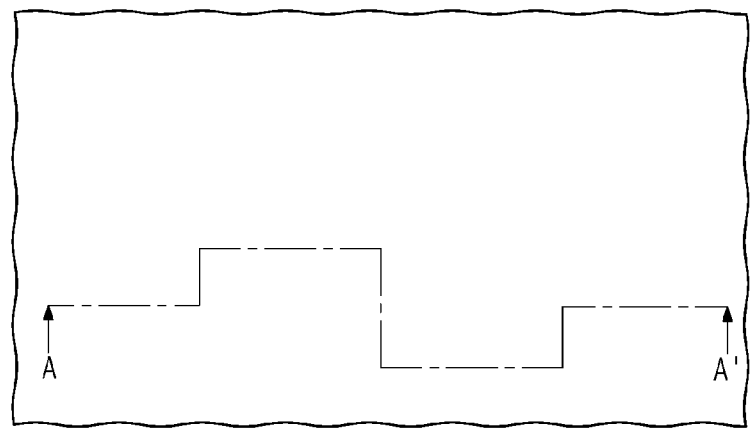
FIGS. 27A, 27B, 28A, 28B, 29A, 29B, 30A, 30B, 31A, 31B, 32A, and 32B are plan and sectional views illustrating a process of fabricating the semiconductor device shown in FIGS. 26B and 26C.
Figure 27B:
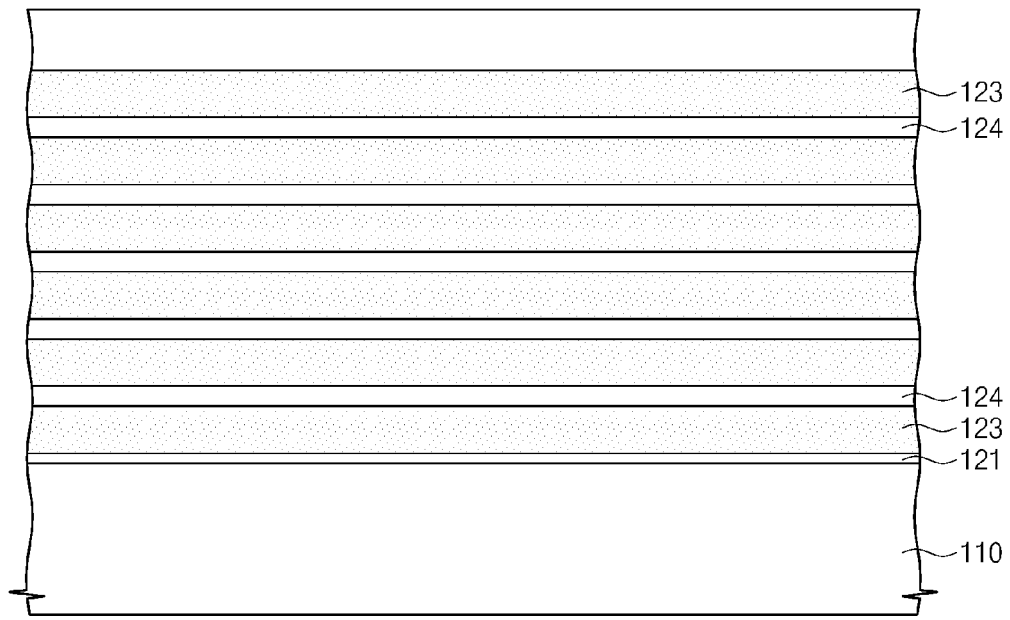
Figure 28A:
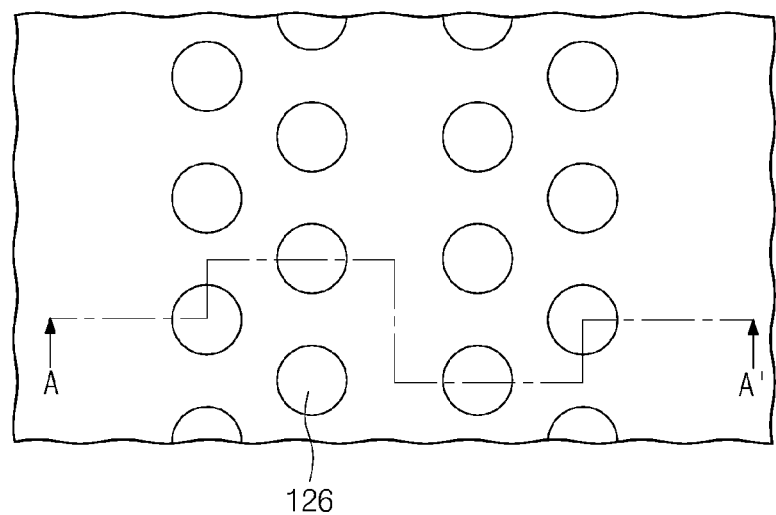
Figure 28B:
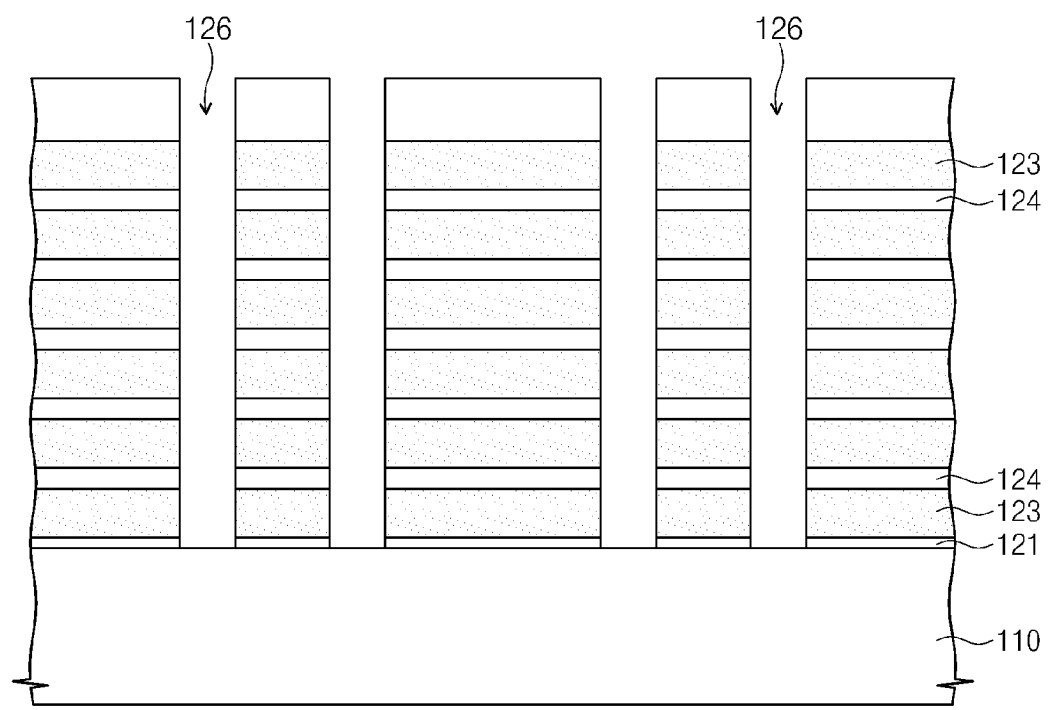
Figure 29A:
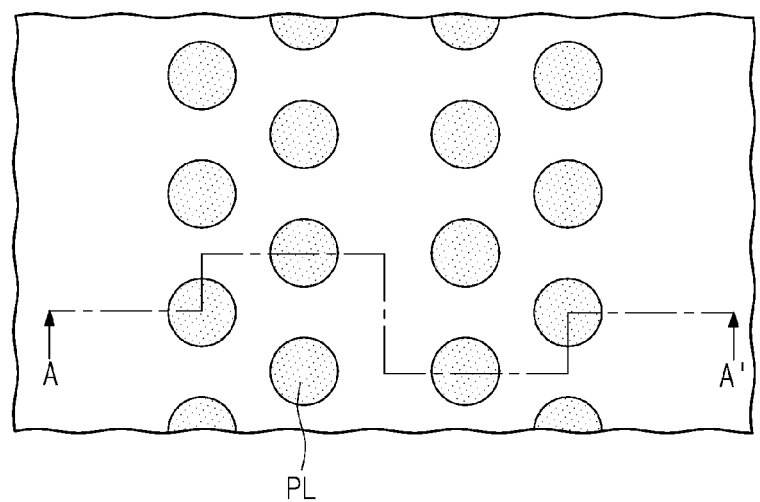
Figure 29B:
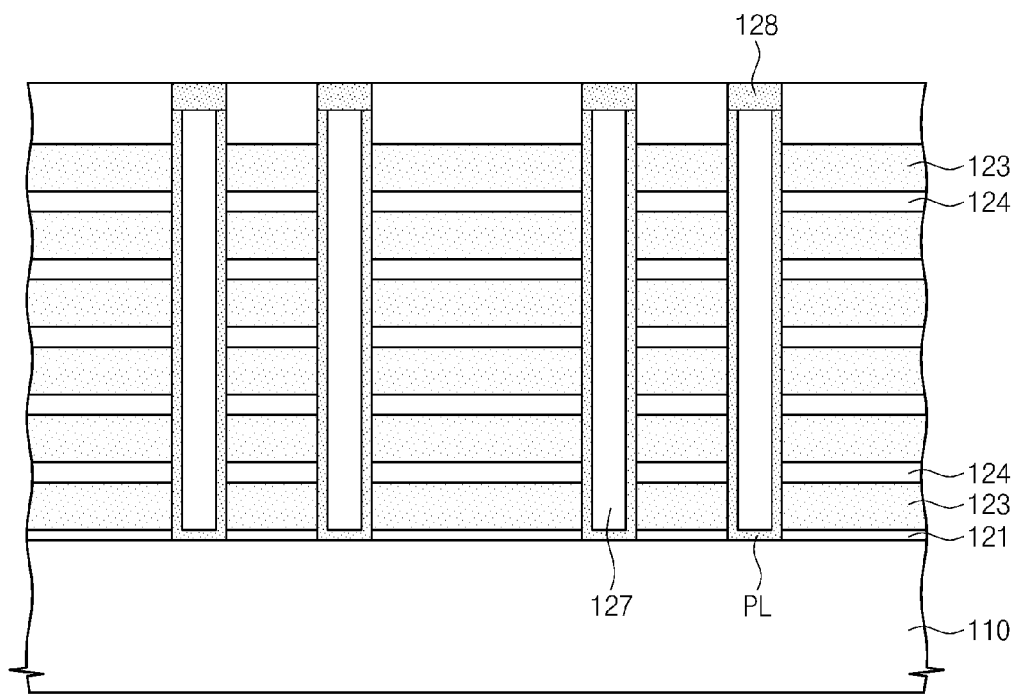

FIG. 25 is a perspective view illustrating a memory block of a semiconductor device according to still other example embodiments of the inventive concept. FIG. 26A is a diagram exemplarily illustrating an arrangement of cell pillars provided in the memory block of FIG. 25, and FIG. 26B is a diagram exemplarily illustrating horizontal electrodes provided in the memory block of FIG. 25. FIG. 26C is a sectional view taken along a line A-A' of FIG. 26B.

The semiconductor device according to still other example embodiments of the inventive concept will be described below. For the sake of brevity, the elements and features of this embodiment that are similar to those previously shown and described with reference to FIGS. 17 and 18A through 18C will not be described in much further detail.

Referring to FIGS. 25 and 26A through 26C, dummy holes 138 may be formed between the uppermost horizontal electrodes G6 and G7 to expose the substrate 110 through the gate structures G, and dummy pillars DL may be provided in the dummy holes 138, respectively. The dummy pillars DL may be arranged along the first direction.

The dummy pillars DL may be provided between the cell pillars PL to penetrate a central portion of the gate structures G in the second direction. The dummy pillars DL may include at least one insulating layer. The dummy pillars DL may have top surfaces lower than those of the cell pillars PL. In example embodiments, the dummy pillars DL may be arranged to have a zigzag configuration, in conjunction with the cell pillars PL adjacent thereto (for example, the second cell pillars PL2). Diameters of the dummy pillars DL may be different from those of the cell pillars PL. For example, diameters of the dummy pillars DL may be smaller than or the same as those of the cell pillars PL. The intervals ⓐ, ⓑ, and ⓒ between the cell pillars PL may be greater than an interval ⓓ between the dummy pillar DL and one of the cell pillars nearest neighbor thereto. A size of the cavity S adjacent to the first cell pillars PL1 may be smaller than that adjacent to the dummy pillars DL, and further, the cavity S may not be formed near the first cell pillars PL1. Due to the presence of the dummy pillars DL, the cavities S adjacent thereto may be divided in each or all of the first and second directions.

A method of fabricating the semiconductor device of FIG. 25 will be described below. FIGS. 27A through 32A and 27B through 32B are plan and sectional views, respectively, illustrating a process of fabricating the semiconductor device shown in FIGS. 26B and 26C.

Referring to FIGS. 27A through 29A and 27B through 29B, by using the method described with reference to FIGS. 8A through 10A and FIGS. 8B through 10B, the cell pillars PL may be formed to penetrate the buffer dielectric 121, the sacrificial layers 123, and the insulating layers 124 stacked on the substrate 110. In the present embodiments, the cell pillars PL may be disposed to have substantially the same arrangement as those of the previous embodiments described with reference to FIG. 26A.

Figure 30A:
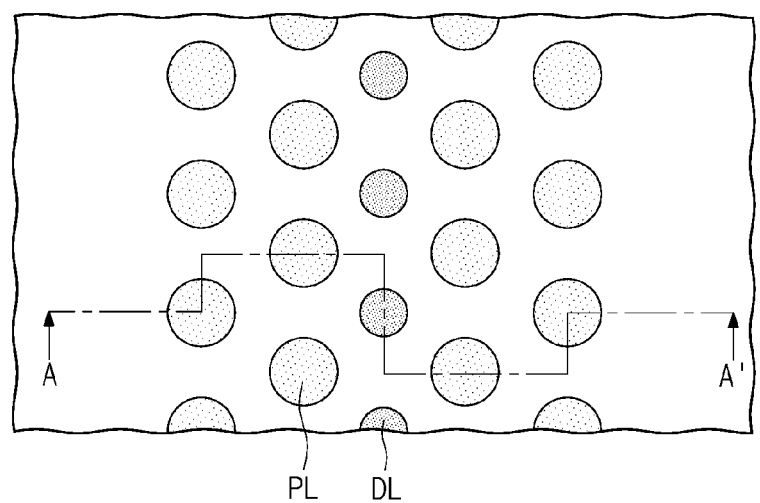
Figure 30B:
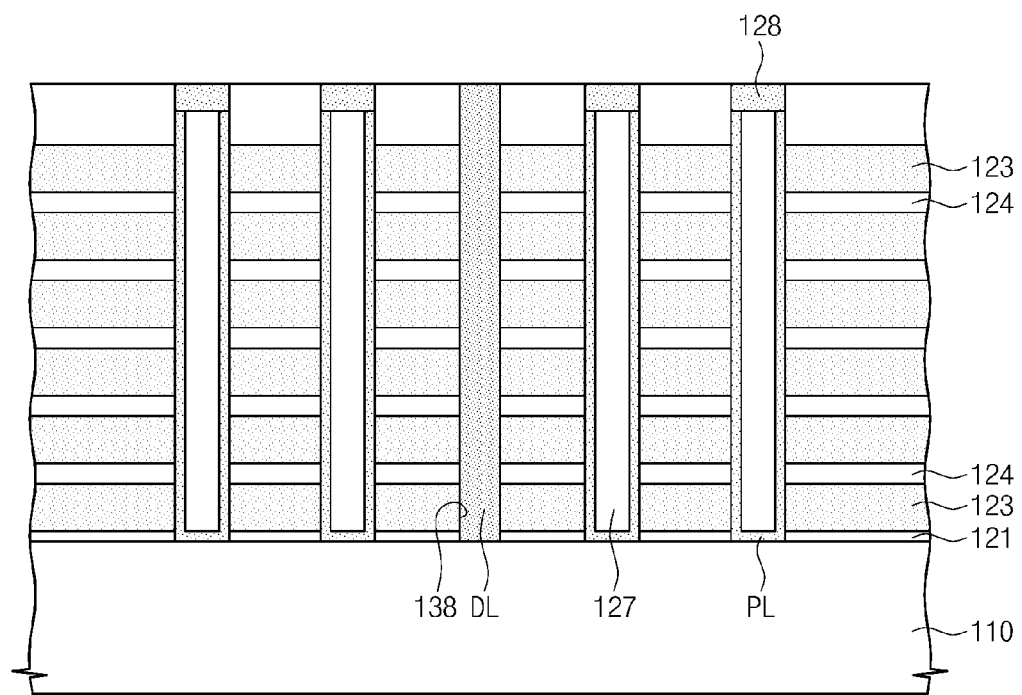
Figure 31A:
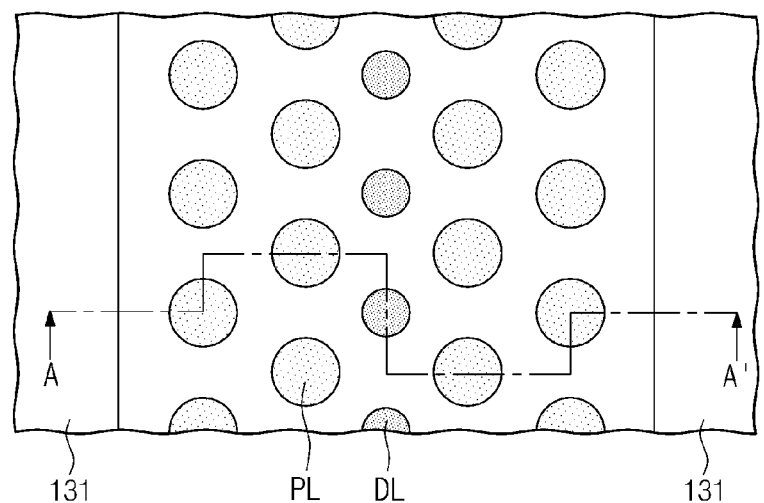
Figure 31B:
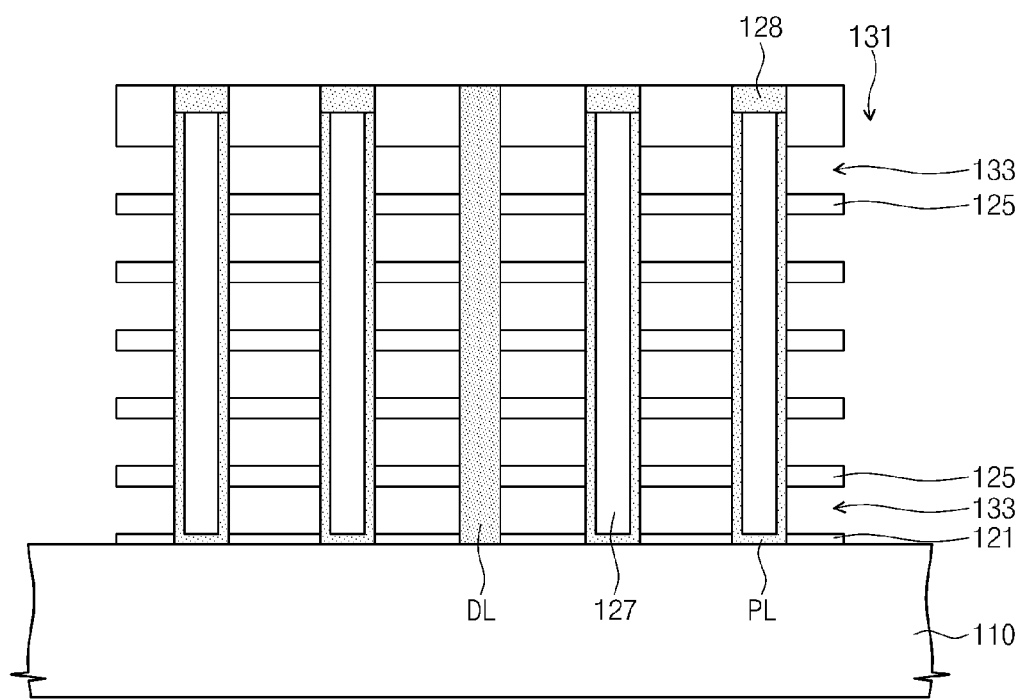
Figure 32A:
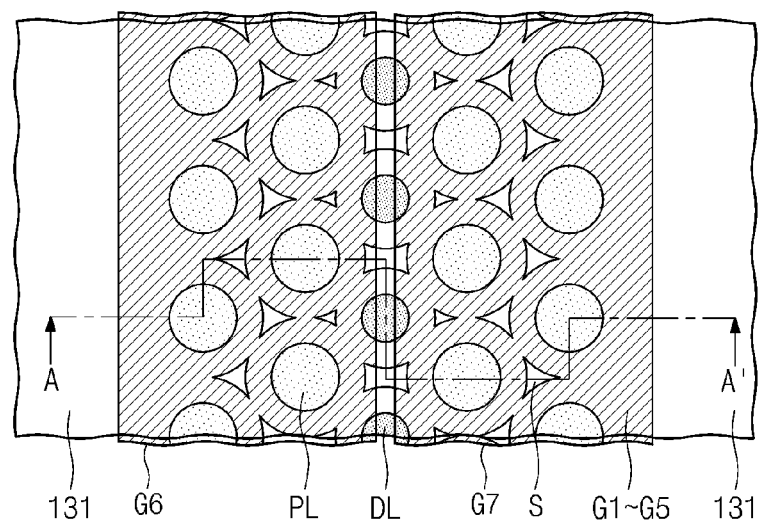
Figure 32B:
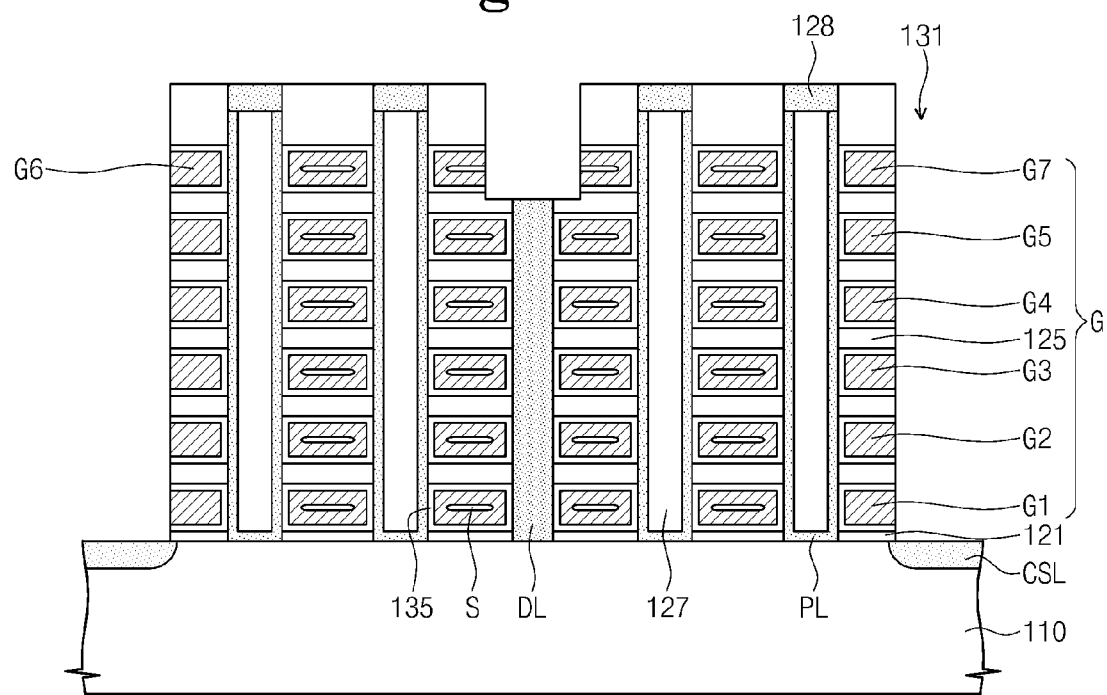

Referring to FIGS. 30A and 30B, dummy holes 138 may be formed to expose the substrate 110 through the gate structures G. The dummy holes 138 may be formed between the cell pillars PL to penetrate a central portion of the gate structures G in the second direction. The dummy holes 138 may be arranged along the first direction. The dummy holes 138 may be arranged to have a zigzag configuration, in conjunction with the cell pillars PL adjacent thereto (for example, the second cell pillars PL2). Diameters of the dummy holes 138 may be smaller than those of the cell pillars PL.

The dummy pillars DL may be formed in dummy holes 138, respectively. The dummy pillars DL may be formed of at least one insulating layer (for example, a silicon oxide layer).

Referring to FIGS. 31A, 31B, 32A, and 32B, the horizontal electrodes may be formed by, for example, the method described with reference to FIGS. 12A, 12B, 13A, and 13B. The dummy pillars DL may enable to reduce a size of the cavities S, which may be formed in the horizontal electrodes as the result of the replacement process, or prevent the cavities S from being formed. In particular, in the case where the dummy pillars DL are formed between the cell pillars PL farthest from the separation regions 131, it is possible to reduce more efficiently sizes of the cavities S thereabout or prevent the cavities S from being formed.

Even in the case where the cell pillars PL are regularly arranged, the presence of the dummy pillars DL may contribute to reduce sizes of the cavities S or prevent the cavities S from being formed.

The uppermost layer of each gate structure G may include the sixth horizontal electrode G6 and the seventh horizontal electrode G7 spaced apart from each other with the dummy pillars DL interposed therebetween. In example embodiments, the dummy pillars DL may be recessed.

Portions of the substrate 110 exposed by the separation regions 131 may be highly doped with impurities having the second conductivity type to form the common source lines CSL. Afterwards, as shown previously in FIGS. 26B and 26C, the first separation insulating layer 136 may be formed to fill the separation regions 131. A row of the cell pillars PL arranged along the second direction may be connected in common to one of the upper interconnection lines BL1 and BL2.

Figure 33:
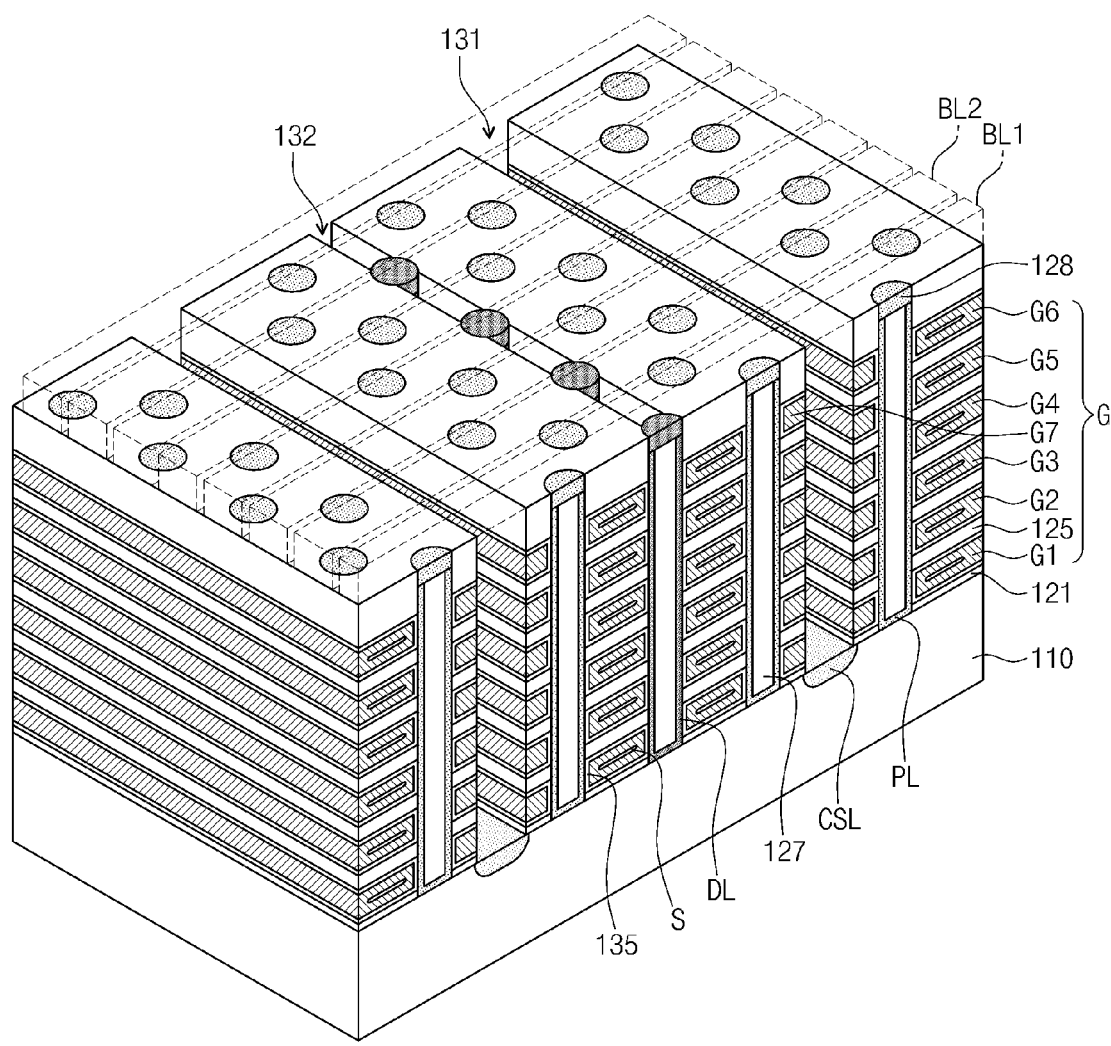
FIG. 33 is a perspective view illustrating a memory block of a semiconductor device according to even other example embodiments of the inventive concept.
Figure 34A:
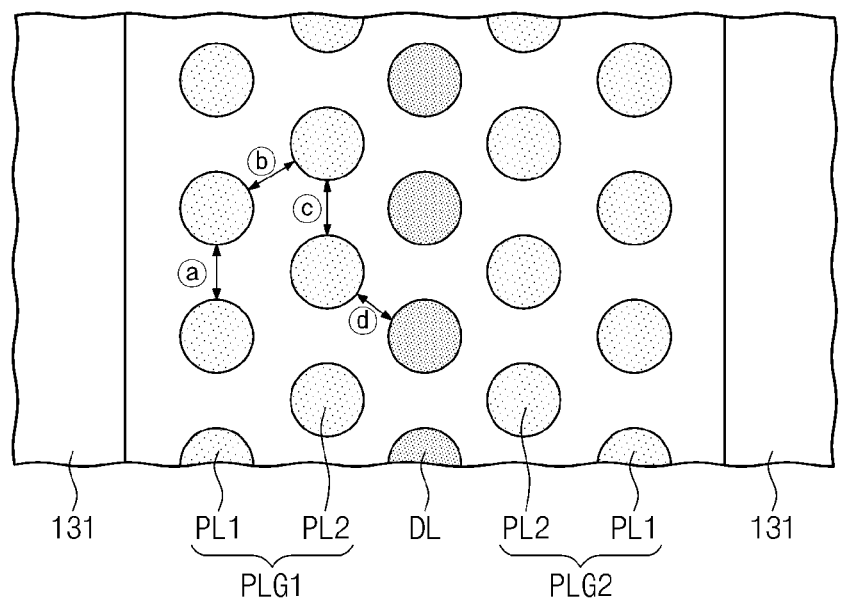
FIG. 34A is a diagram exemplarily illustrating an arrangement of cell pillars provided in the memory block of FIG. 33.
Figure 34B:
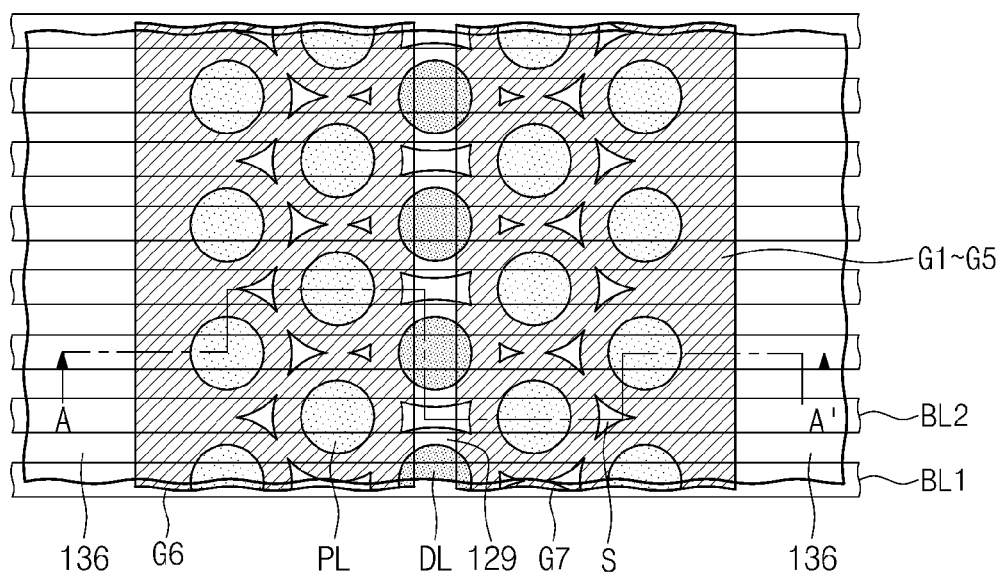
FIG. 34B is a diagram exemplarily illustrating horizontal electrodes provided in the memory block of FIG. 33.
Figure 34C:
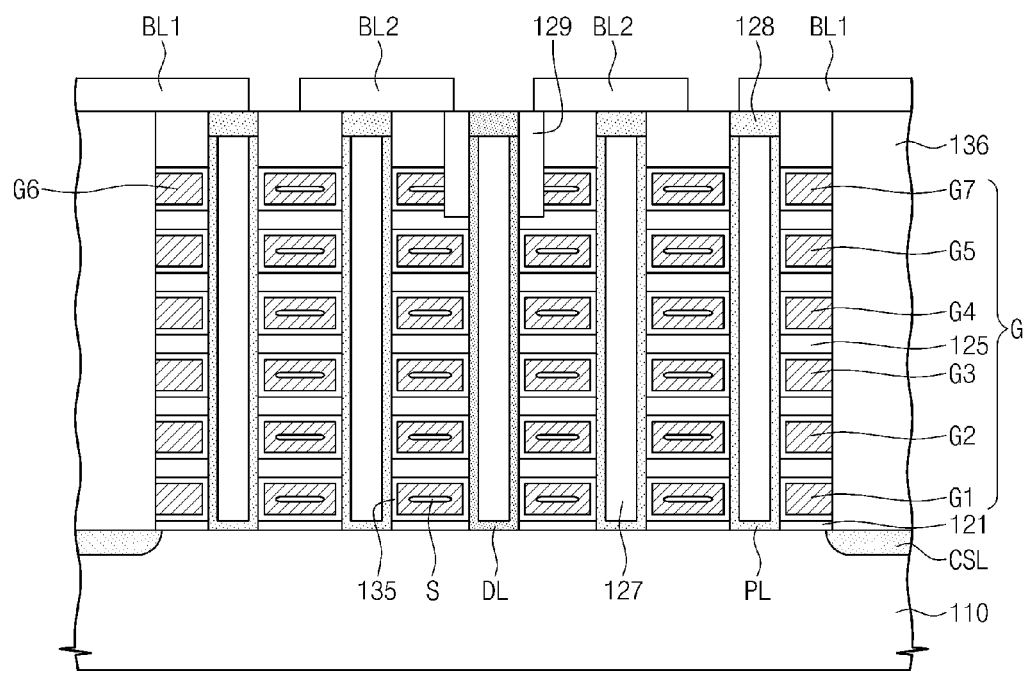
FIG. 34C is a sectional view taken along a line A-A' of FIG. 34B.

FIG. 33 is a perspective view illustrating a memory block of a semiconductor device according to even other example embodiments of the inventive concept. FIG. 34A is a diagram exemplarily illustrating an arrangement of cell pillars provided in the memory block of FIG. 33, and FIG. 34B is a diagram exemplarily illustrating horizontal electrodes provided in the memory block of FIG. 33. FIG. 34C is a sectional view taken along a line A-A' of FIG. 34B. In order to reduce complexity in the drawings and to provide better understanding of example embodiments of the inventive concepts, the memory element 135 will not be shown in FIG. 34B.

The semiconductor device according to still other example embodiments of the inventive concept will be described with reference to FIGS. 33 and 34A through 34C. For the sake of brevity, the elements and features of this embodiment that are similar to those previously shown and described with reference to FIGS. 17 and 18A through 18C will not be described in much further detail.

According to the present embodiments, the dummy pillars DL may have substantially the same structure as those of the cell pillars PL, unlike the previous embodiment described with reference to FIGS. 25 and 26A through 26C. Diameters of the dummy pillars DL may be different from those of the cell pillars PL. Diameters of the dummy pillars DL may be greater than those of the cell pillars PL. A dummy insulating pattern 129 may be further provided to connect upper portions of the dummy pillars DL with each other. The dummy insulating pattern 129 may extend along the first direction.

The intervals (a), (b), and (c) between the cell pillars PL may be greater than an interval (d) between the dummy pillar DL and one of the cell pillars nearest neighbor thereto. A size of the cavity S adjacent to the first cell pillars PL1 may be smaller than that adjacent to the dummy pillars DL, and further, the cavity S may not be formed near the first cell pillars PL1. Due to the presence of the dummy pillars DL, the cavities S adjacent thereto may be divided in each or all of the first and second directions.

A method of fabricating the semiconductor device of FIG. 33 will be described below. FIGS. 35A through 38A and 35B through 38B are plan and sectional views, respectively, illustrating a process of fabricating the semiconductor device shown in FIGS. 34B and 34C.

Figure 35A:
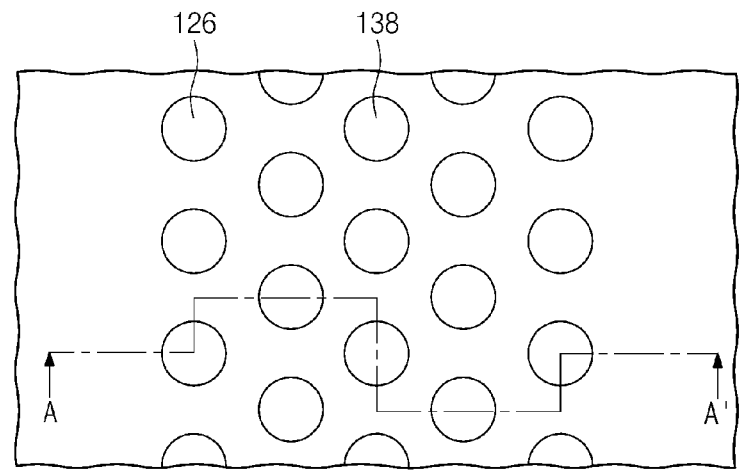
FIGS. 35A, 35B, 36A, 36B, 37A, 37B, 38A and 38B are plan and sectional views illustrating a process of fabricating the semiconductor device shown in FIGS. 34B and 34C.
Figure 35B:
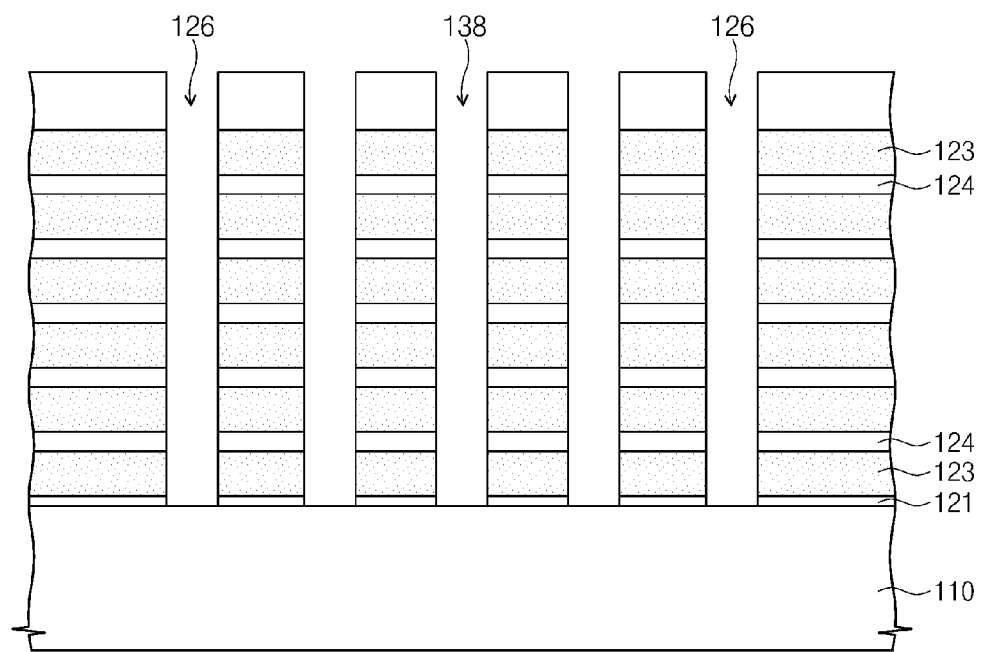

Referring to FIGS. 35A and 35B, holes may be formed to expose the substrate 110 through the buffer dielectric 121, the sacrificial layers 123, and the insulating layers 124 by, for example, the method described with reference to FIGS. 27A, 27B, 28A, and 28B. The holes may include the cell holes 126 and the dummy holes 138. The dummy holes 138 may be provided between the cell holes 126 to penetrate central portions of the gate structures G in the second direction. The dummy holes 138 may be arranged along the first direction. The dummy holes 138 may be formed to have a zigzag configuration, in conjunction with the cell holes 126 adjacent thereto. Diameters of the dummy holes 138 may be substantially greater than those of the cell holes 126. The cell holes 126 and the dummy holes 138 may be formed to have substantially the same arrangement as the cell pillars PL and the dummy pillars DL described with reference to FIG. 34A.

Figure 36A:
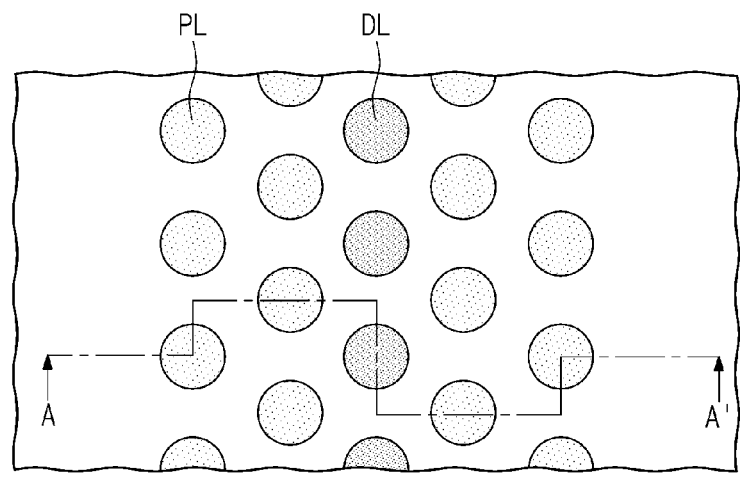
Figure 36B:
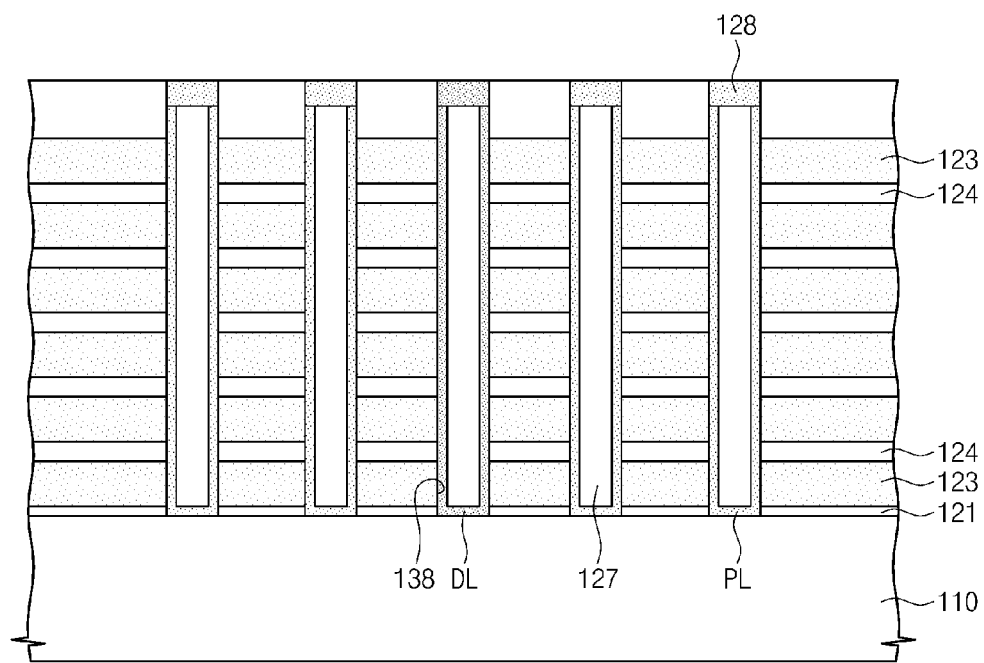

Referring to FIGS. 36A and 36B, the cell pillars PL and the dummy pillars DL may be formed in the cell holes 126 and the dummy holes 138, respectively. The cell holes 126 may be formed to have diameters different from, but substantially the same structure as, those of the dummy holes 138. Each or all of the cell and dummy pillars PL and DL may be formed of a semiconductor or conductive material, like as the afore-described embodiment.

Figure 37A:
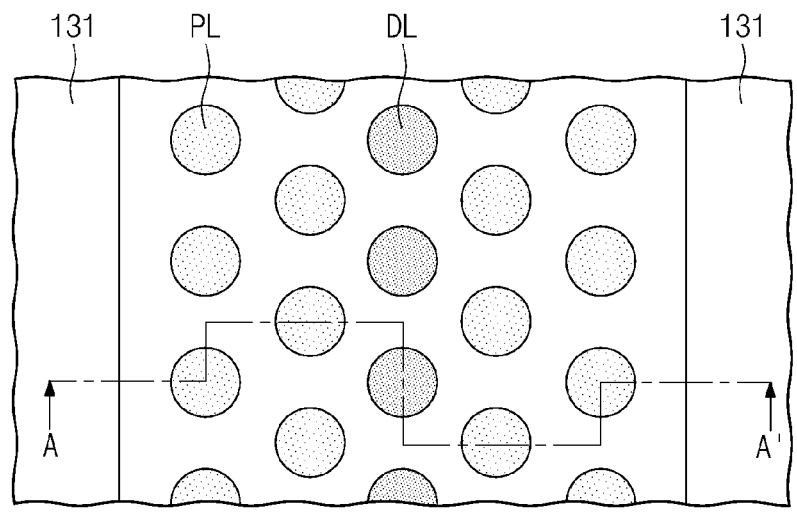
Figure 37B:
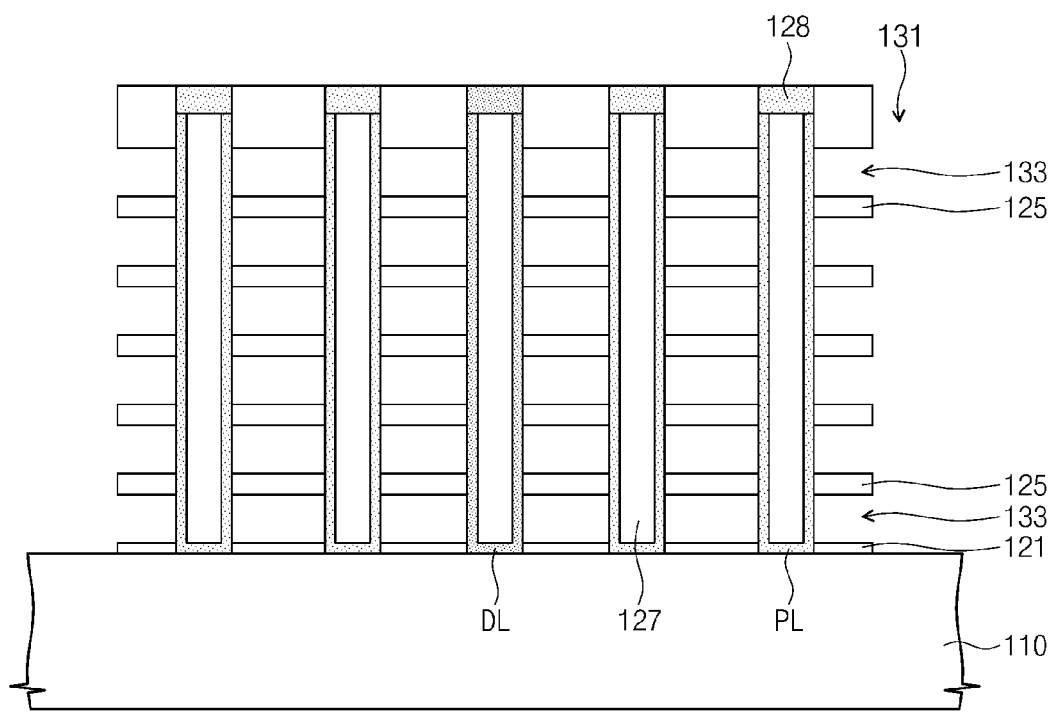

Referring to FIGS. 37A and 37B, the buffer dielectric 121, the sacrificial layers 123 and the insulating layers 124 may be sequentially patterned to form the separation regions 131, which may be spaced apart from each other to expose the substrate 110. The separation regions 131 may be formed parallel to the first direction. The insulating patterns 125 may be formed as the result of the patterning of the insulating layers 124.

The sacrificial layers 123 exposed by the separation regions 131 may be selectively removed to form recess regions 133. The recess regions 133 may correspond to regions previously occupied by the sacrificial layers 123, and each of them may be delimited by the cell pillars PL, the dummy pillar DL and the insulating patterns 125. In the case where the sacrificial layers 123 include a silicon nitride layer or a silicon oxynitride layer, the removal of the sacrificial layers 123 may be performed using an etch solution containing phosphoric acid. A sidewall of each the cell pillars PL and the dummy pillars DL may be partially exposed by the recess regions 133.

Figure 38A:
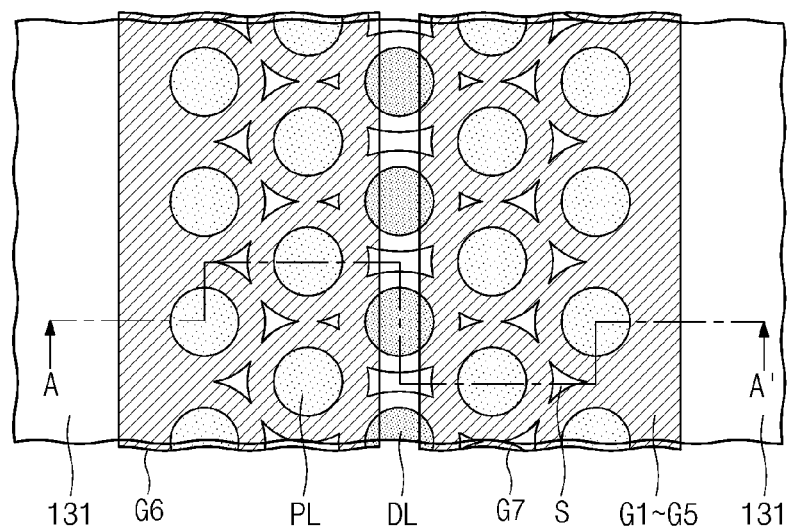
Figure 38B:
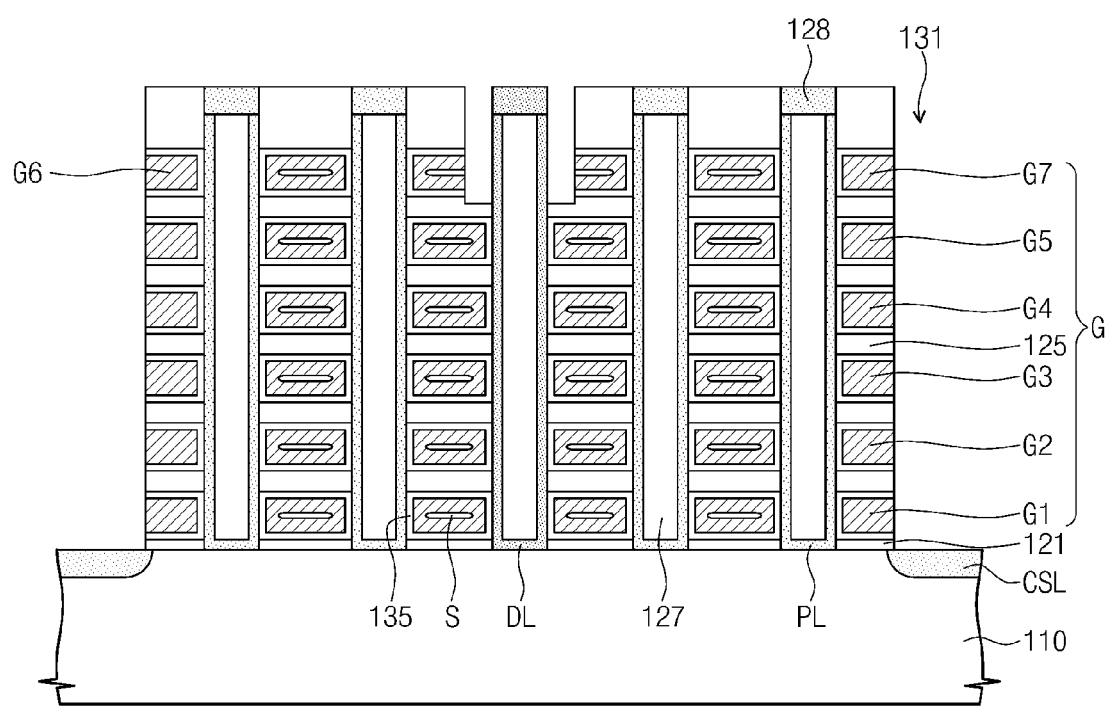

Referring to FIGS. 38A and 38B, the memory elements 135 and the horizontal electrodes may be formed in the recess regions 133 by, for example, the method described with reference to FIGS. 13A and 13B. The dummy pillars DL may enable to reduce a size of the cavities S, which may be formed in the horizontal electrodes as the result of the replacement process, or prevent the cavities S from being formed. In particular, in the case where the dummy pillars DL are formed between the cell pillars PL farthest from the separation regions 131, it is possible to reduce more efficiently sizes of the cavities S thereabout or prevent the cavities S from being formed.

Even in the case where the cell pillars PL are regularly arranged, the presence of the dummy pillars DL may contribute to reduce sizes of the cavities S or prevent the cavities S from being formed.

The uppermost layer of each gate structure G may include the sixth horizontal electrode G6 and the seventh horizontal electrode G7 spaced apart from each other with the dummy pillars DL interposed therebetween.

Portions of the substrate 110 exposed by the separation regions 131 may be highly doped with impurities having the second conductivity type to form the common source lines CSL.

Afterwards, as shown previously in FIGS. 34B and 34C, the first separation insulating layer 136 may be formed to fill the separation regions 131. A row of the cell pillars PL arranged along the second direction may be connected in common to one of the upper interconnection lines BL1 and BL2. The dummy insulating pattern 129 may be further provided between the sixth and seventh horizontal electrodes G6 and G7. The dummy insulating pattern 129 may connect upper portions of the dummy pillars DL with each other along the first direction.

FIGS. 39 through 44 are diagrams showing examples of cell pillars, which are provided to have different arrangements from those (for example, shown in FIG. 26A or 34A) of FIGS. 25 and 33. Each of outline arrows in FIGS. 39 through 44 is provided to represent a direction, to which each cell pillar is shifted.

Figure 39:
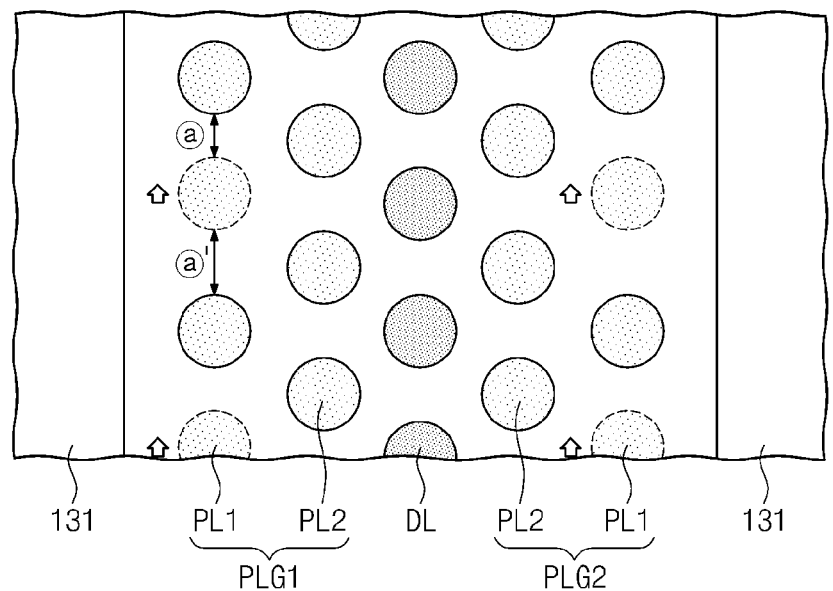
FIGS. 39 through 44 are diagrams showing examples of cell pillars, which are provided to have different arrangements from those of FIGS. 25 and 33.

Referring to FIG. 39, at least one of the first cell pillars PL1 may be shifted parallel to the first direction. Such shifts of the first cell pillars PL1 may be periodically repeated. For example, 2n-th ones of the first cell pillars PL1 may be shifted parallel to the first direction, as shown in FIG. 39. However, example embodiments of the inventive concept may not be limited thereto. For example, 3n-th or 4n-th ones of the first cell pillars PL1 may be shifted parallel to the first direction. In addition, the shifts of the first cell pillars PL1 may not be periodically repeated.

Intervals between adjacent ones of the first cell pillars PL1 may be described in terms of a first interval ⓐ, and a second interval ⓐ' greater than the first interval ⓐ. Due to the presence of widened regions having the second interval ⓐ', a source gas for forming the conductive layer can be more easily supplied into the recess region. For example, the source gas may be flowed into an inner or central region of the recess region through the widened regions, e.g., channels. Accordingly, it is possible to more effectively suppress the cavities S, which may be formed in the horizontal electrodes during the replacement process, from having an increased size.

Figure 40:
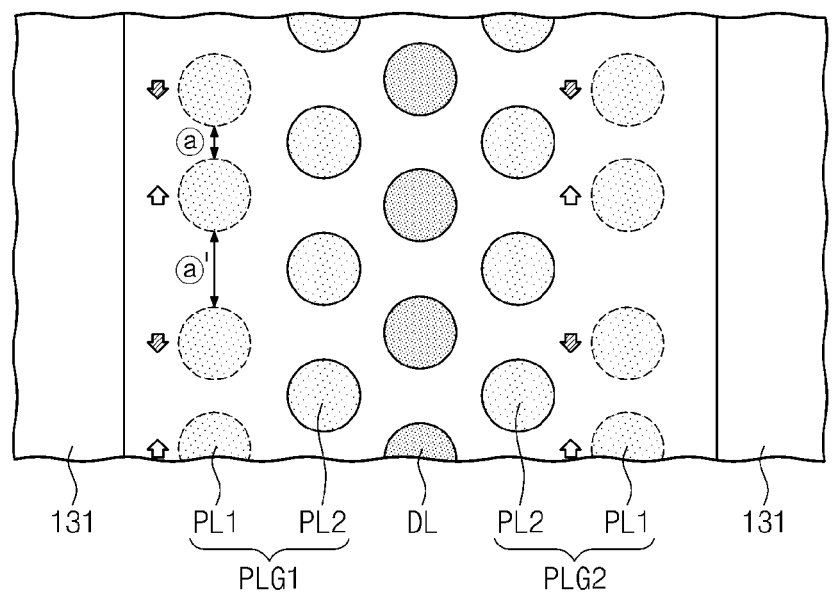

Referring to FIG. 40, at least one of the first cell pillars PL1 may be shifted parallel in the first direction, and at least one other of the first cell pillars PL1 adjacent thereto may be shifted antiparallel to the first direction. Such shifts of the first cell pillars PL1 may be periodically repeated. For example, 2n-th ones of the first cell pillars PL1 may be shifted parallel to the first direction, and (2n+1)-th ones of the first cell pillars PL1 may be shifted antiparallel to the first direction, as shown in FIG. 40. However, example embodiments of the inventive concept may not be limited thereto. For example, 3n-th or 4n-th ones of the first cell pillars PL1 may be shifted parallel to the first direction, and (3n+1)-th or (4n+1)-th ones of the first cell pillars PL1 may be shifted antiparallel to the first direction. In addition, the shifts of the first cell pillars PL1 may not be periodically repeated.

Intervals between adjacent ones of the first cell pillars PL1 may be described in terms of a first interval ⓐ, and a second interval ⓐ' greater than the first interval ⓐ. Due to the presence of widened regions having the second interval ⓐ', a source gas for forming the conductive layer can be more easily supplied into the recess region. Accordingly, it is possible to more effectively suppress the cavities S, which may be formed in the horizontal electrodes during the replacement process, from having an increased size.

Figure 41:
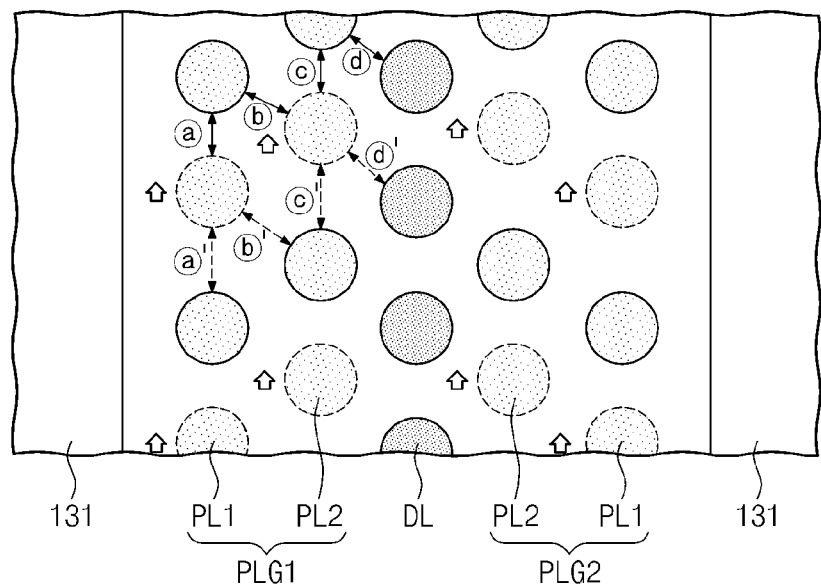

Referring to FIG. 41, the first cell pillars PL1 may be provided to have substantially the same arrangement as that of FIG. 39, and at least one of the second cell pillars PL2 may also be shifted parallel to the first direction.

As the result of the shifted arrangement, intervals of the first and second cell pillars PL1 and PL2 may be described in terms of first intervals ⓐ, ⓑ, ⓒ, and ⓓ and second intervals ⓐ', ⓑ', ⓒ', and ⓓ' greater than the first intervals ⓐ, ⓑ, ⓒ, and ⓓ. Due to the presence of widened regions having the second intervals ⓐ', ⓑ', ⓒ', and ⓓ', a source gas for forming the conductive layer can be more easily supplied into the recess region, and thus, it is possible to more effectively suppress the cavities S, which may be formed in the horizontal electrodes during the replacement process, from having an increased size.

Figure 42:
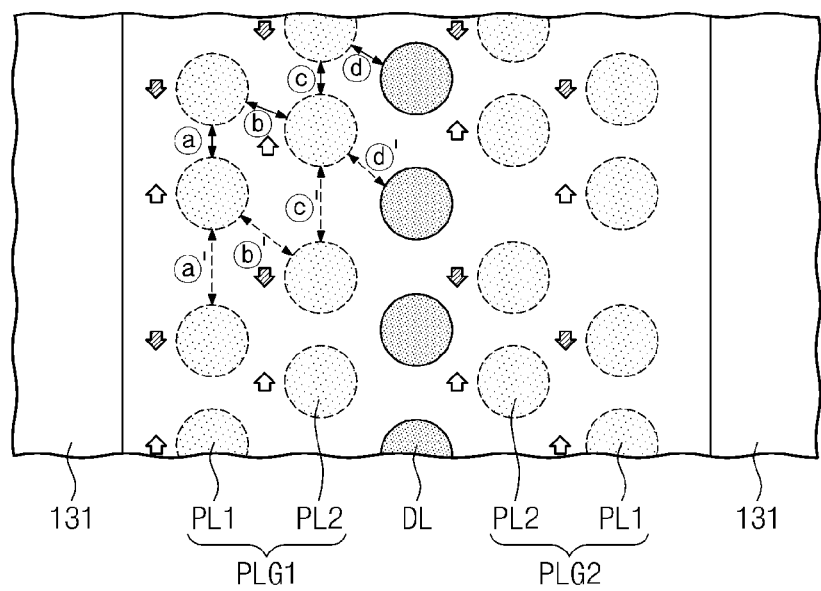

Referring to FIG. 42, others of the first cell pillars PL1, which are provided adjacent to the shifted ones of the first cell pillars PL1 in the example of FIG. 41, may be shifted antiparallel to the first direction. Others of the second cell pillar PL2, which are provided adjacent to the shifted ones of the second cell pillar PL2 in the example of FIG. 41, may be shifted antiparallel to the first direction.

As the result of the shifted arrangement, intervals of the first and second cell pillars PL1 and PL2 may be described in terms of first intervals ⓐ, ⓑ, ⓒ, and ⓓ and second intervals ⓐ', ⓑ', ⓒ', and ⓓ' greater than the first intervals ⓐ, ⓑ, ⓒ, and ⓓ. Here, the second intervals ⓐ', ⓑ', ⓒ', and ⓓ' of FIG. 42 may be wider than those of FIG. 40. For example, there may be ⓐ'>ⓐ, ⓑ'>ⓑ, ⓒ'>ⓒ, ⓓ'>ⓓ. Due to the presence of widened regions having the second intervals ⓐ', ⓑ', ⓒ', and ⓓ', a source gas for forming the conductive layer can be more easily supplied into the recess region, and thus, it is possible to more effectively suppress the cavities S, which may be formed in the horizontal electrodes during the replacement process, from having an increased size.

Figure 43:
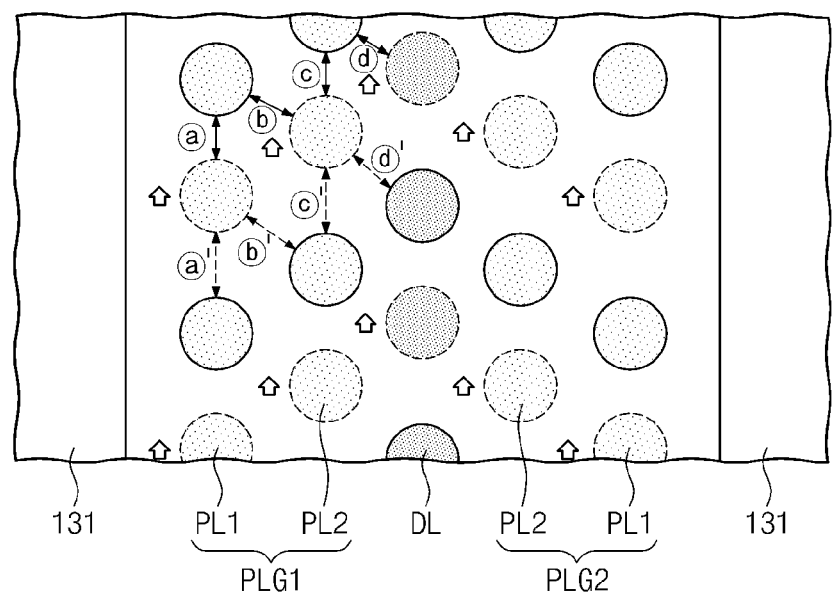

Referring to FIG. 43, at least one of the dummy pillars DL, which are provided adjacent to the shifted ones of the second cell pillar PL2 in the example of FIG. 41, may be shifted parallel or antiparallel to the first direction.

As the result of the shifted arrangement, intervals of the first cell pillars PL1, the second cell pillars PL2 and the dummy pillars DL may be described in terms of first intervals ⓐ, ⓑ, ⓒ, and ⓓ and second intervals ⓐ', ⓑ', ⓒ', and ⓓ' greater than the first intervals ⓐ, ⓑ, ⓒ, and ⓓ. Due to the presence of widened regions having the second intervals ⓐ', ⓑ', ⓒ', and ⓓ', a source gas for forming the conductive layer can be more easily supplied into the recess region, and thus, it is possible to more effectively suppress the cavities S, which may be formed in the horizontal electrodes during the replacement process, from having an increased size.

Figure 44:
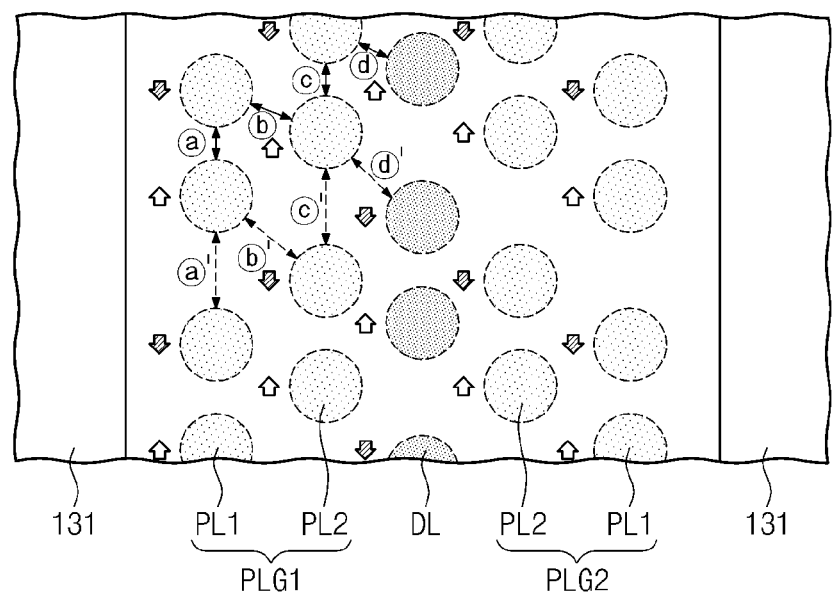

Referring to FIG. 44, others of the dummy pillars DL, which are provided adjacent to the shifted ones of the dummy pillars DL in the example of FIG. 43, may be shifted antiparallel to the shift direction of the shifted ones of the dummy pillars DL.

As the result of the shifted arrangement, intervals of the first cell pillars PL1, the second cell pillars PL2 and the dummy pillars DL may be described in terms of first intervals ⓐ, ⓑ, ⓒ, and ⓓ and second intervals ⓐ', ⓑ', ⓒ', and ⓓ' greater than the first intervals ⓐ, ⓑ, ⓒ, and ⓓ. Due to the presence of widened regions having the second intervals ⓐ', ⓑ', ⓒ', and ⓓ', a source gas for forming the conductive layer can be more easily supplied into the recess region, and thus, it is possible to more effectively suppress the cavities S, which may be formed in the horizontal electrodes during the replacement process, from having an increased size.

Figure 45:
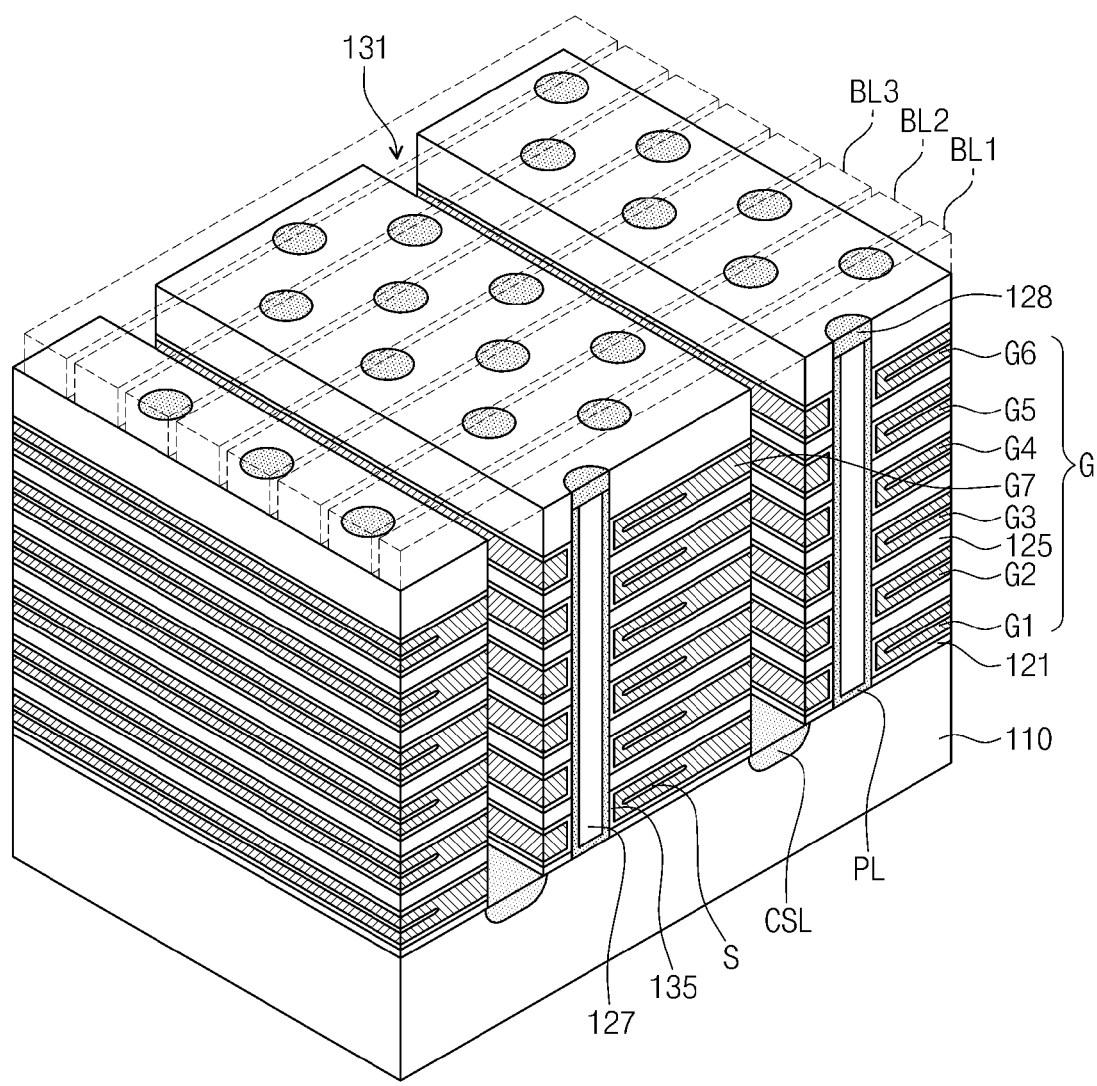
FIG. 45 is a perspective view exemplarily illustrating a memory block of a semiconductor device according to yet other example embodiments of the inventive concept.
Figure 46:
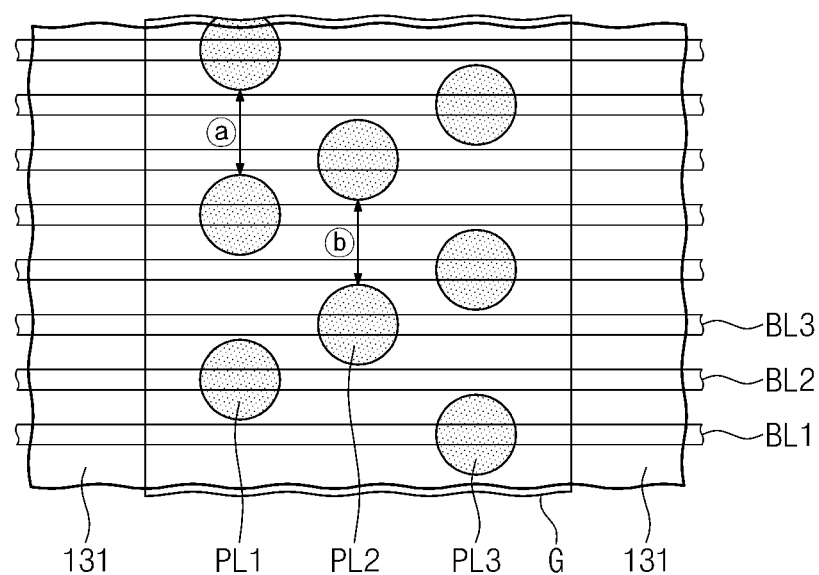
FIG. 46 is a diagram exemplarily illustrating an arrangement of cell pillars provided in the memory block of FIG. 45.

FIG. 45 is a perspective view exemplarily illustrating a memory block of a semiconductor device according to yet other example embodiments of the inventive concept. FIG. 46 is a diagram exemplarily illustrating an arrangement of cell pillars provided in the memory block of FIG. 45. The semiconductor device according to still other example embodiments of the inventive concept will be described below. For the sake of brevity, the elements and features of this embodiment that are similar to those previously shown and described with reference to FIGS. 3 and 6A through 6C will not be described in much further detail.

Referring to FIGS. 45 and 46, a semiconductor device according to still other example embodiments of the inventive concept may include the upper interconnection lines, the horizontal electrodes G1-G6, and the common source lines CSL. The upper interconnection lines may include a first upper interconnection line BL1, a second upper interconnection line BL2, and a third upper interconnection line BL3, which are provided spaced apart from each other to extend along the second direction. In the present embodiment, one horizontal electrode (e.g., sixth horizontal electrode G6) may be provided as the uppermost layer of each gate structure G.

A plurality of the cell pillars PL may be arranged in such a way that they are immediately adjacently offset from each other along the first direction. The cell pillars PL may be arranged to form a plurality of columns (e.g., first to third columns) parallel to the first direction. For example, the first to third columns may be sequentially provided and be spaced apart from each other, and the cell pillars PL may include first cell pillars PL1 constituting the first column, second cell pillars PL2 constituting the second column, and third cell pillars PL3 constituting the third column. The first cell pillars PL1 and the third cell pillars PL3 may be ones of the cell pillars PL provided most adjacent to the separation regions 131, and the second cell pillars PL2 may be the others of the cell pillars PL provided farthest from the separation regions 131. The second cell pillars PL2 may be shifted with respect to the first cell pillars PL1 along the first direction. The third cell pillars PL3 may be shifted with respect to the second cell pillars PL2 along the first direction. As shown, the cell pillars PL may be arranged along three columns (e.g., the first to third columns) parallel to the first direction, but example embodiments of the inventive concept may not be limited thereto. For example, the cell pillars PL may be arranged along four or more columns parallel to the first direction.

The first cell pillars PL1, the second cell pillars PL2, and the third cell pillars PL3 may be connected to one of the upper interconnection lines different from each other. For example, the first upper interconnection line BL1 may be disposed to connect the first cell pillars PL1 arranged along the second direction with each other. The second upper interconnection line BL2 may be disposed to connect the second cell pillars PL2 arranged along the second direction with each other. The third upper interconnection line BL3 may be disposed to connect the third cell pillars PL3 arranged along the second direction with each other.

The plurality of the cell pillars PL, which may constitute each gate structure G and have the offset arrangement, may be electrically coupled to the uppermost horizontal electrode G6 extending along the first direction.

Intervals between the cell pillars PL may be non-uniform. For example, the intervals between or configuration of the cell pillars PL may be described in terms of two or more different dimensions. An interval ⓐ between the first cell pillars PL1 or between the third cell pillars PL3 adjacent to the separation regions 131 may be greater than an interval ⓑ between the second cell pillars PL2 far from the separation regions 131.

As shown in FIG. 7C, the cavities S may be formed in portions of the horizontal electrodes interposed between the cell pillars PL. The cavities S may be locally provided between the cell pillars PL and be spaced apart from each other. The maximum width of the cavity S may be smaller than a pitch of the cell pillars PL adjacent thereto. A size of the cavity S nears the separation regions 131 may be smaller than that far from the separation regions 131. In example embodiments, the cavity S may not be formed near the separation regions 131.

According to the afore-described embodiments, the first cell pillars PL1 may be shifted parallel or antiparallel to the first direction, but example embodiments of the inventive concept may not be limited thereto. For example, the first cell pillars PL1 may be shifted along a direction (e.g., the second direction) crossing the first direction, thereby allowing the cell pillars to have an increased interval therebetween. As a result, the source material for forming the conductive layer can be supplied into the recess regions, during the replacement process.

Figure 47:
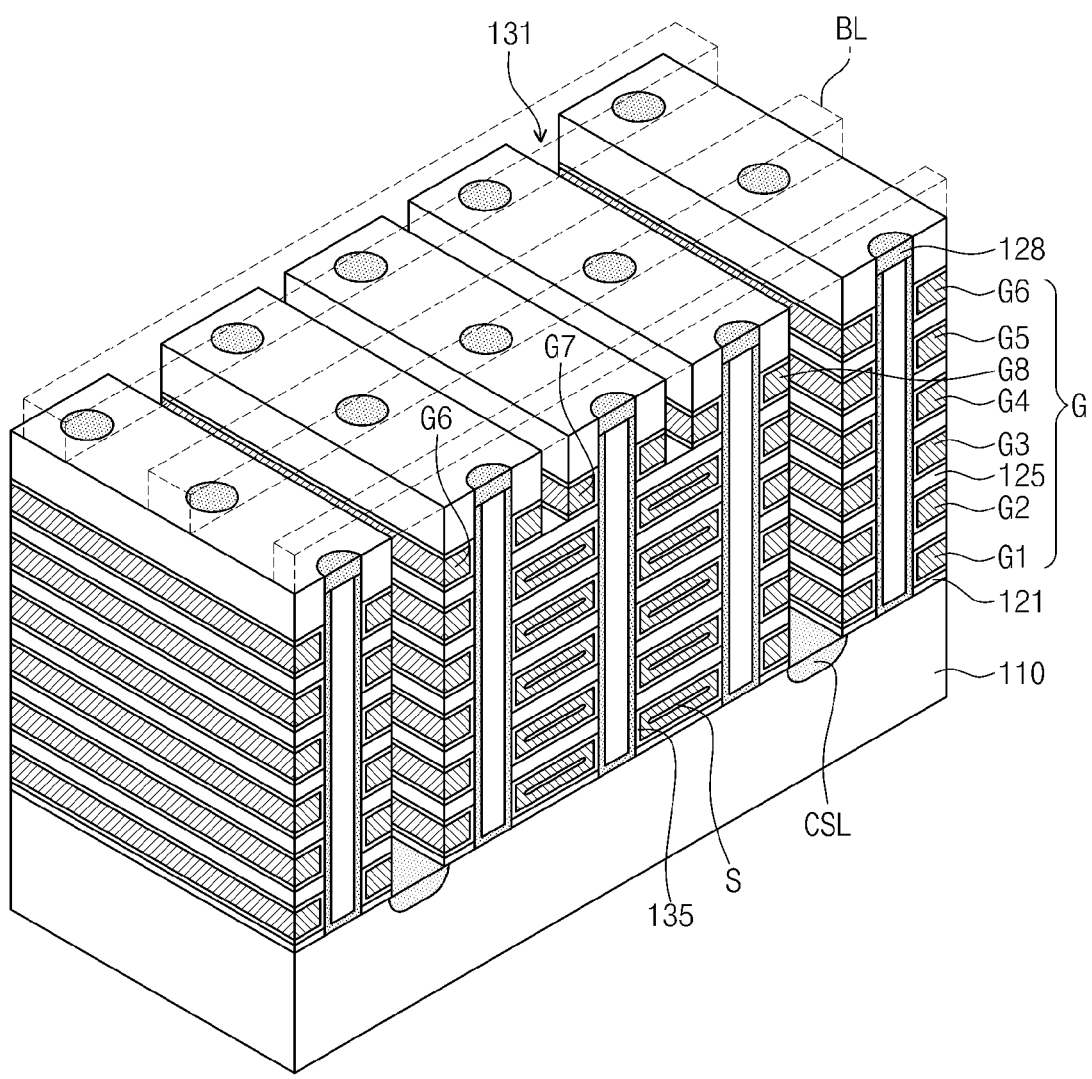
FIG. 47 is a perspective view exemplarily illustrating a memory block of a semiconductor device according to further example embodiments of the inventive concept.
Figure 48:
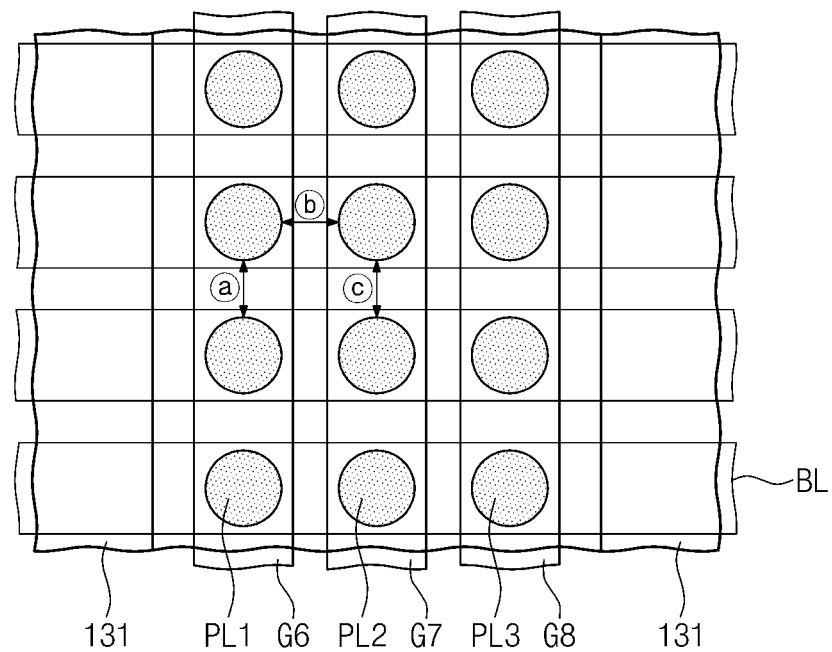
FIG. 48 is a diagram exemplarily illustrating an arrangement of cell pillars provided in the memory block of FIG. 47.

FIG. 47 is a perspective view exemplarily illustrating a memory block of a semiconductor device according to further example embodiments of the inventive concept. FIG. 48 is a diagram exemplarily illustrating an arrangement of cell pillars provided in the memory block of FIG. 47. For the sake of brevity, the elements and features of this embodiment that are similar to those previously shown and described with reference to FIGS. 3 and 7A through 7C will not be described in much further detail.

Referring to FIGS. 47 and 48, a semiconductor device according to still other example embodiments of the inventive concept may include a plurality of upper interconnection lines BL, the horizontal electrodes G1-G8, and the common source lines CSL. In the present embodiment, a plurality of horizontal electrodes (e.g., G6-G8) may be provided as the uppermost layer of each gate structure G. Example embodiments of the inventive concept may not be limited to the example shown in FIGS. 47 and 48, in which the uppermost layer of each gate structure G include three uppermost horizontal electrodes (e.g., G6-G8), and for example, the uppermost layer of each gate structure G may include four or more uppermost horizontal electrodes horizontally spaced apart from each other.

The cell pillars PL may include a first column of the first cell pillars PL1 nearest neighbor to one of the separation regions 131, a third column of the third cell pillars PL3 nearest neighbor to the other of the separation regions 131, and a second column of the second cell pillars PL2 therebetween. Each column of the cell pillars may be electrically coupled to the corresponding one of the upper horizontal electrodes.

The cell pillars PL may be provided to form a matrix-shaped arrangement. Intervals between the cell pillars PL may be non-uniform. For example, intervals between or configuration of the cell pillars PL may be described in terms of two or more different dimensions. An interval ⓐ between the first cell pillars PL1 or between the third cell pillars PL3 near the separation regions 131 may be greater than a interval ⓒ between the second cell pillars PL2 far from the separation regions 131. The interval ⓐ may be greater than an interval ⓑ between one of the first cell pillars and one of the second cell pillars nearest neighbor thereto. The interval ⓒ between the second cell pillars may be smaller than the interval ⓑ between one of the first cell pillars and one of the second cell pillars nearest neighbor thereto.

Each of the upper interconnection lines BL may extend along the second direction and connect the cell pillars PL arranged along the second direction with each other.

The inventive concept is not restricted to the afore-described and illustrated embodiments, and modifications and changes can be made within the scope of the inventive concept defined in the following claims. For example, the features and configurations of the afore-described embodiments may be exchanged or combined with each other within the scope of the inventive concept.

Figure 49:
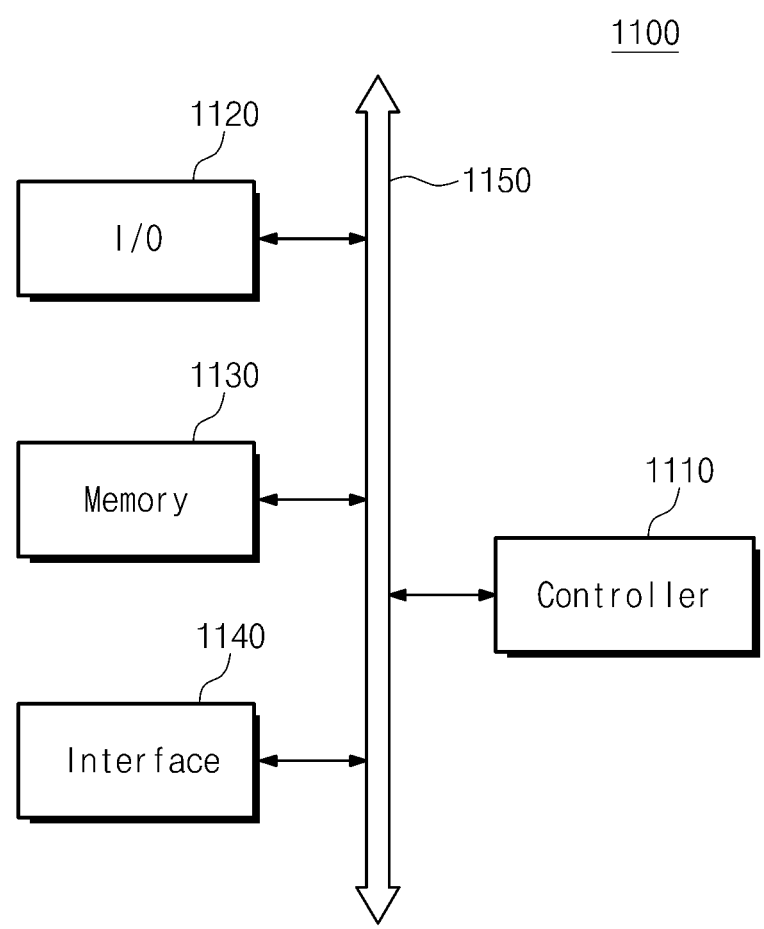
FIG. 49 is a schematic block diagram illustrating an example of memory systems including a semiconductor device according to example embodiments of the inventive concept.

FIG. 49 is a schematic block diagram illustrating an example of memory systems including a semiconductor device according to example embodiments of the inventive concept.

Referring to FIG. 49, an electronic system 1100 according to example embodiments of the inventive concept may include a controller 1110, an input and output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The memory device 1130 may include a semiconductor device according to example embodiments of the inventive concept.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the semiconductor devices according to the embodiments described above. The memory device 1130 may further include another type of semiconductor devices which are different from the semiconductor devices described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as an operating memory device for improving an operation of the controller 1110.

The electronic system 1100 may be applied to a lap-top computer, a personal digital assistant (PDA), a portable computer, a web tablet, a wireless phone, a mobile phone, a digital music player, a memory card or an electronic product. The electronic product may be configured to receive or transmit information data by wireless.

Figure 50:
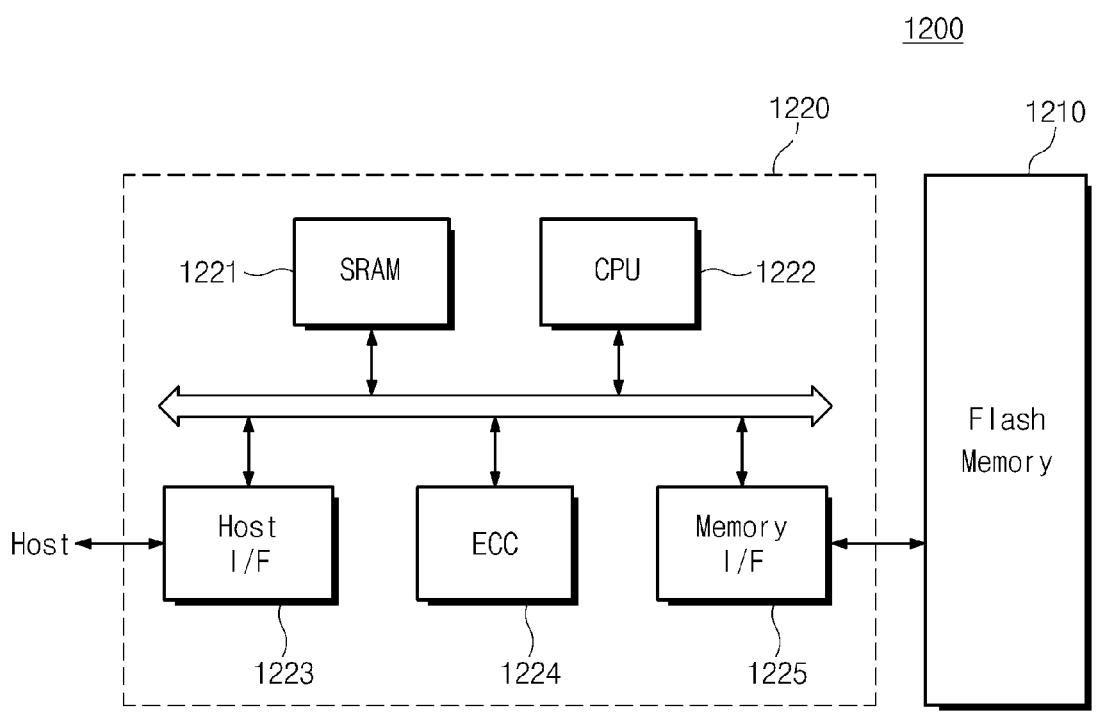
FIG. 50 is a schematic block diagram illustrating an example of memory cards including the semiconductor devices according to example embodiments of the inventive concept.

FIG. 50 is a schematic block diagram illustrating an example of memory cards including the semiconductor devices according to example embodiments of the inventive concept.

Referring to FIG. 50, a memory card 1200 may include a memory device 1210. In example embodiments, the memory device 1210 may include at least one of the semiconductor devices according to the various embodiments mentioned above. In other embodiments, the memory device 1210 may further include another type of semiconductor devices which are different from the semiconductor devices according to the embodiments described above. The memory card 1200 may include a memory controller 1220 that controls data communication between a host and the memory device 1210. The memory device 1210 and/or the controller 1220 may include a semiconductor device according to example embodiments of the inventive concept.

The memory controller 1220 may include a processing unit 1222 that controls overall operations of the memory card 1200. In addition, the memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

Figure 51:
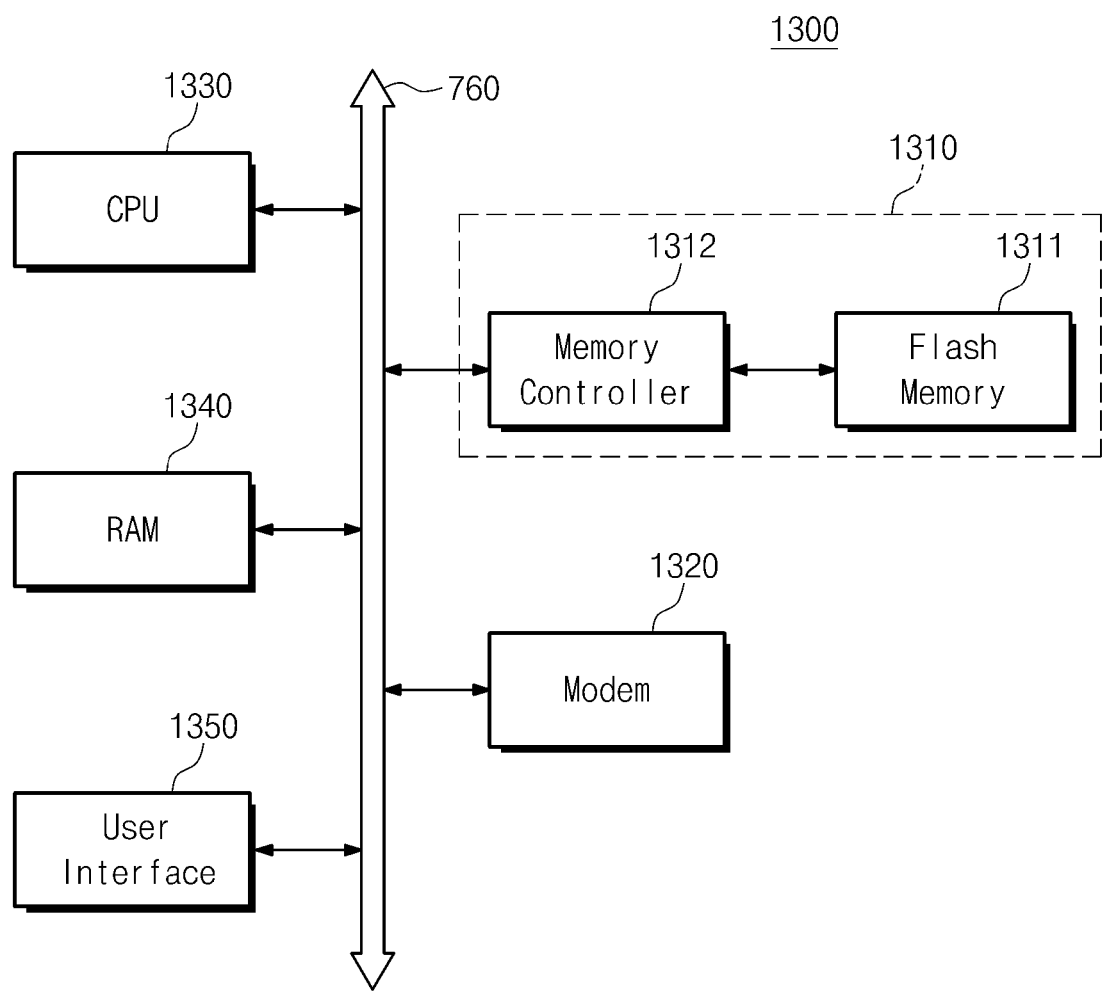
FIG. 51 is a schematic block diagram illustrating an example of information processing systems including a semiconductor device according to example embodiments of the inventive concept.

FIG. 51 is a schematic block diagram illustrating an example of information processing systems including a semiconductor device according to example embodiments of the inventive concept.

Referring to FIG. 51, an information processing system 1300 includes a memory system 1310, which may include at least one of the semiconductor devices according to example embodiments of the inventive concept. The information processing system 1300 also includes a modem 1320, a central processing unit (CPU) 1330, a RAM 1340, and a user interface 1350, which may be electrically connected to the memory system 1310 via a system bus 1360. The memory system 1310 may be configured to have the same technical features as the memory system of FIG. 49. Data processed by the CPU 1330 and/or input from the outside may be stored in the memory system 1310. Here, the memory system 1310 may be provided as a solid state drive SSD, and thus, the information processing system 1300 may be able to store reliably a large amount of data in the memory system 1310. This increase in reliability enables the memory system 1310 to conserve resources for error correction and realize a high speed data exchange function. Although not shown in the drawing, it will be apparent to those of ordinary skill in the art that the information processing system 1300 may be also configured to include an application chipset, a camera image processor (CIS), and/or an input and output device.

Furthermore, a semiconductor device or memory system according to example embodiments of the inventive concept or may be packaged in various kinds of ways. For example, the semiconductor device or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-level Processed Stack Package (WSP).

According to example embodiments of the inventive concept, it is possible to contract cavities, which may be formed in horizontal electrodes during a replacement process. Thus, the cavities can be prevented from being connected to each other or forming an elongated void structure. This enables to suppress an increase in electric resistance of the horizontal electrodes. In addition, it is possible to suppress or prevent insulating patterns, a memory element, and/or cell pillars from being damaged by chemicals soaked or stored in the cavities. As a result, it is possible to improve an electric isolation property between the horizontal electrodes and/or between the cell pillars and the horizontal electrodes, and to suppress a data-storing property of the memory element from being deteriorated.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device comprising:
   a plurality of horizontal electrodes;
   a plurality of insulating patterns alternatingly stacked with the plurality of horizontal electrodes; and
   an array of pillars formed in the plurality of insulating patterns and the plurality of horizontal electrodes, the array of pillars comprising:
      a first group of pillars disposed along a first direction; and
      a second group of pillars disposed along a second direction parallel to the first direction, and staggered with respect to the first group of pillars,
   wherein a first pillar of the first group of pillars is disposed to one side of a second pillar of the first group of pillars and a third pillar of the first group of pillars is disposed to another side of the second pillar of the first group of pillars, and
   wherein the second pillar of the first group of pillars is closer to the third pillar of the first group of pillars than to the first pillar of the first group of pillars.

2. The semiconductor memory device of claim 1, wherein second pillar is one of Xn-th pillar of the first group of pillars, X being an integer greater than 1 and n being an integer index, and locations of the Xn-th pillars of the first group of pillars are closer to corresponding one of (Xn+1)-th pillars of the first group of pillars than to corresponding one of (Xn−1)-th pillars of the first group of pillars.

3. The semiconductor memory device of claim 2, wherein X is one of 2, 3 or 4.

4. The semiconductor memory device of claim 3, wherein pillars of the second group of pillars are evenly spaced apart.

5. The semiconductor memory device of claim 2,
   wherein pillars of the second group of pillars are spaced apart so that, X' being an integer greater than 1 and n' being an integer index, and locations of X'n'-th pillars of the second group of pillars are closer to corresponding one of (X'n'+1)-th pillars of the second group of pillars than to corresponding one of (X'n'−1)-th pillars of the second group of pillars,
   wherein an interval between the first pillar of the first group of pillars and the second pillar of the first group of pillars is interval A,
   wherein an interval between a first pillar of the second group of pillars and a second pillar of the second group of pillars adjacent to the first pillar of the second group of pillars, is interval C, and
   wherein a distance of interval A>a distance of interval C.

6. The semiconductor memory device of claim 5, wherein a fill separation region is disposed to one side of the first group of pillars and the second group of pillars are disposed to another side of the first group of pillars, and a material for forming the plurality of horizontal electrodes, is firstly received through the first group of pillars and secondly received through the second group of pillars.

7. The semiconductor memory device of claim 6, wherein, among the first group of pillars, the first pillar of the second group of pillars is nearest to the first pillar of the first group of pillars, and
   wherein an interval between the first pillar of the first group of pillars and the first pillar of the second group of pillars is interval B, such that the interval B is one of: i) interval A>interval B>interval C; ii) interval A is substantially equal to interval B and interval B is >than interval C; and iii) interval A>interval B and interval B is substantially equal to interval C.

8. The semiconductor device of claim 7, wherein the intervals A, B, and C form a channel through which the material for forming the plurality of horizontal electrodes, is received from a fill separation region disposed at one side of the array of pillars.

9. The semiconductor device of claim 5, the array of pillars further comprising a dummy group of pillars, a third group of pillars and a fourth group of pillars, the third and the fourth group of pillars being disposed in mirror symmetry with respect to the first and the second group of pillars, about the dummy group of pillars.

10. The semiconductor device of claim 9, wherein the fill separation region is a first fill separation region disposed at a first side of the array of pillars and the semiconductor device of claim 9 further comprises a second fill separation region disposed at a second side of the array of pillars opposite to the first side, and
    wherein the material for forming the plurality of horizontal electrodes, is received through the first and the second sides of the array of pillars.

11. The semiconductor memory device of claim 2, wherein a fourth pillar of the first group of pillars is disposed to another side of and adjacent to the third pillar of the first group of pillars, and
    wherein a distance between the first and the second pillars of the first group of pillars and a distance between the third and the fourth pillars of pillars of the first group of pillars are larger than the distance between the second and the third pillars of the first group of pillars.

12. The semiconductor memory device of claim 1, wherein a first pillar of the second group of pillars is disposed to one side of a second pillar of the second group of pillars and a third pillar of the second group of pillars is disposed to another side of and adjacent to the second pillar of the second group of pillars, and
    wherein the second pillar of the second group of pillars is closer to the third pillar of the second group of pillars than to the first pillar of the second group of pillars.

13. The semiconductor memory device of claim 12, wherein a fourth pillar of the second group of pillars is disposed to another side of and adjacent to the third pillar of the second group of pillars, and
    wherein a distance between the first and the second pillars of the second group of pillars and the distance between the third and the fourth pillars of the second group of pillars are larger than the distance between the second and the third pillars of the second group of pillars.

14. The semiconductor memory device of claim 1, the array of pillars further comprising a dummy group of pillars disposed adjacent to the second group of pillars, wherein an interval between a second pillar of the second group of pillars and a first pillar of the dummy group of pillars, is interval D.

15. The semiconductor memory device of claim 14, further comprising a third group of pillars and a fourth group of pillars, both of which are disposed in mirror symmetry with respect to the first and the second group of pillars, about the dummy group of pillars.

16. The semiconductor memory device of claim 15, further comprising:
a substrate, the alternating stack of the plurality of horizontal electrodes and the plurality of insulating patterns being disposed on the substrate; and
upper interconnection lines disposed above the first, the second, and the dummy groups of pillars, the upper interconnection lines comprising first upper interconnection lines respectively connected to the first group of pillars and not connected to the second group of pillars, and second upper interconnection lines respectively connected to the second group of pillars and not connected to the first group of pillars; and
common source lines disposed on the substrate.

17. A memory system comprising:
a controller;
an input and output unit;
an interface unit; and
the semiconductor memory device of claim 1,
wherein the controller, the input and output unit, the interface unit, and the semiconductor memory device communicate through a data bus.

18. The memory system of claim 17, wherein the first and the second group of pillars form a channel of decreasing width, a material for forming the plurality of horizontal electrodes being received through the channel.

19. A semiconductor device comprising:
the semiconductor memory device of claim 1;
an address decoder connected to the semiconductor memory device through word lines;
a read and write circuit connected to the semiconductor memory device through bit lines;
a data input and output circuit connected to the read and write circuit through data lines; and
a control logic configured to control the address decoder and the read and write circuit to read data from the semiconductor memory device and to transfer the read data to the data input and output circuit.

20. The semiconductor device of claim 19, wherein the array of pillars further comprises a group of dummy pillars, a third group of pillars and a fourth group of pillars,
wherein first portions of the plurality of horizontal electrodes are formed by a material inserted through first channels of narrowing widths, the first channels being formed by the first and the second group of pillars disposed at one side of the group of dummy pillars, and
wherein second portions of the plurality of horizontal electrodes are formed by a material inserted through second channels of narrowing widths, the second channels being formed by the third and the fourth group of pillars disposed at another side of the group of dummy pillars.

* * * * *